(12) United States Patent
Tsuruda et al.

(10) Patent No.: US 11,811,365 B2
(45) Date of Patent: *Nov. 7, 2023

(54) TERAHERTZ DEVICE AND METHOD FOR MANUFACTURING TERAHERTZ DEVICE

(71) Applicant: ROHM CO., LTD., Kyoto (JP)

(72) Inventors: Kazuisao Tsuruda, Kyoto (JP); Hideaki Yanagida, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days.

This patent is subject to a terminal disclaimer.

(21) Appl. No.: 17/832,209

(22) Filed: Jun. 3, 2022

(65) Prior Publication Data

US 2022/0302878 A1 Sep. 22, 2022

Related U.S. Application Data

(63) Continuation of application No. 17/296,192, filed as application No. PCT/JP2019/046571 on Nov. 28, 2019, now Pat. No. 11,387,783.

(30) Foreign Application Priority Data

Dec. 12, 2018 (JP) .................................. 2018-232463

(51) Int. Cl.
*H03B 7/08* (2006.01)
*H01L 23/14* (2006.01)
(Continued)

(52) U.S. Cl.
CPC ............... *H03B 7/08* (2013.01); *H01L 23/14* (2013.01); *H01L 23/28* (2013.01);
(Continued)

(58) Field of Classification Search
CPC ...... H01P 1/2005; H01P 1/00; H01L 23/5389; H01L 23/14; H01L 23/28;
(Continued)

(56) References Cited

U.S. PATENT DOCUMENTS 11,243,164 B2 * 2/2022 Tsuruda ............. H04N 5/22521
2008/0265412 A1 10/2008 Hasegawa
2021/0066811 A1 3/2021 Tsuruda

FOREIGN PATENT DOCUMENTS

JP 2002124627 A 4/2002
JP 2009-80448 A 4/2009
(Continued)

OTHER PUBLICATIONS

International Search report issued in PCT/JP2019/046571, dated Feb. 10, 2020 (2 pages).
(Continued)

*Primary Examiner* — Arnold M Kinkead
(74) *Attorney, Agent, or Firm* — Hamre, Schumann, Mueller & Larson, P.C.

(57) ABSTRACT

Terahertz device includes first resin layer, columnar conductor, wiring layer, terahertz element, second resin layer, and external electrode. Resin layer includes first resin layer obverse face and first resin layer reverse face. Columnar conductor includes first conductor obverse face and first conductor reverse face, penetrating first resin layer in z-direction. Wiring layer spans between first resin layer obverse face and first conductor obverse face. Terahertz element includes element obverse face and element reverse face, and converts between terahertz wave and electric energy. Second resin layer includes second resin layer obverse face and second resin layer reverse face, and covers wiring layer and terahertz element. External electrode, disposed offset in a direction first resin layer reverse face faces with respect to first resin layer, is electrically connected to columnar conductor. Terahertz element is conductively bonded to wiring layer.

18 Claims, 64 Drawing Sheets

(51) Int. Cl.
  *H01L 23/28* (2006.01)
  *H01L 23/498* (2006.01)
  *H01L 23/538* (2006.01)
  *H01L 23/66* (2006.01)
  *H01P 1/20* (2006.01)
  *H01L 23/00* (2006.01)
  *H01L 23/31* (2006.01)
  *H01L 25/065* (2023.01)
  *H01L 25/00* (2006.01)

(52) U.S. Cl.
  CPC .... *H01L 23/3135* (2013.01); *H01L 23/49811* (2013.01); *H01L 23/49827* (2013.01); *H01L 23/5389* (2013.01); *H01L 23/66* (2013.01); *H01L 24/16* (2013.01); *H01L 24/81* (2013.01); *H01L 24/97* (2013.01); *H01L 25/0655* (2013.01); *H01L 25/50* (2013.01); *H01P 1/2005* (2013.01); *H01L 2221/68345* (2013.01); *H01L 2224/13111* (2013.01); *H03B 2200/0084* (2013.01)

(58) Field of Classification Search
  CPC ......... H01L 23/49811; H01L 23/49827; H01L 23/66; H01Q 23/00; H03B 7/08; H03B 2200/0084
  USPC .................. 257/104; 333/219.2; 331/107 T; 343/703 MS
  See application file for complete search history.

(56) References Cited

FOREIGN PATENT DOCUMENTS

| | | |
|---|---|---|
| JP | 2014-522175 A | 8/2014 |
| JP | 2015-141926 A | 8/2015 |
| JP | 2016-111542 A | 6/2016 |
| JP | 2017-55049 A | 3/2017 |
| JP | 2018-88505 A | 6/2018 |
| WO | 2020/039848 A1 | 2/2020 |
| WO | 2020/121827 A1 | 6/2020 |

OTHER PUBLICATIONS

Office Action received in the corresponding Japanese Patent Application, dated Nov. 1, 2022, and machine translation (6 pages).
Office Action received in the corresponding Chinese Patent application, dated Jun. 9, 2023 and machine translation (15 pages).

\* cited by examiner

FIG.24
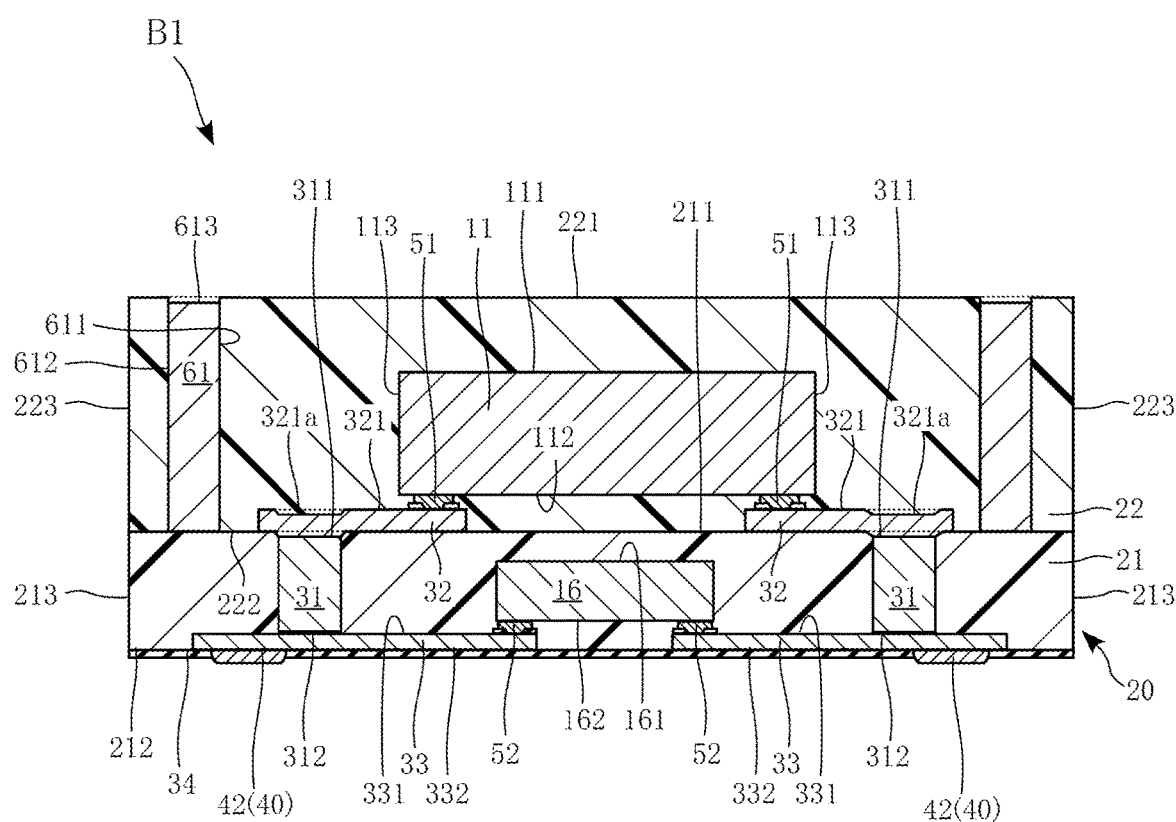
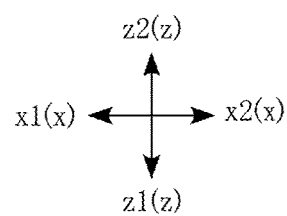

FIG.57
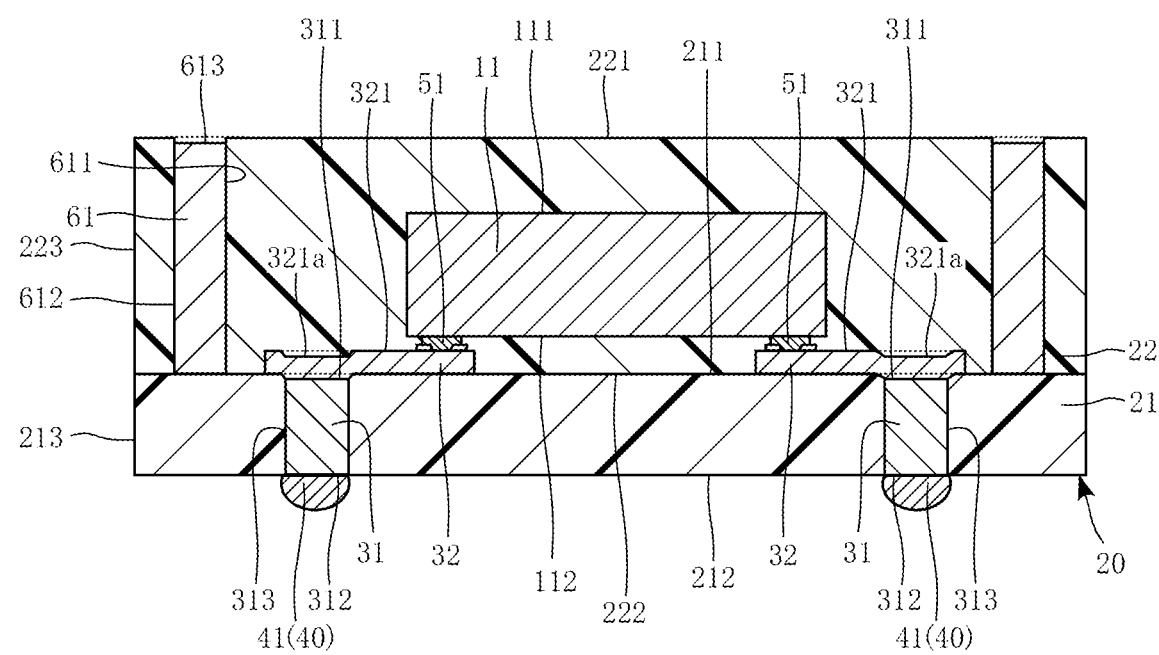
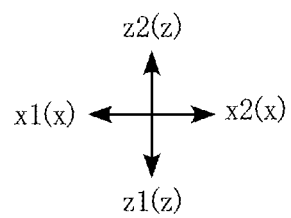

FIG.60
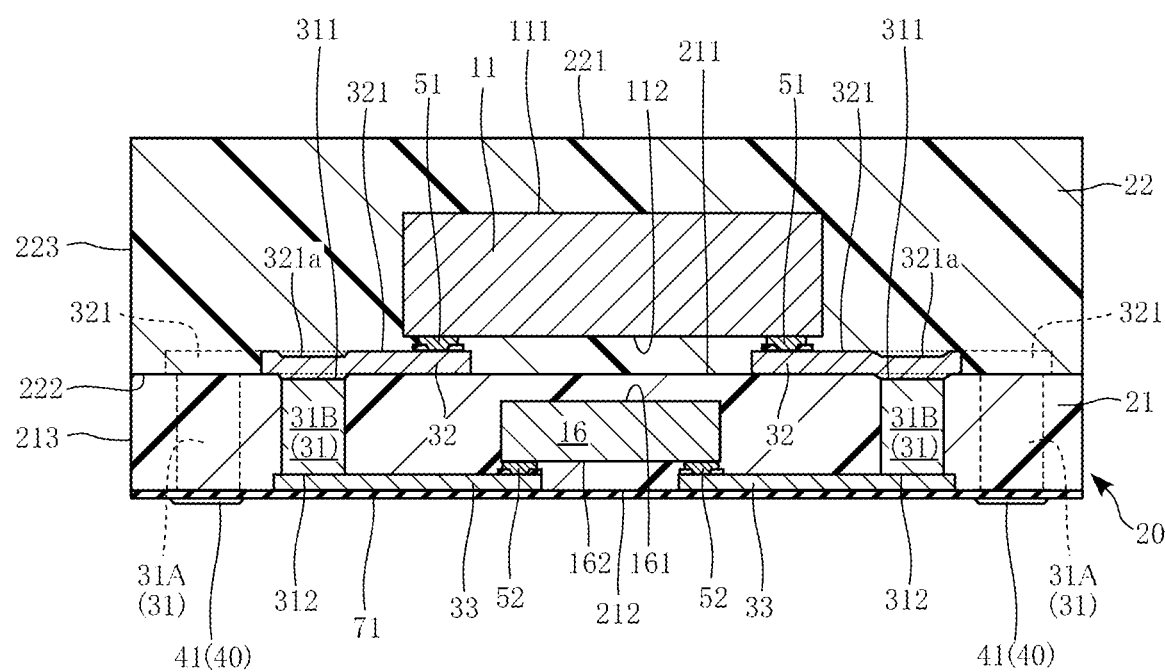
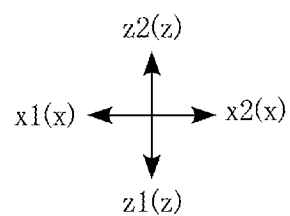

TERAHERTZ DEVICE AND METHOD FOR MANUFACTURING TERAHERTZ DEVICE

TECHNICAL FIELD

The present disclosure relates to a terahertz device, and a manufacturing method thereof.

BACKGROUND ART

In recent years, as the miniaturization of electronic devices such as transistors has progressed and the size of electronic devices has become nano-sized, a phenomenon known as the quantum effect has been observed. On the basis of the quantum effect, development of an ultra-high-speed device or a novel functional device is being aimed at. Under such circumstances, in particular, attempts to realize large-capacity communication, information processing, imaging, or measurement are being made, utilizing a frequency region called a terahertz band, ranging from 0.1 to 10 THz in frequency. The frequency region possesses characteristics as both of light and electric wave, and therefore development of a device capable of operating in this frequency band is expected to enable, not only the imaging, the large-capacity communication, or the informing processing, but also the measurement in various fields such as solid state physics, astronomy, and biology.

Elements currently known to oscillate a high-frequency electromagnetic wave of a frequency in the terahertz band include the one in which resonant tunneling diode (RTD) and micro-slot antennas are integrated.

PRIOR ART DOCUMENT

Patent Document

[Patent Document 1] JP-A-2009-80448

SUMMARY OF INVENTION

Problem to be Solved by Invention

An object of the present disclosure is to provide a terahertz device having a package structure advantageous in modularizing a terahertz element, while also providing a manufacturing method of such a terahertz device.

Means to Solve the Problem

In a first aspect, the present disclosure provides a terahertz device comprising: a first resin layer having a first resin layer obverse face and a first resin layer reverse face that are spaced apart from each other in a first direction; a first conductor having a first conductor obverse face oriented in a same direction as the first resin layer obverse face, and a first conductor reverse face oriented in a same direction as the first resin layer reverse face, where the first conductor penetrates through the first resin layer in the first direction; a first wiring layer spanning between the first resin layer obverse face and the first conductor obverse face; a terahertz element having an element obverse face oriented in the same direction as the first resin layer obverse face, and an element reverse face oriented in the same direction as the first resin layer reverse face, where the terahertz element is configured to convert between a terahertz wave and electric energy; a second resin layer having a second resin layer obverse face oriented in the same direction as the first resin layer obverse face, and a second resin layer reverse face oriented in the same direction as the first resin layer obverse face, where the second resin layer covers the first wiring layer and the terahertz element; and an external electrode disposed offset with respect to the first resin layer in a direction in which the first resin layer reverse face faces, where the external electrode is electrically connected to the first conductor. The terahertz element is conductively bonded to the first wiring layer.

In a second aspect, the present disclosure provides a method of manufacturing a terahertz device, and the method comprises: a support substrate preparing step for preparing a support substrate having a substrate obverse face and a substrate reverse face spaced apart from each other in a first direction; a first conductor forming step for forming a first conductor on the substrate obverse face; a first resin layer forming step for forming a first resin layer covering the first conductor; a first resin layer grinding step for forming a first conductor obverse face and a first resin layer obverse face each oriented in a same direction as the substrate obverse face in the first direction, by grinding the first resin layer from a side to which the substrate obverse face is oriented toward a side to which the substrate reverse face is oriented, and by exposing a part of the first conductor from the first resin layer; a first wiring layer forming step for forming a first wiring layer spanning between the first resin layer obverse face and the first conductor obverse face; a terahertz element mounting step for conductively bonding a terahertz element on the first wiring layer, where the terahertz element is configured to convert between a terahertz wave and electric energy; a second resin layer forming step for forming a second resin layer covering the first wiring layer and the terahertz element; a support substrate removing step for exposing a first resin layer reverse face oriented in an opposite direction to the first resin layer obverse face in the first direction, by removing the support substrate; and an external electrode forming step for forming an external electrode disposed offset with respect to the first resin layer in a direction in which the first resin layer reverse face is oriented, where the external electrode is electrically connected to the first conductor.

Advantageous Effects of Invention

The terahertz device according to the present disclosure provides a package structure advantageous in modularizing the terahertz element. In addition, the manufacturing method of the terahertz device according to the present disclosure enables the terahertz device, having the package structure advantageous in modularizing the terahertz element, to be manufactured.

BRIEF DESCRIPTION OF DRAWINGS

FIG. 24 is a cross-sectional view taken along a line XXIV-XXIV in FIG. 22.

FIG. 57 is a cross-sectional view showing a variation of an external electrode.

FIG. 60 is a cross-sectional view showing another variation of the external electrode.

MODE FOR CARRYING OUT INVENTION

Figure 1:
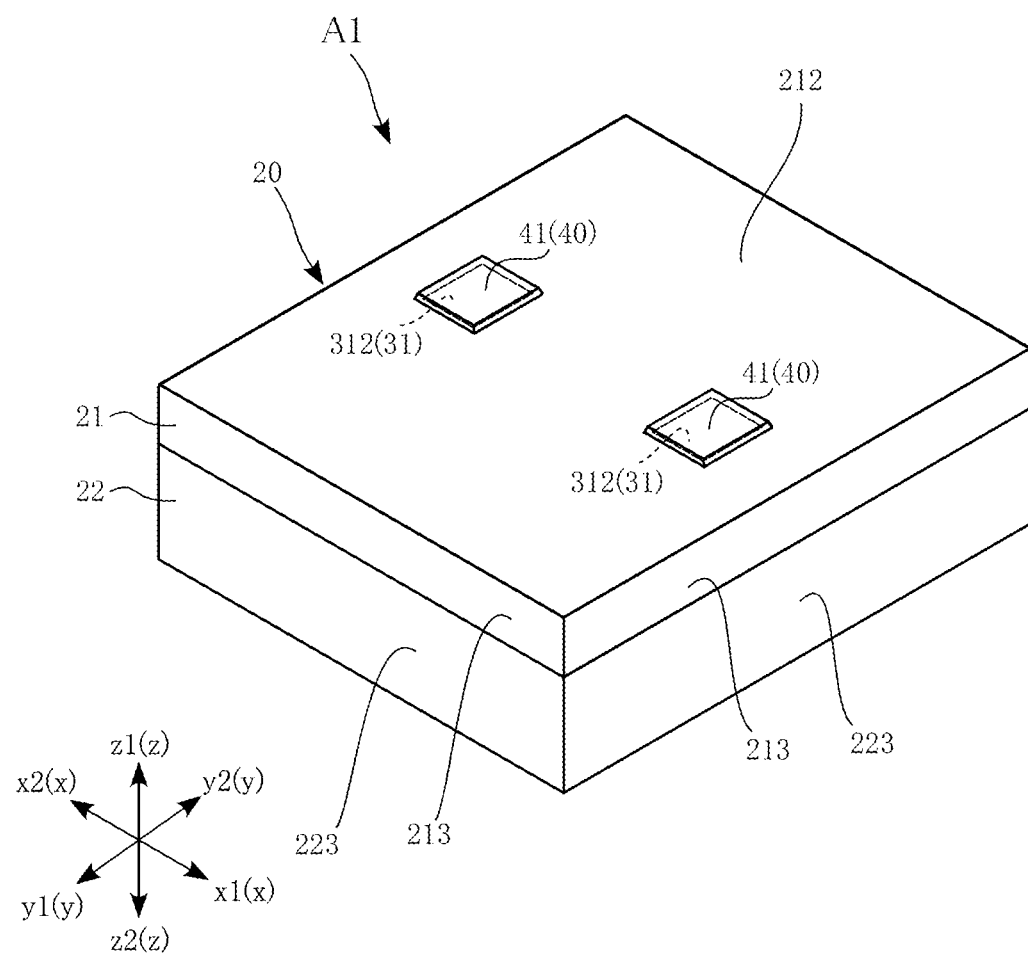
FIG. 1 is a perspective view showing a terahertz device according to a first embodiment.

Embodiments of the terahertz device and the manufacturing thereof according to the present disclosure will be described hereunder, with reference to the drawings.

The terms "first", "second", "third", and so forth used in the present disclosure merely serve as a label, and are not intended to specify an order with respect to the objects accompanied with these terms.

In the description of the present disclosure, the expressions "An object A is formed in an object B", and "An object A is formed on an object B" imply the situation where, unless otherwise specifically noted, "the object A is formed directly in or on the object B", and "the object A is formed in or on the object B, with something else interposed between the object A and the object B". Likewise, the expression "An object A is arranged in an object B", and "An object A is arranged on an object B" imply the situation where, unless otherwise specifically noted, "the object A is arranged directly in or on the object B", and "the object A is arranged in or on the object B, with something else interposed between the object A and the object B". Further, the expression "An object A is located on an object B" implies the situation where, unless otherwise specifically noted, "the object A is located on the object B, in contact with the object B", and "the object A is located on the object B, with something else interposed between the object A and the object B". Further, the expression "An object A is stacked in an object B", and "An object A is stacked on an object B" imply the situation where, unless otherwise specifically noted, "the object A is stacked directly in or on the object B", and "the object A is stacked in or on the object B, with something else interposed between the object A and the object B". Still further, the expression "An object A overlaps with an object B as viewed in a certain direction" implies the situation where, unless otherwise specifically noted, "the object A overlaps with the entirety of the object B", and "the object A overlaps with a part of the object B".

First Embodiment

FIG. 1 to FIG. 5 illustrate a terahertz device according to a first embodiment. The terahertz device A1 according to the first embodiment includes a terahertz element 11, an encapsulating resin 20, an internal electrode 30, a plurality of external electrodes 40, a plurality of bonding sections 51, and a frame-shaped conductor 61. The encapsulating resin 20 includes a first resin layer 21 and a second resin layer 22, and the internal electrode 30 includes a plurality of columnar conductors 31 and a plurality of wiring layers 32.

Figure 2:
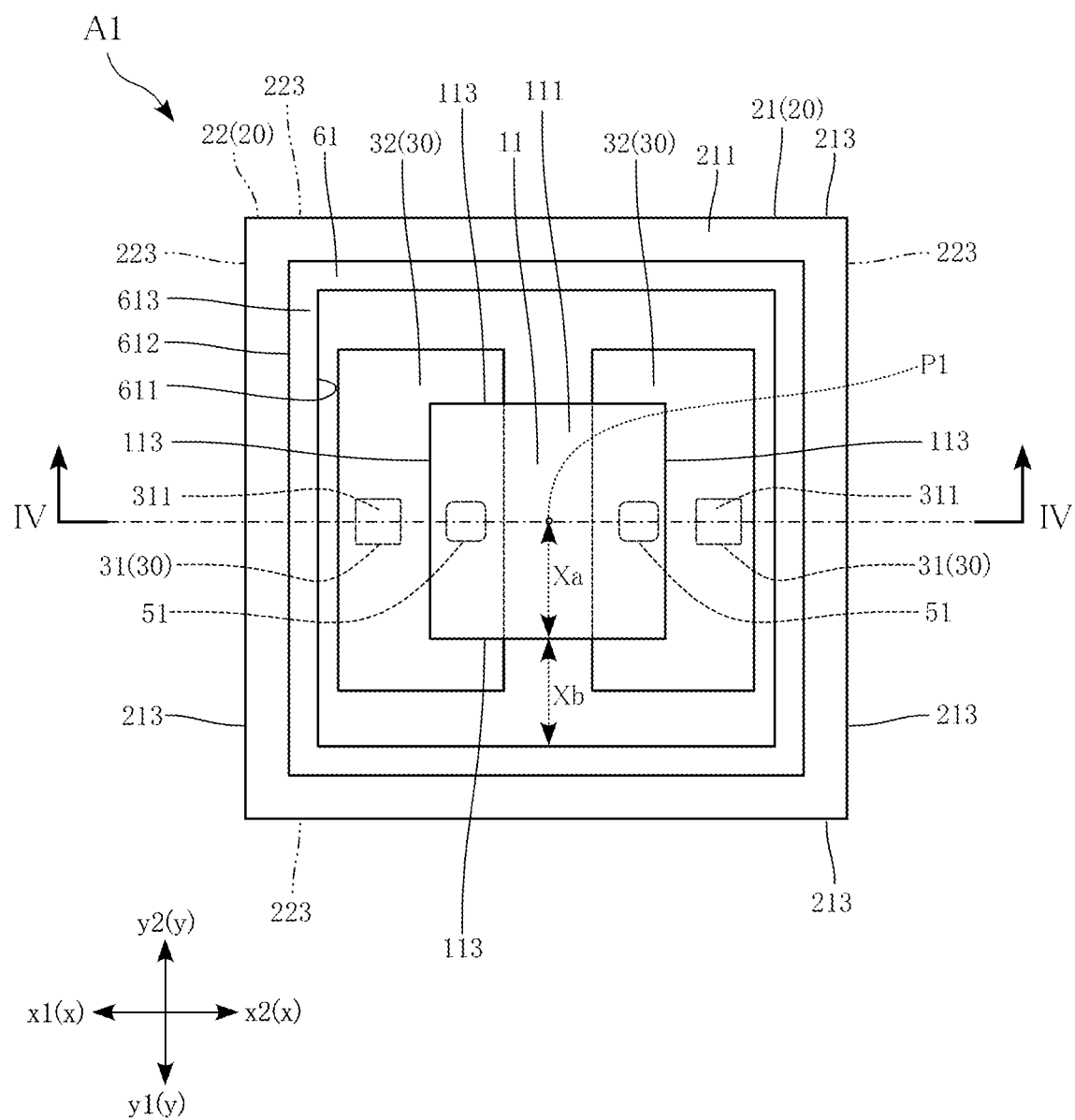
FIG. 2 is a plan view showing the terahertz device according to the first embodiment.
Figure 3:
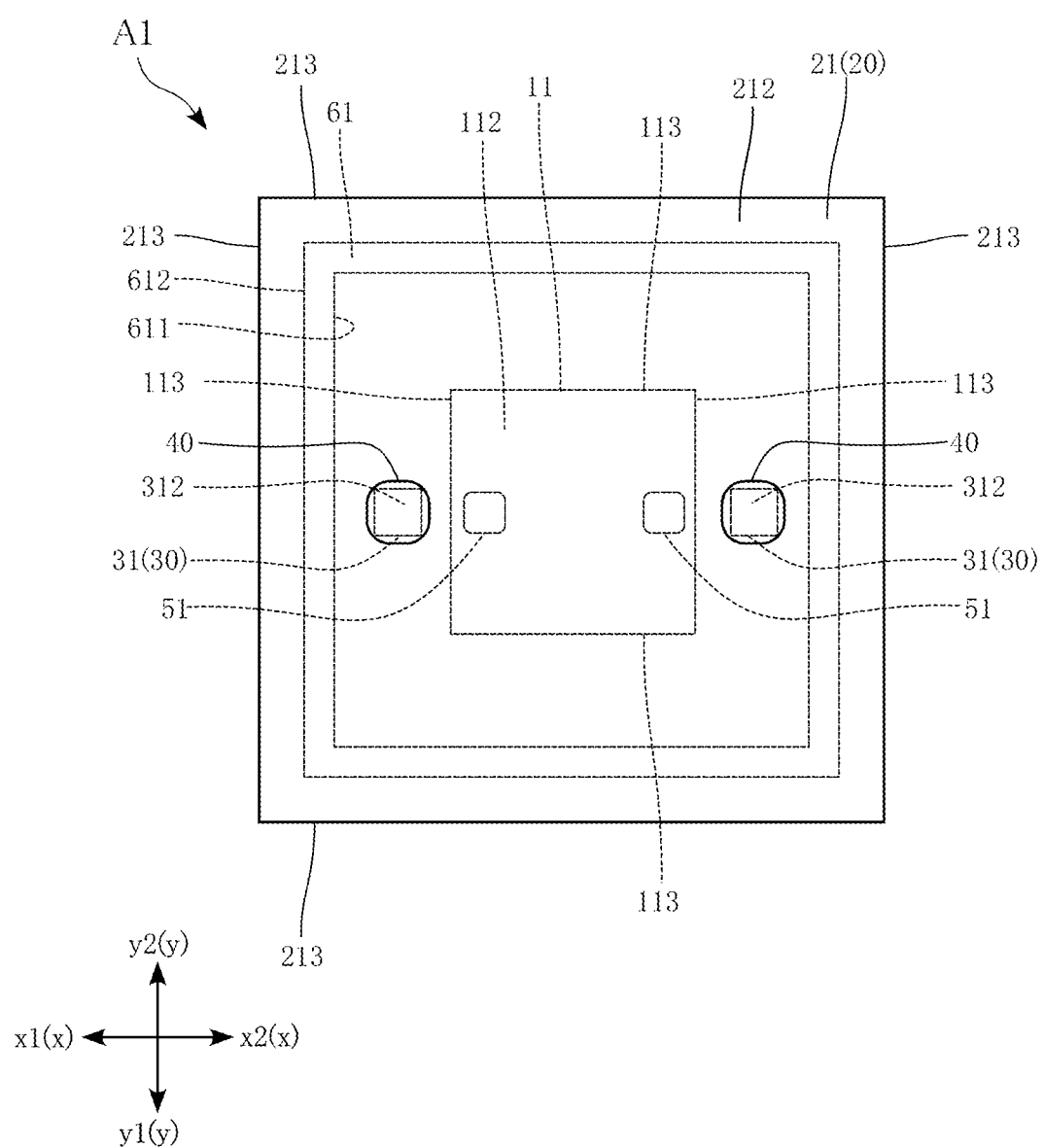
FIG. 3 is a bottom view showing the terahertz device according to the first embodiment.
Figure 4:
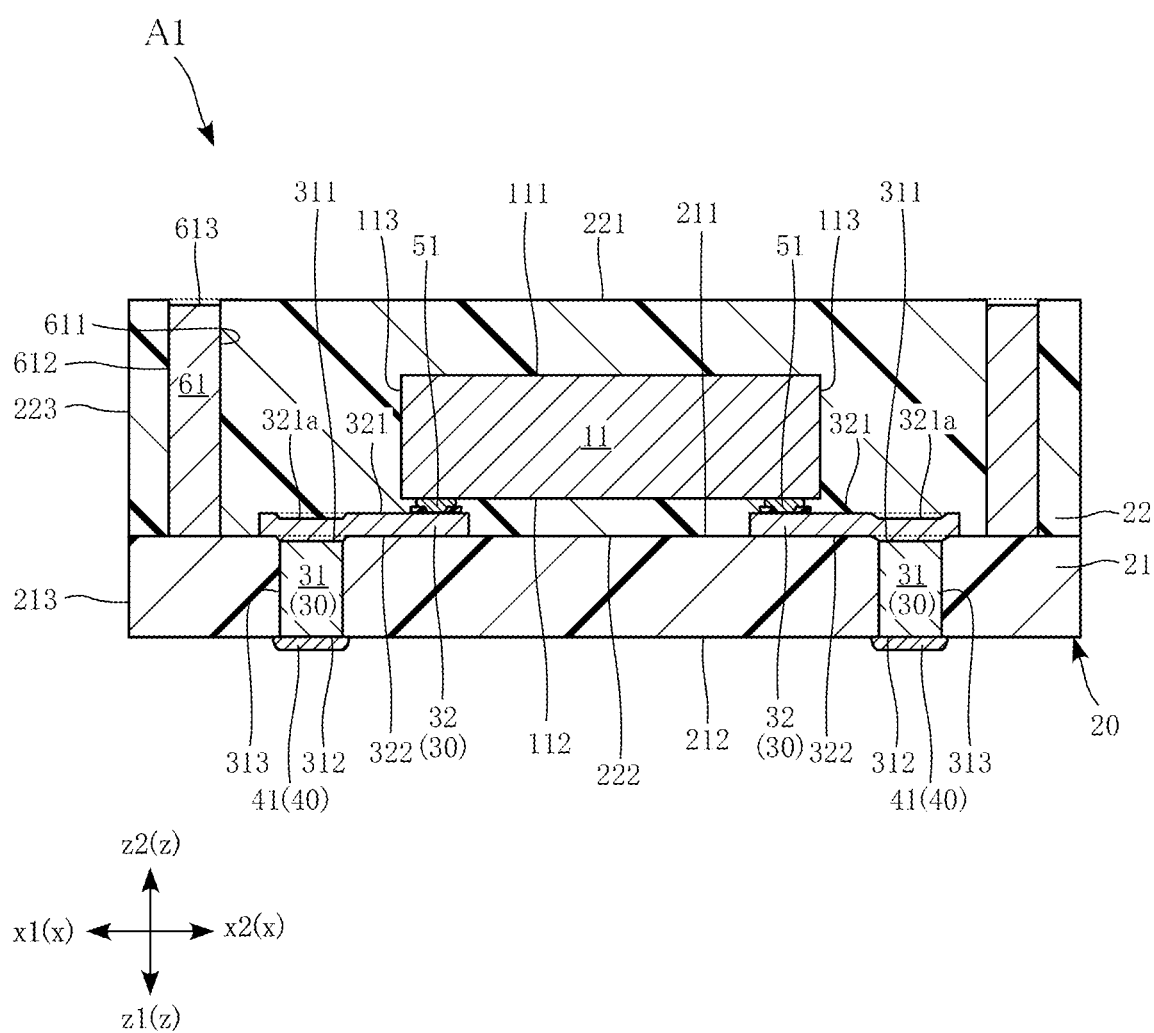
FIG. 4 is a cross-sectional view taken along a line IV-IV in FIG. 2.
Figure 5:
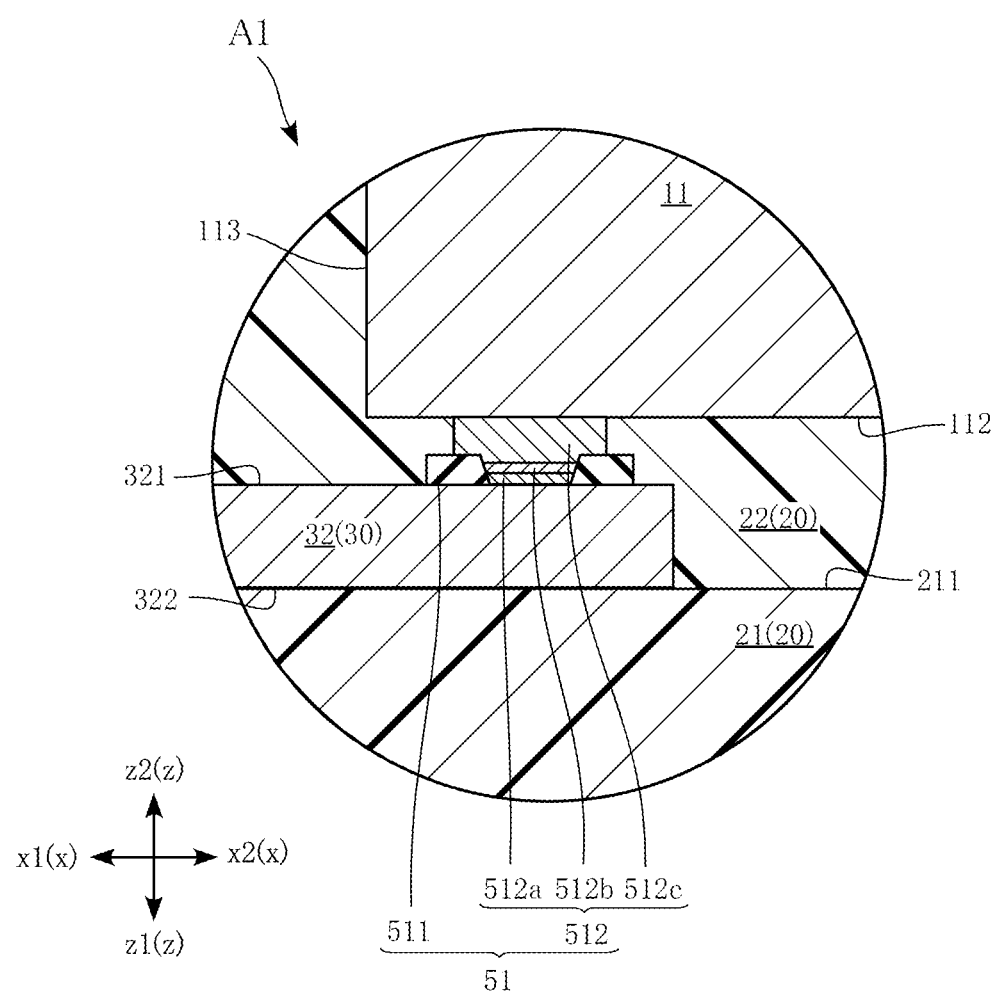
FIG. 5 is a partially enlarged cross-sectional view from FIG. 4.

FIG. 1 is a perspective view showing the terahertz device A1, seen from the side of the bottom face. FIG. 2 is a plan view showing the terahertz device A1, in which the second resin layer 22 of the encapsulating resin 20 is indicated by imaginary lines (dash-dot-dot lines). FIG. 3 is a bottom view showing the terahertz device A1. FIG. 4 is a cross-sectional view taken along a line IV-IV in FIG. 2. FIG. 5 is a partially enlarged cross-sectional view from FIG. 4.

For the sake of convenience in the description, three directions orthogonal to one another will be defined as x-direction, y-direction, and z-direction. The z-direction corresponds to the thickness direction of the terahertz device A1. The x-direction corresponds to the left-right direction in the plan view of the terahertz device A1 (see FIG. 2). The y-direction corresponds to the up-down direction in the plan view of the terahertz device A1 (see FIG. 2). Further, one side in the x-direction may be referred to as x1-side, and the other side in the x-direction will be referred to as x2-side, as the case may be. Likewise, one side in the y-direction will be referred to as y1-side, the other side in the y-direction will be referred to as y2-side, one side in the z-direction will be referred to as z1-side, and the other side in the z-direction will be referred to as z2-side. The z1-side may be expressed as downward, and the z2-side may be expressed as upward. The z-direction corresponds to the "first direction" in the present disclosure.

The terahertz element 11 converts between electromagnetic wave of the terahertz band and electric energy. In the present disclosure, the electromagnetic wave implies either or both of light and electric wave. The terahertz element 11 converts the electric energy inputted thereto, into the electromagnetic wave of the terahertz band. In other words, the terahertz element 11 oscillates terahertz wave. The terahertz element 11 may receive the terahertz wave and convert the terahertz wave into the electric energy. Alternatively, the terahertz element 11 may be configured to both oscillate and receive the terahertz wave. The terahertz element 11 serves as the functional center of the terahertz device A1.

The terahertz element 11 has, for example, a rectangular shape as viewed in the z-direction (hereinafter, "in a plan view" where appropriate). The plan-view shape of the terahertz element 11 is not limited to rectangular, but may be circular, elliptical, or polygonal. The terahertz element 11 is configured so as to allow flip-chip mounting. The size of the terahertz element 11 in the z-direction is determined depending on the frequency of the terahertz wave to be oscillated. More specifically, the size of the terahertz element 11 in the z-direction may be, for example, an integer multiple of half a wavelength $\lambda$ (i.e., $\lambda/2$) of the terahertz wave. The terahertz wave outputted from the terahertz element 11 performs free-end reflection, at the interface between an element substrate 12 (to be subsequently described) and another constituent element. Accordingly, designing the size of the terahertz element 11 in the z-direction as above enables phase-aligned standing waves to be excited inside the terahertz element 11. Whereas the size of the terahertz element 11 in the z-direction is not limited to the above, the size in the z-direction may be made smaller, the higher the frequency of the terahertz wave is, and may be made larger, the lower the frequency of the terahertz wave is.

The terahertz element 11 includes an element obverse face 111, an element reverse face 112, and a plurality of element side faces 113. The element obverse face 111 and the element reverse face 112 are spaced apart from each other and oriented or faced to opposite sides, in the z-direction. The element obverse face 111 is oriented to the z2-side, and the element reverse face 112 is oriented to the z1-side. Electrodes of the terahertz element (part of each of a first conductive layer 14 and a second conductive layer 15, to be subsequently described) are exposed from the element reverse face 112. The plurality of element side faces 113 are each located between the element obverse face 111 and the element reverse face 112 in the z-direction, and connected thereto. The element side faces 113 each have the edge on the z2-side connected to the element obverse face 111, and the edge on the z1-side connected to the element reverse face 112. The terahertz element 11 includes four element side faces 113, namely a pair of element side faces 113 spaced apart from each other and oriented to opposite sides in the x-direction, and another pair of element side faces 113 spaced apart from each other and oriented to opposite sides in the y-direction. The element reverse face 112 serves as the active face of the terahertz element 11, on which the terahertz wave is oscillated (or received, or both).

The oscillation point of the terahertz wave in the terahertz element 11 may be set, for example, at a central position P1 of the terahertz element 11 in a plan view (see FIG. 2). In this case, a vertical distance Xa between the element side face 113 and the oscillation point (central position P1) can be expressed as $Xa=(\lambda'_{InP}/2)+((\lambda'_{InP}/2) \times N)$, where N represents an integer not smaller than 0, namely 0, 1, 2, 3, and so forth. In this computing equation, $\lambda'_{InP}$ represents the effective wavelength of the terahertz wave transmitted inside the terahertz element 11. $\lambda'_{InP}$ p can be defined as $\lambda'_{InP}=(1/n1) \times (c/f_c)$, where n1 represents the refractive index of the terahertz element 11 (element substrate 12 to be subsequently described), c represents the velocity of light, and $f_c$ represents the center frequency of the terahertz wave. Setting the vertical distance Xa as above allows the terahertz wave oscillated by the terahertz element 11 to perform free-end reflection, at each of the element side faces 113. Thus, the terahertz element 11 itself is designed to act as a resonator (primary resonator) in the terahertz device A1. The vertical distances Xa between each of the element side faces 113 and the oscillation point of the terahertz wave may be different, with respect to each of the element side faces 113, provided that the distances are each obtained through the foregoing equation. Therefore, the oscillation point of the terahertz wave is not limited to the central position P1 in a plan view.

Figure 6:
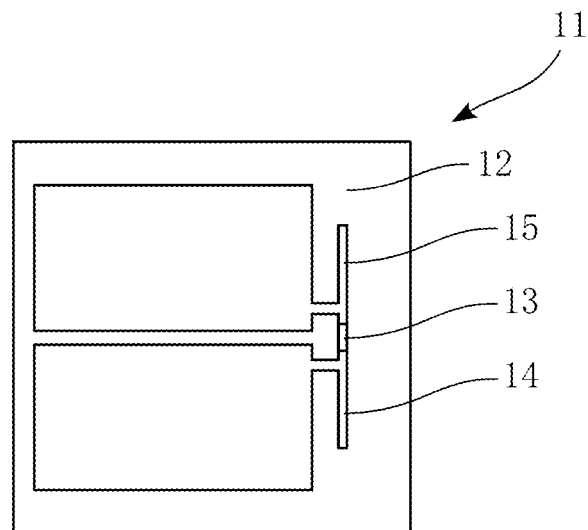
FIG. 6 is a schematic drawing showing an example of a plan-view pattern of a terahertz element.
Figure 7:
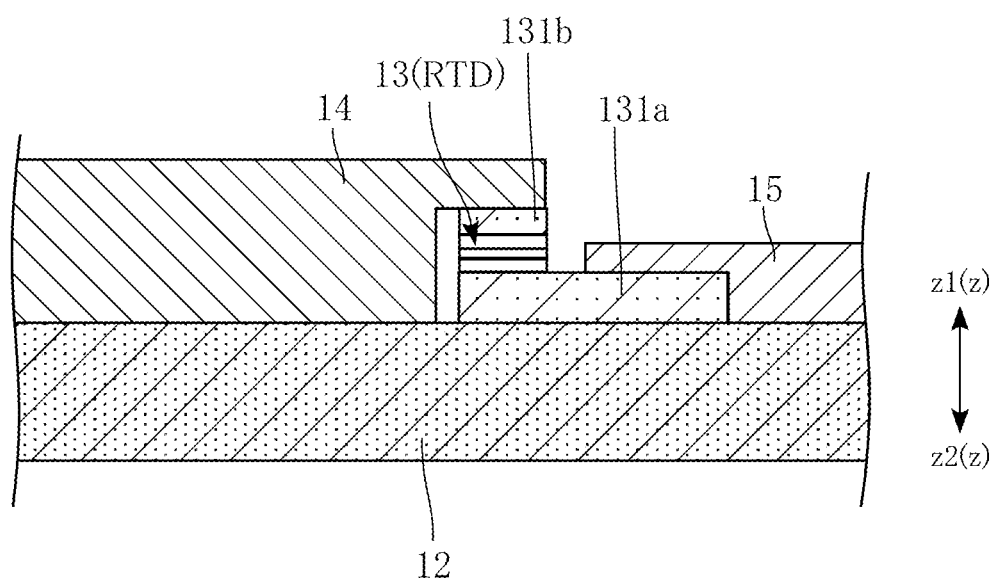
FIG. 7 is a schematic cross-sectional view of the terahertz element.
Figure 8:
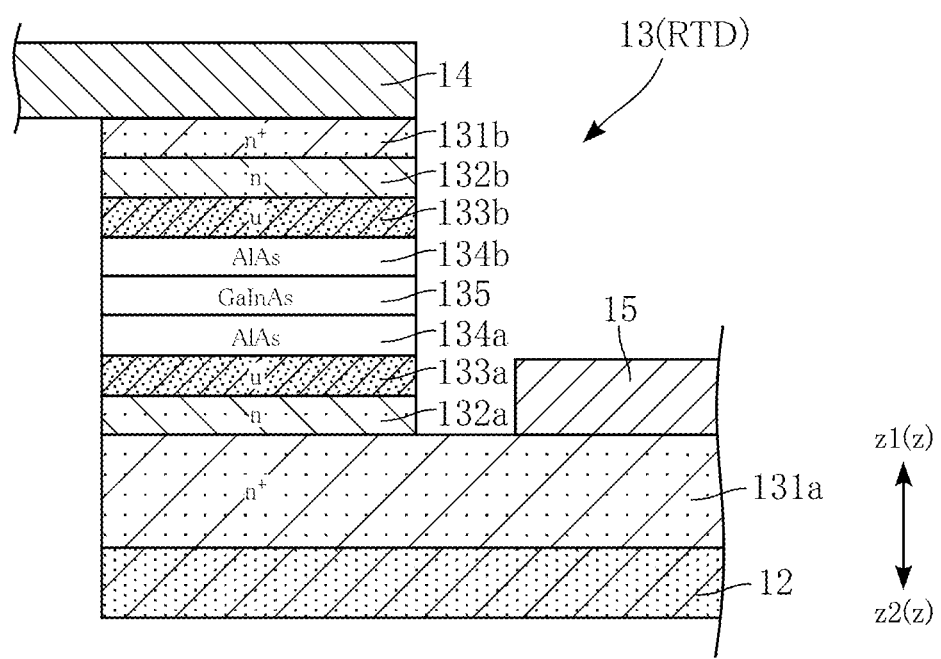
FIG. 8 is a partially enlarged cross-sectional view from FIG. 7.

FIG. 6 to FIG. 8 illustrates the details of the configuration of the terahertz element 11. FIG. 6 is a schematic drawing showing an example of the plan-view pattern of the terahertz element 11. FIG. 7 is a schematic cross-sectional view of the terahertz element 11. FIG. 8 is a partially enlarged cross-sectional view from FIG. 7. The configuration of the terahertz element 11 illustrated in FIG. 6 to FIG. 8 is merely exemplary, and not limited thereto. The terahertz element 11 includes an element substrate 12, an active element 13, a first conductive layer 14, and a second conductive layer 15.

The element substrate 12 is formed of a semiconductor. The semiconductor constituting the element substrate 12 may be, for example, indium phosphide (InP), or a semiconductor other than InP. When the element substrate 12 is formed of InP, the refractive index (absolute refractive index) is approximately 3.4.

The active element 13 converts between the electromagnetic wave of the terahertz band and the electric energy. The active element 13 may typically be an RTD. The active element 13 may be constituted of a diode other than the RTD, of a transistor. The active element 13 may be formed of, for example, a tunnel transit time (TUNNETT) diode, an impact ionization avalanche transit time (IMPATT) diode, a GaAs-based field effect transistor (FET), a GaN-based FET, a high electron mobility transistor (HEMT), or a heterojunction bipolar transistor (HBT). The active element 13 is formed on the element substrate 12. The active element 13 is electrically connected to the first conductive layer 14 and the second conductive layer 15.

Referring to FIG. 8, an exemplary configuration of the active element 13 will be described hereunder. As shown in FIG. 8, a semiconductor layer 131a, provided on the element substrate 12, is formed of GaInAs, for example. A GaInAs layer 132a, located on the semiconductor layer 131a, is doped with n-type impurity. A GaInAs layer 133a, stacked on the GaInAs layer 132a, is not doped with impurity. An AlAs layer 134a is stacked on the GaInAs layer 133a, an InGaAs layer 135 is stacked on the AlAs layer 134a, and an AlAs layer 134b is stacked on the InGaAs layer 135. The AlAs layer 134a, the InGaAs layer 135, and the AlAs layer 134b constitute an RTD section. A GaInAs layer 133b, stacked on the AlAs layer 134b, is not doped with impurity. A GaInAs layer 132b, stacked on the GaInAs layer 133b, is doped with n-type impurity. A GaInAs layer 131b, stacked on the GaInAs layer 132b, is doped with n-type impurity in high density. Then the first conductive layer 14 is provided on the GaInAs layer 131b.

Though not shown, a GaInAs layer doped with n-type impurity in high density may be interposed between the GaInAs layer 131b and the first conductive layer 14, unlike the configuration shown in FIG. 8. In this case, the contact between the first conductive layer 14 and the GaInAs layer 131b may be improved. The configuration of the active element 13 is not specifically limited, provided that the active element 13 is capable of oscillating (or receiving, or both) the terahertz wave.

The first conductive layer 14 and the second conductive layer 15 are each formed on the element substrate 12. The first conductive layer 14 and the second conductive layer 15 are insulated from each other. The first conductive layer 14 and the second conductive layer 15 each have a layered structure including gold (Au), palladium (Pd), and titanium (Ti). Alternatively, the first conductive layer 14 and the second conductive layer 15 may each have a layered structure including Au and Ti. The first conductive layer 14 and the second conductive layer 15 may be formed through a vacuum deposition process or sputtering process. The first conductive layer 14 and the second conductive layer 15 are each exposed from the element reverse face 112. In the terahertz element 11, antennas are integrated on the side of the element reverse face 112, with a part of each of the first conductive layer 14 and the second conductive layer 15. In this embodiment, as shown in FIG. 6, the part of each of the first conductive layer 14 and the second conductive layer 15 constitutes a dipole antenna. Here, the type of the antenna is not limited to the dipole antenna, but may be of a different type such as a slot antenna, a bowtie antenna, or a ring antenna.

The configuration of the terahertz element 11 is not limited to the above. For example, a reverse face reflector metal layer may be provided, on the face of the element substrate 12 opposite to the face on which the active element 13 is located. In this case, the electromagnetic wave (terahertz wave) emitted from the active element 13 is reflected by the reverse face reflector metal layer, and forms a surface emission radiation pattern in the vertical direction (z-direction), to the element substrate 12. Here, when the reverse face reflector metal layer is provided, the terahertz wave performs fixed-end reflection at the interface between the element substrate 12 and the reverse face reflector metal layer, and therefore the phase is shifted by Π. In this case, it is preferable to design the size of the terahertz element 11 in the z-direction so as to be (λ/4)+(integer multiple of λ/2), where λ represents the wavelength of the terahertz wave.

The encapsulating resin 20 is formed of an electrically insulative resin material. The resin material may be, for example, a black epoxy resin. However, the material of the encapsulating resin 20 is not limited to the above. The refractive index (absolute refractive index) of the encapsulating resin 20, for example, approximately 1.55. The refractive index may vary depending on the material of the encapsulating resin 20. As shown in FIG. 3, the encapsulating resin 20 covers the terahertz element 11, the internal electrode 30, and the plurality of bonding sections 51. The encapsulating resin 20 has, for example, a rectangular shape in a plan view as shown in FIG. 2, without limitation thereto. The encapsulating resin 20 includes a first resin layer 21 and a second resin layer 22.

The first resin layer 21 covers a part of each of the columnar conductors 31 (columnar conductor side face 313 to be subsequently described). The first resin layer 21 serves as a supporting member that supports the terahertz element 11. The first resin layer 21 supports the terahertz element 11, via the plurality of wiring layers 32. The first resin layer 21 includes a first resin layer obverse face 211, a first resin layer reverse face 212, and a plurality of first resin layer side faces 213.

The first resin layer obverse face 211 and the first resin layer reverse face 212 are spaced apart from each other and oriented to opposite sides, in the z-direction. The first resin layer obverse face 211 is oriented to the z2-side, and the first resin layer reverse face 212 is oriented to the z1-side. The first resin layer obverse face 211 has grinding marks, formed through a first resin layer grinding process to be subsequently described. A part of each of the columnar conductors 31 is exposed from the first resin layer reverse face 212. The plurality of first resin layer side faces 213 are each connected to both of the first resin layer obverse face 211 and the first resin layer reverse face 212. The first resin layer side faces 213 are each orthogonal to the first resin layer obverse face 211 and the first resin layer reverse face 212. The first resin layer 21 includes a pair of first resin layer side faces 213, paced from each other and oriented to opposite sides in the x-direction, and a pair of first resin layer side faces 213, spaced apart from each other and oriented to opposite sides in the y-direction.

The second resin layer 22 covers the terahertz element 11, the plurality of wiring layers 32, and a part of the frame-shaped conductor 61. The second resin layer 22 serves as a protecting member that protects the terahertz element 11. The second resin layer 22 includes a second resin layer obverse face 221, a second resin layer reverse face 222, and a plurality of second resin layer side faces 223.

The second resin layer obverse face 221 and the second resin layer reverse face 222 are spaced apart from each other and oriented to opposite sides, in the z-direction. The second resin layer obverse face 221 is oriented to the z2-side, and the second resin layer reverse face 222 is oriented to the z1-side. The second resin layer obverse face 221 has grinding marks, formed through a second resin layer grinding process to be subsequently described. A part of the frame-shaped conductor 61 is exposed from the second resin layer obverse face 221. The plurality of second resin layer side faces 223 are each connected to both of the second resin layer obverse face 221 and the second resin layer reverse face 222. The second resin layer side faces 223 are each orthogonal to the second resin layer obverse face 221 and the second resin layer reverse face 222. The second resin layer 22 includes a pair of second resin layer side faces 223, spaced apart from each other and oriented to opposite sides in the x-direction, and a pair of second resin layer side faces 223, spaced apart from each other and oriented to opposite sides in the y-direction.

The first resin layer 21 and the second resin layer 22 are stacked in the z-direction, such that the first resin layer obverse face 211 and the second resin layer reverse face 222 are in contact with each other. In addition, each of the first resin layer side faces 213 and the corresponding one of the second resin layer side faces 223 are flush with each other.

The internal electrode 30 constitutes an electrical conduction path between the terahertz element 11 and the plurality of external electrodes 40, inside the encapsulating resin 20. The internal electrode 30 includes the plurality of columnar conductors 31 and the plurality of wiring layers 32.

The plurality of columnar conductors 31 are each interposed between the wiring layer 32 and the external electrode 40 in the z-direction, thus securing electrical conduction therebetween. The columnar conductors 31 are each formed so as to penetrate through the first resin layer 21, in the z-direction. The columnar conductors 31 each have, for example, a generally rectangular cross-sectional shape, in the direction orthogonal to the z-direction. The cross-sectional shape is not limited to rectangular, but may be circular, elliptical, or polygonal. The columnar conductors 31 are, for example, formed of copper (Cu). The columnar conductors 31 may each include an underlying layer and a plated layer, stacked on each other. The underlying layer includes a titanium (Ti) layer and a Cu layer stacked on each other, and has a thickness of approximately 200 to 800 nm. The plated layer contains Cu for example, and is thicker than the underlying layer. The plurality of columnar conductors 31 may be formed, for example, through an electrolytic plating process. The material and the forming method of the columnar conductors 31 are not limited to the above. The plurality of columnar conductors 31 are spaced apart from each other. The columnar conductors 31 each include a columnar conductor obverse face 311, a columnar conductor reverse face 312, and a columnar conductor side face 313.

The columnar conductor obverse face 311 and the columnar conductor reverse face 312 are spaced apart from each other and oriented to opposite sides, in the z-direction. The columnar conductor obverse face 311 is exposed from the first resin layer obverse face 211. The columnar conductor obverse face 311 is recessed from the first resin layer obverse face 211. The depth of the recess (size in the z-direction) is, for example, approximately 1 μm. Here, the columnar conductor obverse face 311 and the first resin layer obverse face 211 may be flush with each other. The columnar conductor reverse face 312 is exposed from the first resin layer reverse face 212. The columnar conductor reverse face 312 is flush with the first resin layer reverse face 212. The columnar conductor obverse face 311 is in contact with the wiring layer 32. Accordingly, the columnar conductor 31 and the wiring layer 32 are electrically connected to each other. The columnar conductor reverse face 312 is in contact with the external electrode 40. Accordingly, the columnar conductor 31 and the external electrode 40 are electrically connected to each other. The columnar conductor side face 313 is connected to both of the columnar conductor obverse face 311 and the columnar conductor reverse face 312. The columnar conductor side face 313 is orthogonal to the columnar conductor obverse face 311 and the columnar conductor reverse face 312. The columnar conductor side face 313 is in contact with the first resin layer 21. The columnar conductor side face 313 includes a pair of faces, spaced apart from each other and oriented to opposite sides in the x-direction, and a pair of faces, spaced apart from each other and oriented to opposite sides in the y-direction.

The plurality of wiring layers 32 are each formed so as to span between the columnar conductor obverse face 311 and the first resin layer obverse face 211. The wiring layers 32 each cover the entirety of the columnar conductor obverse face 311 of the corresponding columnar conductor 31, and a part of the first resin layer obverse face 211. The plurality of wiring layers 32 are spaced apart from each other. The wiring layers 32 each include an underlying layer and a plated layer, stacked on each other. The underlying layer includes a Ti layer and a Cu layer stacked on each other, and has a thickness of approximately 200 to 800 nm. The plated layer includes Cu for example, and is thicker than the underlying layer. The plurality of wiring layers 32 may be formed, for example, through an electrolytic plating process. The material and the forming method of the wiring layers 32 are not limited to the above. Further, the footprint of each of the wiring layers 32 is not limited to the example shown in FIG. 2.

The wiring layers 32 each include a wiring layer obverse face 321 and a wiring layer reverse face 322. The wiring layer obverse face 321 and the wiring layer reverse face 322 are spaced apart from each other and oriented to opposite sides, in the z-direction. The wiring layer obverse face 321 is oriented to the z2-side, and the wiring layer reverse face 322 is oriented to the z1-side. The wiring layer obverse face 321 is in contact with the second resin layer 22. The wiring layer reverse face 322 is in contact with the first resin layer 21. In each of the wiring layers 32, the end faces oriented in the x-direction, and the end faces oriented in the y-direction are each covered with the second resin layer 22.

The wiring layers 32 each include a recess 321a, recessed from the wiring layer obverse face 321 in the z-direction. The recess 321a overlaps with the columnar conductor 31, in a plan view. Here, in the case where the columnar conductor obverse face 311 and the first resin layer obverse face 211 are flush with each other, the recess 321a is not formed.

The plurality of external electrodes 40 are conductors exposed to outside, from the terahertz device A1. The plurality of external electrodes 40 are electrically connected to the respective internal electrodes 30. The external electrodes 40 each serve as a terminal, when the terahertz device A1 is mounted on a circuit board of an electronic device. The plurality of external electrode 40 is formed through a non-electrolytic plating process. The external electrodes 40 each include a Ni layer, a Pd layer, and a Au layer, stacked on each other. The size of each external electrode 40 in the z-direction is not specifically limited, but may be, for example, approximately 3 to 10 μm. The size in the z-direction, material, and the forming method of the external electrode 40 are not limited to the above. For example, the external electrodes 40 may each include the Ni layer and the Au layer stacked on each other, or may be formed of tin (Sn).

The external electrodes 40 are exposed from the encapsulating resin 20. The external electrodes 40 are located on the z1-side, with respect to the first resin layer 21. The external electrodes 40 are located on the side of the bottom face of the terahertz device A1. The external electrodes 40 are electrically connected to the respective columnar conductors 31. The plurality of external electrodes 40 each include a columnar conductor shield 41.

The columnar conductor shield 41 covers the corresponding columnar conductor reverse face 312. The columnar conductor shield 41 is in contact with the corresponding columnar conductor reverse face 312. The terahertz element 11 is electrically connected to each of the columnar conductor shields 41, via the bonding section 51, the wiring layer 32, and the columnar conductor 31. The plurality of columnar conductor shields 41 each serve as a terminal of the terahertz device A1.

The plurality of bonding sections 51 are each formed of a conductive bonding material. The bonding sections 51 are each interposed between the terahertz element 11 (to be more detailed, the portions of the aforementioned electrode corresponding to a part of each of the first conductive layer 14 and the second conductive layer 15), and the corresponding wiring layer 32. The terahertz element 11 is fixed to the plurality of wiring layers 32 via the plurality of bonding sections 51, thus to be mounted on the wiring layers 32. By the plurality of bonding sections 51, the electrical conduction between the terahertz element 11 and the plurality of wiring layers 32 can be secured. The bonding sections 51 each include an insulation layer 511 and a bonding layer 512, as shown in FIG. 5.

The insulation layers 511 are each formed on the corresponding wiring layer 32, as shown in FIG. 4. The insulation layers 511 each have a frame shape with an opening at the central position, in a plan view. The insulation layer 511 surrounds the bonding layer 512, in a plan view. The insulation layers 511 each have, for example, a rectangular ring shape in a plan view. However, the plan-view shape of the insulation layer 511 is not limited to the rectangular ring shape, but may be a circular ring shape, an elliptical ring shape, or a polygonal ring shape. The insulation layers 511 may be, for example, formed of a polyimide resin.

The bonding layers 512 each serve to conductively bond the terahertz element 11 to the wiring layers 32. The bonding layers 512 are each formed on the corresponding wiring layer 32 (wiring layer obverse face 321). The bonding layers 512 each cover the surface of the opening of the corresponding insulation layer 511. A part of the bonding layer 512 is filled in the opening of the insulation layer 511. The bonding layers 512 each include, as shown in FIG. 5, a first layer 512a, a second layer 512b, and a third layer 512c, stacked on each other.

The first layer 512a is formed on the wiring layer 32 (wiring layer obverse face 321), in contact with the wiring layer obverse face 321. The first layer 512a is, for example, formed of a metal containing Cu. The second layer 512b is formed on the first layer 512a, in contact therewith. The second layer 512b is, for example, formed of a metal containing Ti. The third layer 512c is formed on the second layer 512b, in contact therewith. The third layer 512c is also in contact with the terahertz element 11 (aforementioned electrode). The third layer 512c is, for example, formed of an alloy containing Sn. Examples of such alloy include lead-free solders such as a Sn—Sb-based alloy or a Sn—Ag-based alloy.

The frame-shaped conductor 61 is provided around the terahertz element 11, in a plan view. The frame-shaped conductor 61 is located on the outer side of the terahertz element 11, so as to surround the terahertz element 11, in a plan view. The frame-shaped conductor 61 has, for example, a rectangular ring shape in a plan view. The plan-view shape of the frame-shaped conductor 61 is not limited to the rectangular ring shape, but may be a circular ring shape, an elliptical ring shape, or a polygonal ring shape. A part of the second resin layer 22 is interposed between the frame-shaped conductor 61 and the terahertz element 11. The frame-shaped conductor 61 is formed on the first resin layer 21, and erected on the first resin layer obverse face 211. The frame-shaped conductor 61 is spaced apart from the internal electrode 30.

The frame-shaped conductor 61 includes, for example, an underlying layer and a plated layer stacked on each other. The underlying layer includes a Ti layer and a Cu layer stacked on each other, and has a thickness of approximately 200 to 800 nm. The plated layer is predominantly composed of Cu, and thicker than the underlying layer. The frame-shaped conductor 61 may be formed, for example, through an electrolytic plating process.

The frame-shaped conductor 61 includes an inner face 611, an outer face 612, and a top face 613. The inner face 611 corresponds to the inner circumferential wall of the frame-shaped conductor 61 in a plan view. The inner face 611 is opposed to the element side faces 113 of the terahertz element 11. The inner face 611 is generally parallel to each of the element side faces 113. The outer face 612 corresponds to the outer circumferential wall of the frame-shaped conductor 61 in a plan view. The top face 613 is oriented to the z2-side. The top face 613 is exposed from the second resin layer 22. The top face 613 is recessed from the second resin layer obverse face 221 of the second resin layer 22. The depth of the recess (size in the z-direction) is approximately 1 μm. The top face 613 may be flush with the second resin layer obverse face 221. The top face 613 may be covered with the second resin layer 22. The top face 613 is located on the z2-side in the z-direction, with respect to the element obverse face 111.

A separation distance Xb between each of the element side faces 113 and the portion of the inner face 611 opposed thereto can be expressed as $Xb=(\lambda'_{Resin}/4)+((\lambda'_{Resin}/2)\times N)$, where N represents an integer not smaller than 0, namely 0, 1, 2, 3, and so forth. In this computing equation, $\lambda'_{Resin}$ represents the effective wavelength of the terahertz wave transmitted in the encapsulating resin 20 (second resin layer 22). $\lambda'_{Resin}$ can be obtained by $(1/n2)\times(c/f_c)$, where n2 represents the refractive index of the encapsulating resin 20 (second resin layer 22), c represents the velocity of light, and $f_c$ represents the center frequency of the terahertz wave. Setting the separation distance Xb as above allows the terahertz wave oscillated by the terahertz element 11 to perform fixed-end reflection, at the inner face 611. Accordingly, the inner face 611 of the frame-shaped conductor 61 acts as a reflecting surface that reflects the terahertz wave oscillated by the terahertz element 11 and, in particular, causes resonance reflection of the terahertz wave. In other words, the frame-shaped conductor 61 acts as a resonator (secondary resonator) that causes the terahertz wave to resonate. The size of the frame-shaped conductor 61 in the z-direction is not specifically limited, but may preferably be designed so as to allow the inner face 611 to act as the reflecting surface. The separation distance Xb in each pair of the element side face 113 and the portion of the inner face 611 opposed thereto may be different from each other, provided that the distances are each obtained through the foregoing equation.

Referring now to FIG. 9 to FIG. 21, an exemplary manufacturing method of the terahertz device A1 according to the first embodiment will be described hereunder. The manufacturing method described below represents the case where a plurality of terahertz devices A1 are manufactured. FIG. 9 to FIG. 21 are cross-sectional views each showing a process in the manufacturing method of the terahertz device A1.

Figure 9:
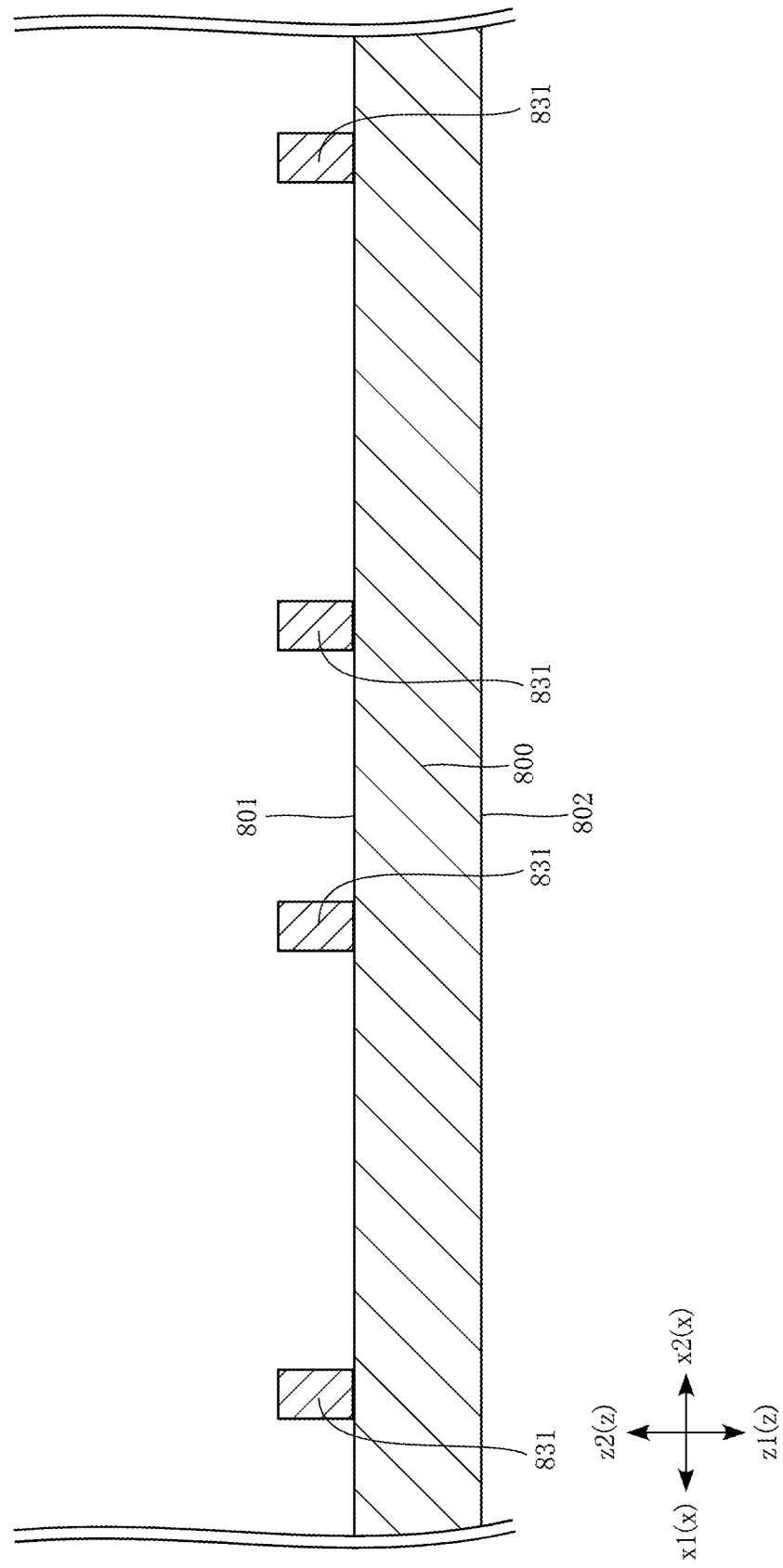
FIG. 9 is a cross-sectional view for explaining a process of the manufacturing method of the terahertz device according to the first embodiment.

First, a support substrate 800 is prepared, as shown in FIG. 9. The support substrate 800 is formed of a monocrystalline semiconductor material, for example a monocrystalline silicon material. In the process of preparing the support substrate 800 (support substrate preparing process), for example a Si wafer is prepared as the support substrate 800. The thickness of the support substrate 800 is, for example, approximately 725 to 775 μm. The support substrate 800 includes a support substrate obverse face 801 and a support substrate reverse face 802, spaced apart from each other and oriented to opposite sides in the z-direction. The support substrate obverse face 801 is oriented to the z2-side, and the support substrate reverse face 802 is oriented to the z1-side. The support substrate 800 to be prepared is not limited to the Si wafer, but may be a glass substrate, for example.

Then columnar conductors 831 are formed on the support substrate 800, as shown in FIG. 9. The columnar conductor 831 corresponds to the columnar conductor 31 of the terahertz device A1. In the process of forming the columnar conductors 831 (columnar conductor forming process), first an underlying layer is formed, in contact with the support substrate obverse face 801. The underlying layer is formed through a sputtering process. In this process, a Ti layer is formed in contact with the support substrate obverse face 801, and then a Cu layer is formed in contact with the Ti layer. Thus, the underlying layer is formed of the Ti layer and the Cu layer stacked on each other. The thickness of the Ti layer is, for example, approximately 10 to 30 nm, and the thickness of the Cu layer is, for example, approximately 200 to 800 nm. The material and the thickness of the underlying layer are not limited to the above. Then a plated layer is formed in contact with the underlying layer. The plated layer is formed through formation of a resist pattern by photolithography, and an electrolytic plating process. More specifically, a photosensitive resist is applied so as to cover the entirety of the underlying layer, and the photosensitive resist is exposed and developed. Thus, a patterned resist layer (hereinafter, "resist pattern") is obtained. The photosensitive resist may be applied for example with a spin coater, without limitation thereto. In this process, a part of the underlying layer is exposed from the resist pattern. Then an electrolytic plating process is performed, using the underlying layer as the conduction path. As result, the plated layer is precipitated on the underlying layer exposed from the resist pattern. The plated layer is, for example, formed of Cu. After the plated layer is formed, the resist pattern is removed. Through the mentioned process, the columnar conductors 831 are formed as shown in FIG. 9. In this embodiment, the columnar conductor forming process corresponds to the "first conductor forming process" in the present disclosure.

Figure 10:
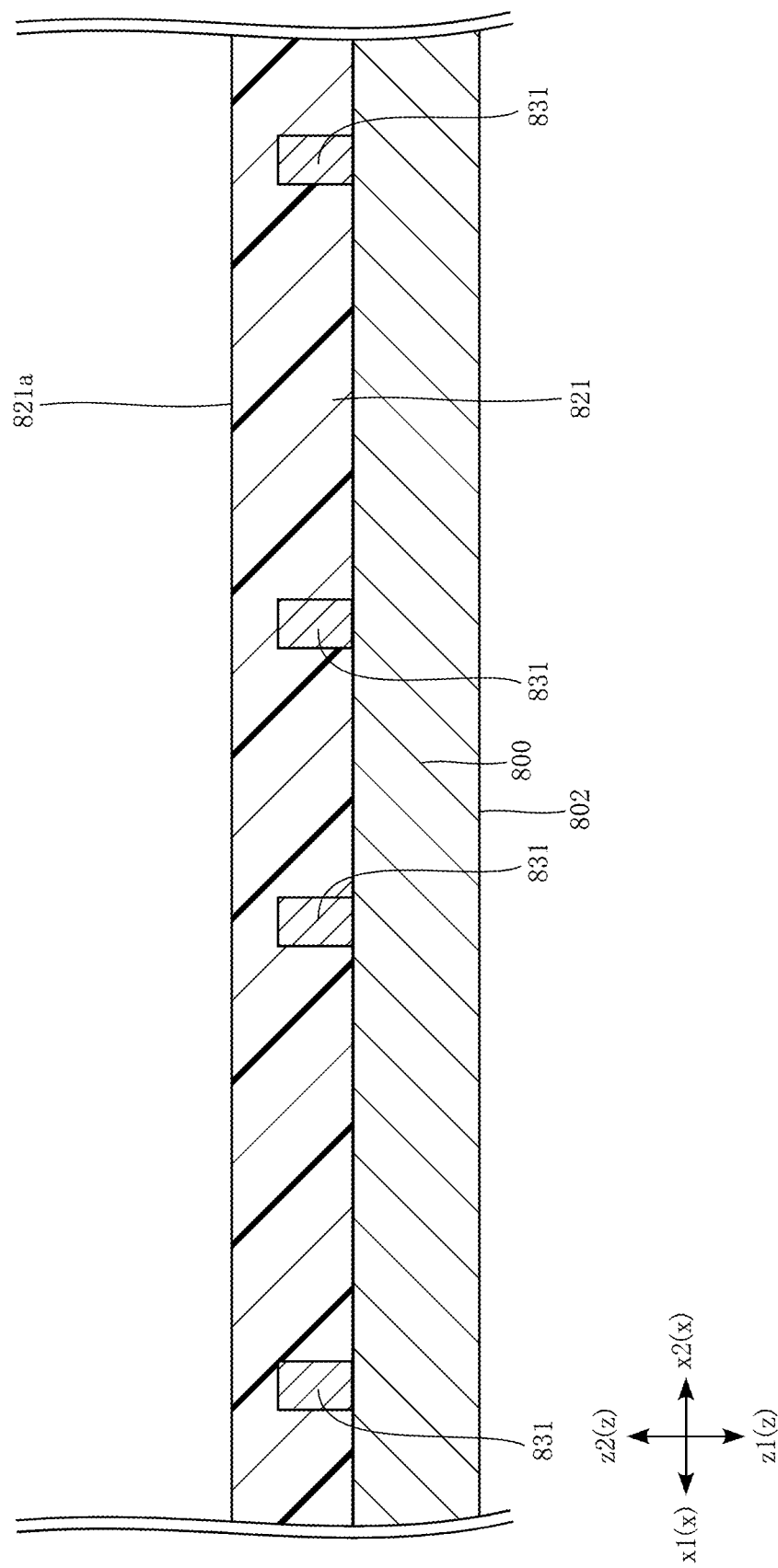
FIG. 10 is a cross-sectional view for explaining another process of the manufacturing method of the terahertz device according to the first embodiment.

Proceeding to FIG. 10, a first resin layer 821 is formed so as to cover the columnar conductors 831. In the process of forming the first resin layer 821 (first resin layer forming process), for example a molding method is employed. The first resin layer 821 is an electrically insulative synthetic resin, for example predominantly composed of a black epoxy resin. Through the first resin layer forming process, the columnar conductors 831 are entirely covered with the first resin layer 821. Therefore, the face of the first resin layer 821 oriented to the z2-side (first resin layer obverse face 821a) is located on the z2-side, with respect to the face of the columnar conductor 831 oriented to the z2-side.

Figure 11:
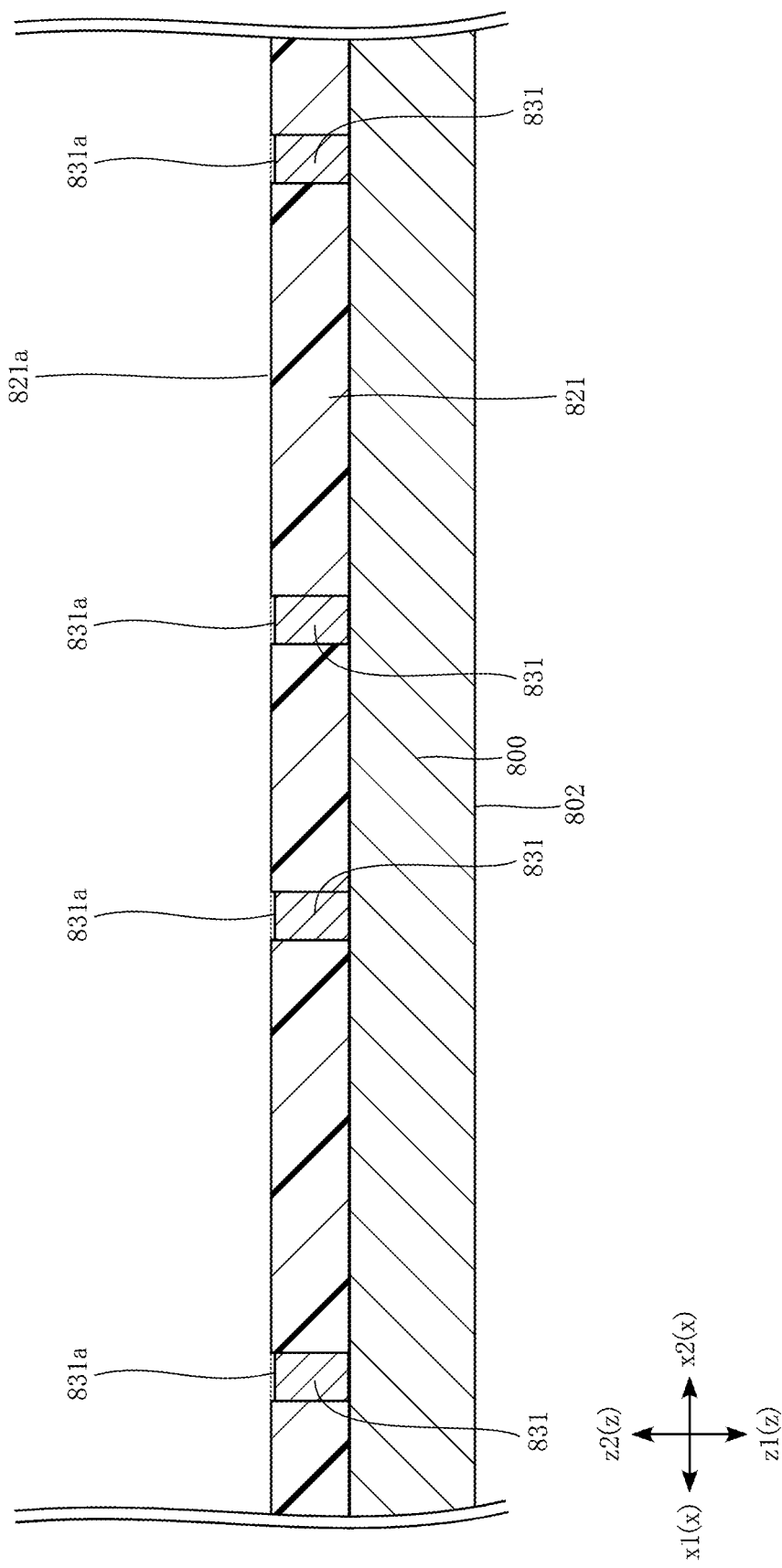
FIG. 11 is a cross-sectional view for explaining another process of the manufacturing method of the terahertz device according to the first embodiment.

Proceeding to FIG. 11, the first resin layer 821 is ground. In the process of grinding the first resin layer 821 (first resin layer grinding process), for example a grinding machine is employed. The tool for grinding the first resin layer 821 is not limited to the grinding machine. In this process, the first resin layer 821 is ground with a grinding stone, toward the z1-side from the first resin layer obverse face 821*a*. The first resin layer 821 is ground, until the columnar conductor 831 is exposed. Through the first resin layer grinding process, the first resin layer obverse face 821*a* moves toward the z1-side, such that the face of the columnar conductor 831 oriented to the z2-side (columnar conductor obverse face 831*a*) is exposed from the first resin layer 821 (first resin layer obverse face 821*a*). On the first resin layer obverse face 821*a*, grinding marks are formed as result of the grinding work with the grinding stone. The grinding marks are formed so as to intrude into the columnar conductor obverse face 831*a*, from the first resin layer obverse face 821*a*. Through the grinding of the first resin layer 821 in this process, the columnar conductors 831 are also slightly ground. Here, burrs may appear on the columnar conductor obverse face 831*a* after the grinding work, owing to the difference in material between the columnar conductor 831 and the first resin layer 821. Accordingly, a chemical treatment is performed to remove the burrs. As result, the columnar conductor obverse face 831*a* is recessed from the first resin layer obverse face 821*a*, in the z-direction.

Then wiring layers 832, bonding sections 851, and frame-shaped conductors 861 are formed, as shown in FIG. 12 to FIG. 16. The wiring layer 832, the bonding section 851, and the frame-shaped conductor 861 respectively correspond to the wiring layer 32, the bonding section 51, and the frame-shaped conductor 61 of the terahertz device A1. The process of forming the mentioned components includes five steps as described below.

Figure 12:
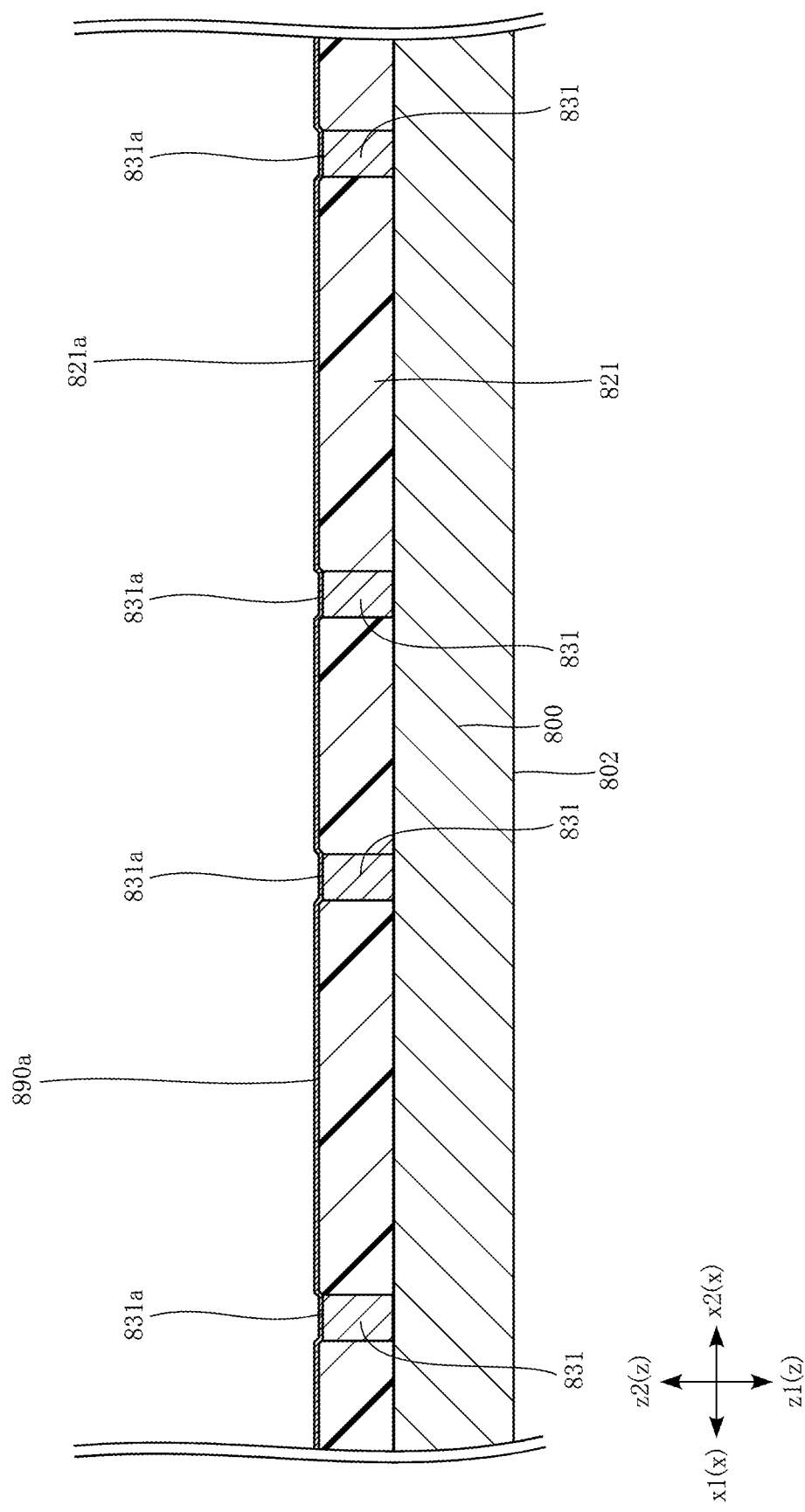
FIG. 12 is a cross-sectional view for explaining another process of the manufacturing method of the terahertz device according to the first embodiment.

At a first step, an underlying layer 890*a* is formed, as shown in FIG. 12. The underlying layer 890*a* may be formed, for example, through a sputtering process. In the process of forming the underlying layer 890*a*, a Ti layer is formed so as to cover the entirety of the first resin layer obverse face 821*a* and the columnar conductor obverse face 831*a*, and then a Cu layer is formed in contact with the Ti layer. Thus, the underlying layer 890*a* is composed of the Ti layer and the Cu layer stacked on each other.

Figure 13:
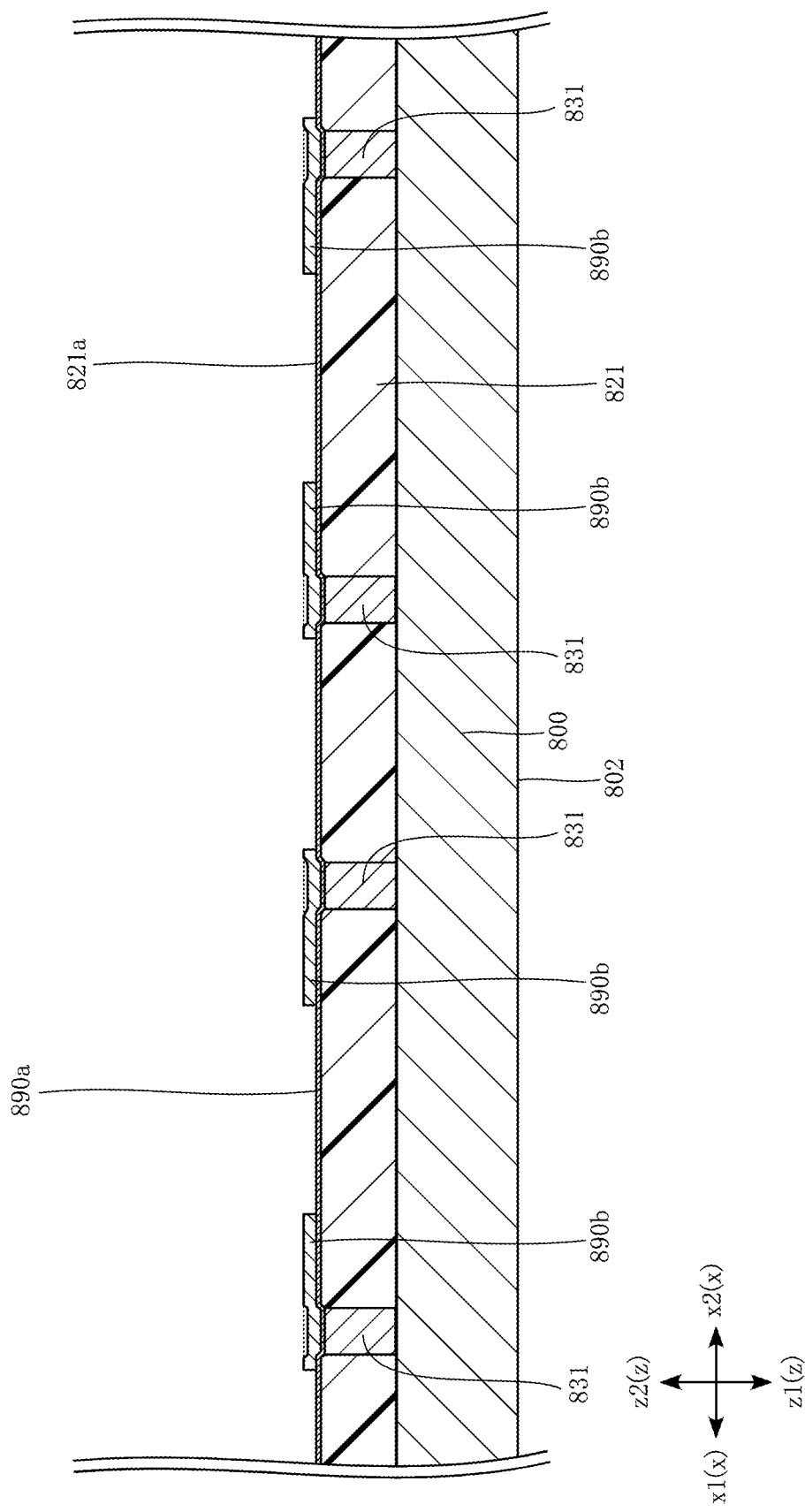
FIG. 13 is a cross-sectional view for explaining another process of the manufacturing method of the terahertz device according to the first embodiment.

At a second step, plated layers 890*b* are formed as shown in FIG. 13. The plated layers 890*b* may be formed, for example, through formation of a resist pattern by photolithography, and an electrolytic plating process. In the process of forming the plated layers 890*b*, a photosensitive resist is applied so as to cover the entirety of the underlying layer 890*a*, and a resist layer is patterned by exposure and developing of the photosensitive resist. As result, a resist pattern is formed, such that a part of the underlying layer 890*a* (where the plated layers 890*b* are to be formed) is exposed from the resist pattern. Then the plated layers 890*b* are precipitated on the underlying layer 890*a* exposed from the resist pattern, through an electrolytic plating process using the underlying layer 890*a* as the conduction path. In this process, for example a metal layer containing Cu is precipitated, to form the plated layers 890*b*. At this point, the plated layers 890*b* are integrally formed with the underlying layer 890*a*. Thereafter, the resist pattern formed as above is entirely removed. Thus, the plated layers 890*b* shown in FIG. 13 are formed. The plated layers 890*b*, and the portions of the underlying layer 890*a* respectively covered with the plated layer 890*b* subsequently constitute the wiring layers 832. The wiring layer 832 corresponds to the wiring layer 32 of the terahertz device A1.

Figure 14:
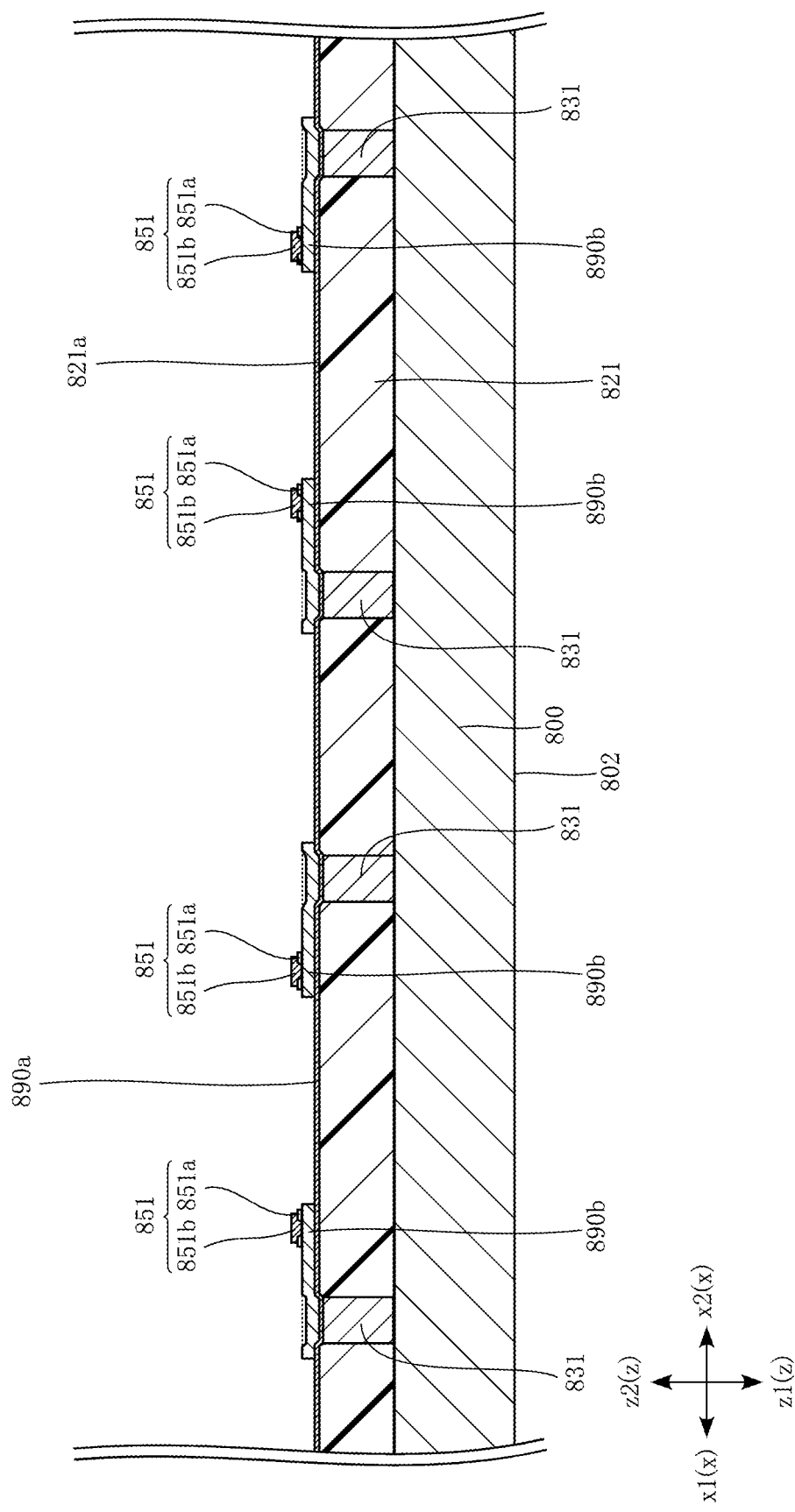
FIG. 14 is a cross-sectional view for explaining another process of the manufacturing method of the terahertz device according to the first embodiment.

At a third step, the bonding sections 851 are formed as shown in FIG. 14. In this process, insulation layers 851*a* and bonding layers 851*b* are formed, to constitute the bonding sections 851. To form the insulation layers 851*a*, photosensitive polyimide is applied so as to cover the entirety of the plated layers 890*b*, and the entirety of the underlying layer 890*a* exposed from the plated layers 890*b*. The photosensitive polyimide is applied, for example, with a spin coater. Then the frame-shaped insulation layers 851*a* are formed, through exposure and developing of the photosensitive polyimide applied. To form the bonding layers 851*b*, first a resist pattern to be used to form the bonding layer 851*b* is formed. To form the resist pattern, photosensitive resist is applied, and a resist layer is patterned by exposure and developing of the photosensitive resist. As result, the resist pattern is formed, such that a part of the plated layer 890*b* (where the bonding layers 851*b* are to be formed) is exposed from the resist pattern. The exposed portion is located inside of the frame-shaped insulation layer 851*a*, in a plan view. Then the bonding layers 851*b* are precipitated on the respective plated layers 890*b* exposed from the resist pattern, through an electrolytic plating process using the underlying layer 890*a* and the plated layer 890*b* as the conduction path. At this step, a metal layer containing Cu, a metal layer containing Ni, and an alloy layer containing Sn are sequentially stacked, to constitute the bonding layer 851*b*. The alloy layer containing Sn may be, for example, lead-free solder such as a Sn—Sb-based alloy or a Sn—Ag-based alloy. Thereafter, the resist pattern formed as above is removed. Thus, the bonding sections 851 each including the insulation layer 851*a* and the bonding layer 851*b* are formed, as shown in FIG. 14. The bonding section 851 corresponds to the bonding section 51 of the terahertz device A1.

Figure 15:
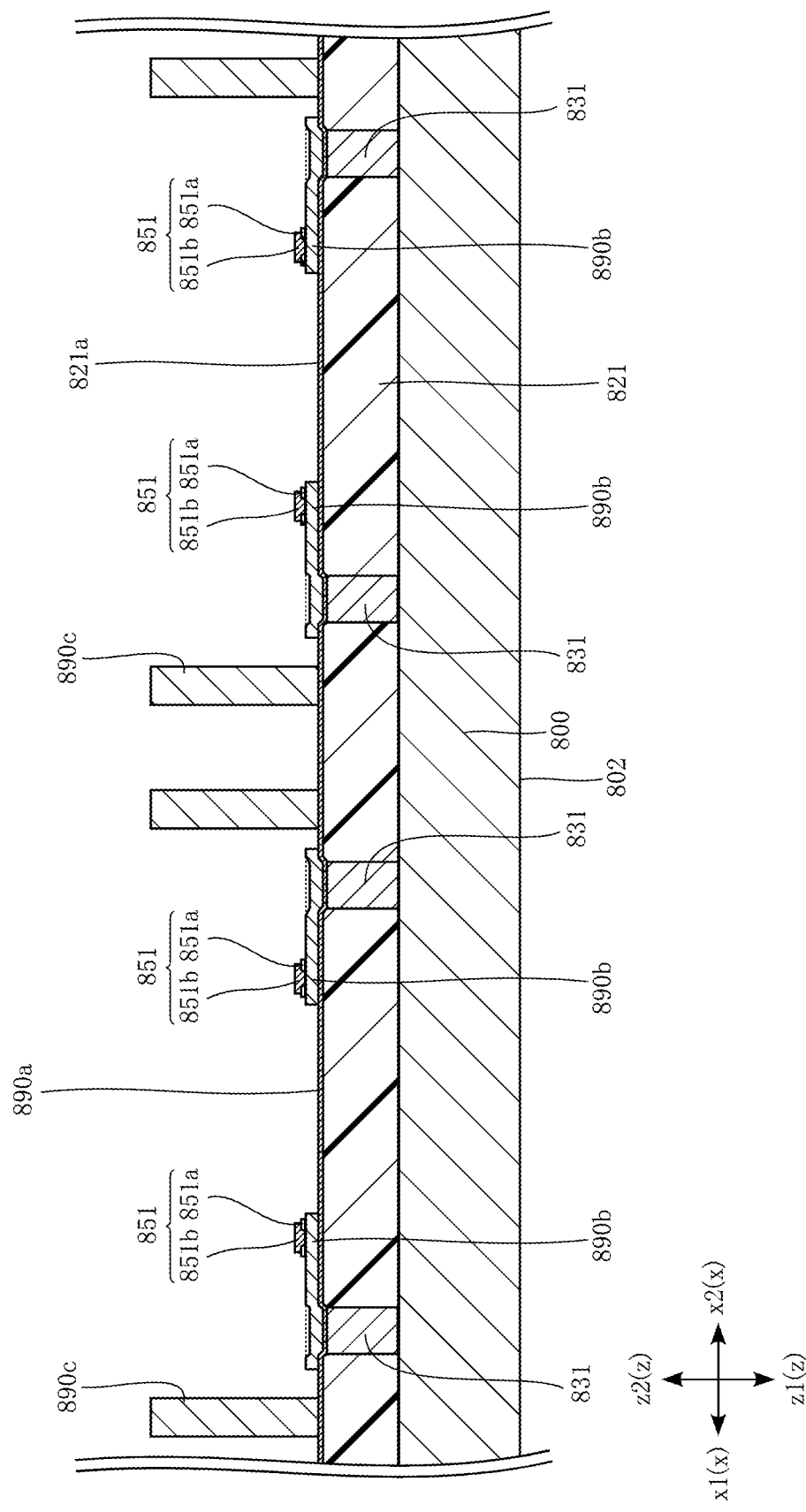
FIG. 15 is a cross-sectional view for explaining another process of the manufacturing method of the terahertz device according to the first embodiment.

At a fourth step, plated layers 890*c* are formed as shown in FIG. 15. The plated layers 890*c* may be formed, for example, through formation of a resist pattern by photolithography, and an electrolytic plating process. The plated layers 890*c* are formed in a similar way to the formation of the plated layers 890*b*. More specifically, to form the plated layers 890*c*, a resist pattern to be used to form the plated layers 890*c* is formed. As result, a part of the underlying layer 890*a* (where the plated layers 890*c* are to be formed) is exposed from the resist pattern that has been formed. Then the plated layers 890*c* are precipitated on the underlying layer 890*a* exposed from the resist pattern, through an electrolytic plating process using the underlying layer 890*a* as the conduction path. In this process, for example a metal layer containing Cu is precipitated, to form the plated layers 890*c*. The plated layers 890*c* are integrally formed with the underlying layer 890*a*. Thereafter, the resist pattern formed as above is removed. Thus, the plated layers 890*c* shown in FIG. 15 are formed. The plated layers 890*c*, and the portions of the underlying layer 890*a* respectively covered with the plated layers 890*c* subsequently constitute the frame-shaped conductor 861. The frame-shaped conductor 861 corresponds to the frame-shaped conductor 61 of the terahertz device A1.

Figure 16:
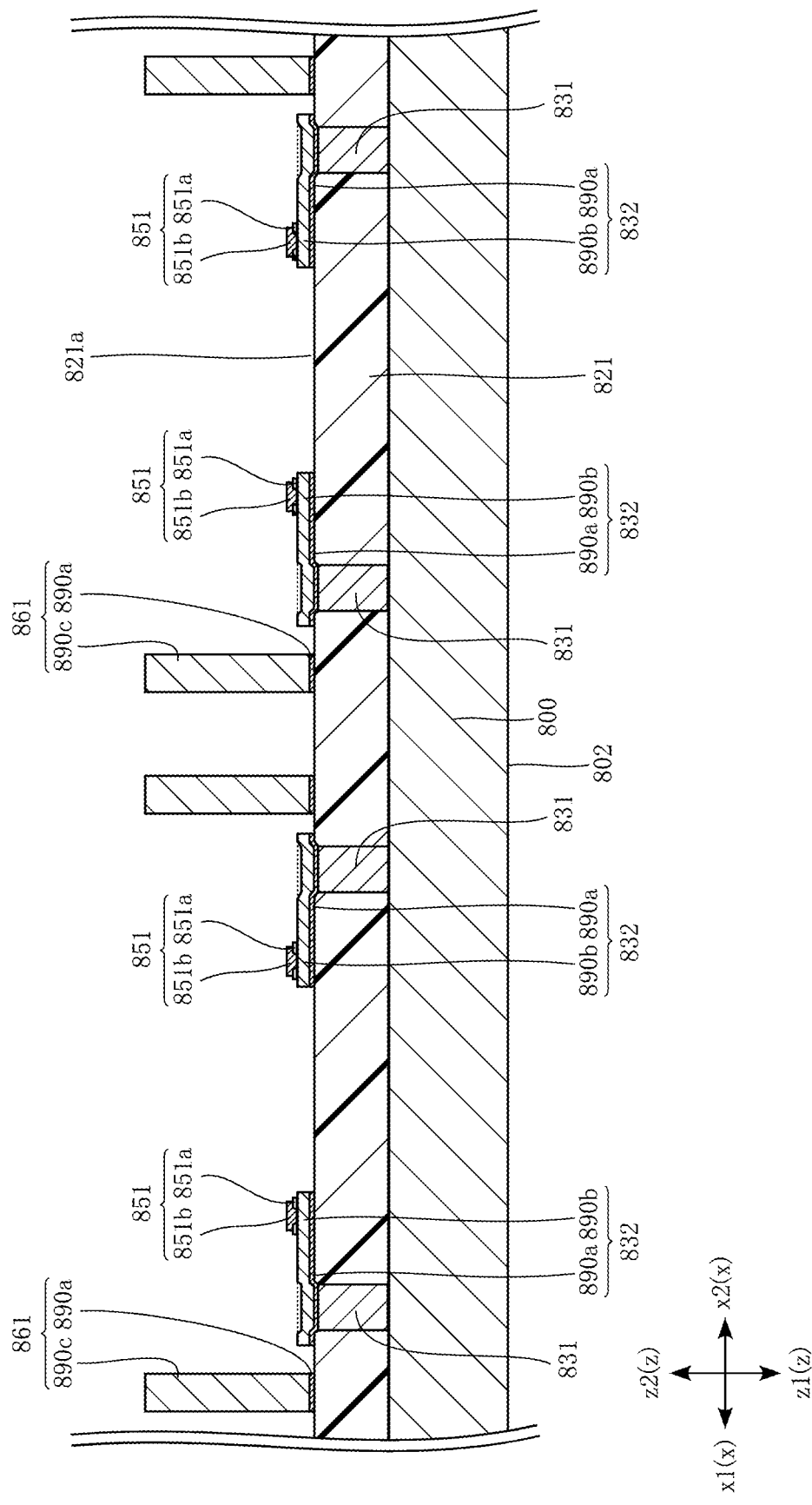
FIG. 16 is a cross-sectional view for explaining another process of the manufacturing method of the terahertz device according to the first embodiment.

At a fifth step, unnecessary portions of the underlying layer 890*a* are removed, as shown in FIG. 16. At this step, the portions of the underlying layer 890*a* covered with neither of the plated layer 890*b* and the plated layer 890*c* are removed, as unnecessary portions of the underlying layer 890*a*. The unnecessary portions of the underlying layer 890*a* are removed, for example, by a wet etching process using a mixed solution of sulfuric acid ($H_2SO_4$) and hydrogen peroxide ($H_2O_2$). Through the step of removing the unnecessary portions of the underlying layer 890*a*, the underlying layer 890*a* formed at the first step is divided into the underlying layer 890*a* covered with the plated layer 890*b* and the underlying layer 890*a* covered with the plated layer 890*c*, as shown in FIG. 16. Accordingly, as shown in FIG.

16, the wiring layers 832, including the plated layer 890b and the underlying layer 890a covered therewith, are formed, and the frame-shaped conductors 861, including the plated layer 890c and the underlying layer 890a covered therewith, are formed. In FIG. 17 to FIG. 21, the plated layer 890b and the underlying layer 890a covered therewith are unified into the wiring layer 832, and the plated layer 890c and the underlying layer 890a covered therewith are unified into the frame-shaped conductor 861.

Through the mentioned five steps, the wiring layers 832, the bonding sections 851, and the frame-shaped conductors 861 are obtained, as shown in FIG. 16. Although the wiring layers 832 and the frame-shaped conductors 861 are formed from the same underlying layer 890a in this embodiment, the underlying layer may be separately formed, to form the wiring layer 832 and to form the frame-shaped conductor 861. The combination of the step of forming the underlying layer 890a, the step of forming the plated layers 890b, and the step of removing the unnecessary portions of the underlying layer 890a, corresponds to the "first wiring layer forming process" in the present disclosure. The combination of the step of forming the underlying layer 890a, the step of forming the plated layer 890c, and the step of removing the unnecessary portions of the underlying layer 890a, corresponds to the "second conductor forming process" in the present disclosure.

Figure 17:
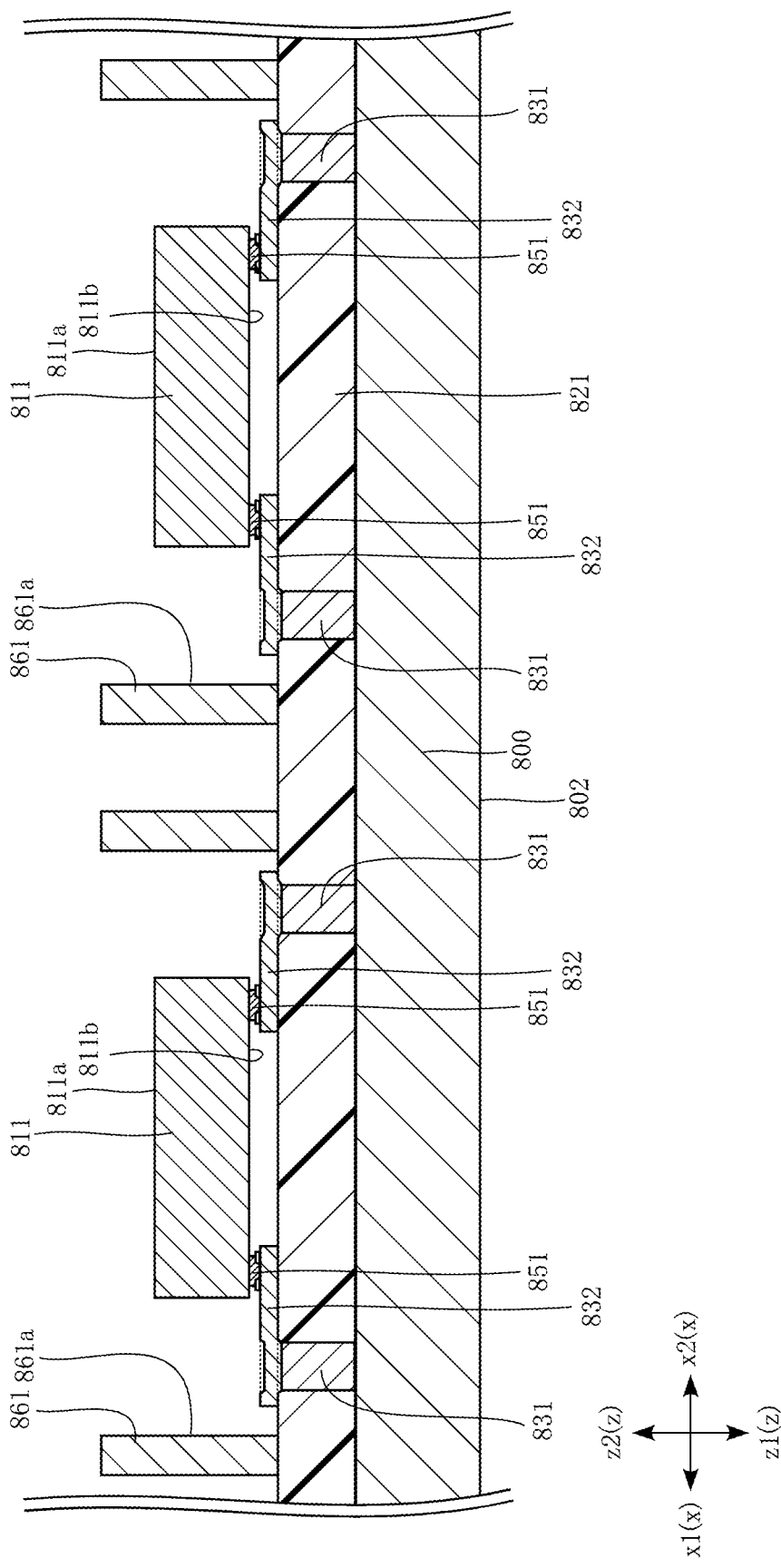
FIG. 17 is a cross-sectional view for explaining another process of the manufacturing method of the terahertz device according to the first embodiment.

Then terahertz elements 811 are mounted, as shown in FIG. 17. The terahertz element 811 corresponds to the terahertz element 11 of the terahertz device A1. The terahertz element 811 includes an element obverse face 811a oriented to the z2-side, and an element reverse face 811b oriented to the z1-side. From the element reverse face 811b, electrodes of the terahertz element 811 (a part of each of the first conductive layer 14 and the second conductive layer 15) are exposed. The process of mounting the terahertz element 811 (terahertz element mounting process) is performed by a flip-chip bonding method. More specifically, flux is applied to the element reverse face 811b of the terahertz element 811, and then the terahertz element 811 is tentatively placed on the bonding sections 851, for example with a flip-chip bonder. At this point, the element reverse face 811b is opposed to the wiring layer 832. The bonding sections 851 are each interposed between the wiring layer 832 and the non-illustrated electrode formed on the element reverse face 811b of the terahertz element 811. Thereafter, the bonding layer 851b of the bonding section 851 is molten by a reflow process, and joined to the electrode pad. Then the bonding layer 851b of the bonding section 851 is cured by cooling. As result, the terahertz element 811 is mounted on the wiring layers 832, and the electrode of the terahertz element 811 becomes electrically connected to the wiring layer 832, via the bonding section 851.

Figure 18:
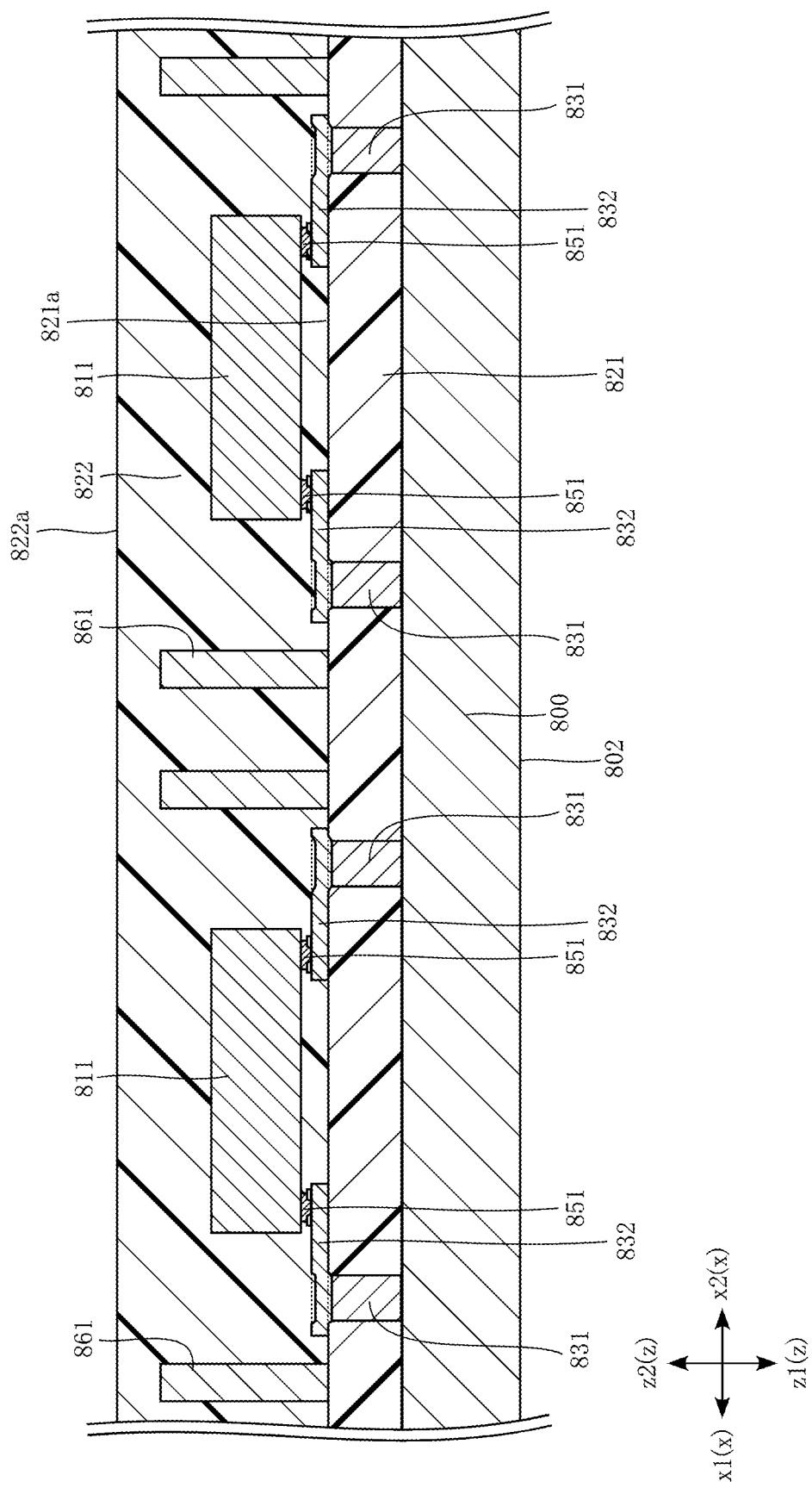
FIG. 18 is a cross-sectional view for explaining another process of the manufacturing method of the terahertz device according to the first embodiment.

Proceeding to FIG. 18, a second resin layer 822 is formed. To form the second resin layer 822 (second resin layer forming process), for example a molding method is employed. The second resin layer 822 is, like the first resin layer 821, formed of an electrically insulative synthetic resin, for example predominantly composed of a black epoxy resin. In this process, the second resin layer 822 is formed on the first resin layer 821, so as to cover the terahertz element 811 and the frame-shaped conductor 861. The second resin layer 822 formed through the second resin layer forming process entirely covers the terahertz element 811 and the frame-shaped conductor 861. Therefore, the face of the second resin layer 822 oriented to the z2-side (second resin layer obverse face 822a) is located on the z2-side, with respect to both of the face of the frame-shaped conductor 861 oriented to the z2-side, and the element obverse face 811a. In the second resin layer forming process, an underfill predominantly composed of an epoxy resin may be filled in the space under the terahertz element 811 (between the terahertz element 811 and the first resin layer obverse face 821a), before the molding process.

Figure 19:
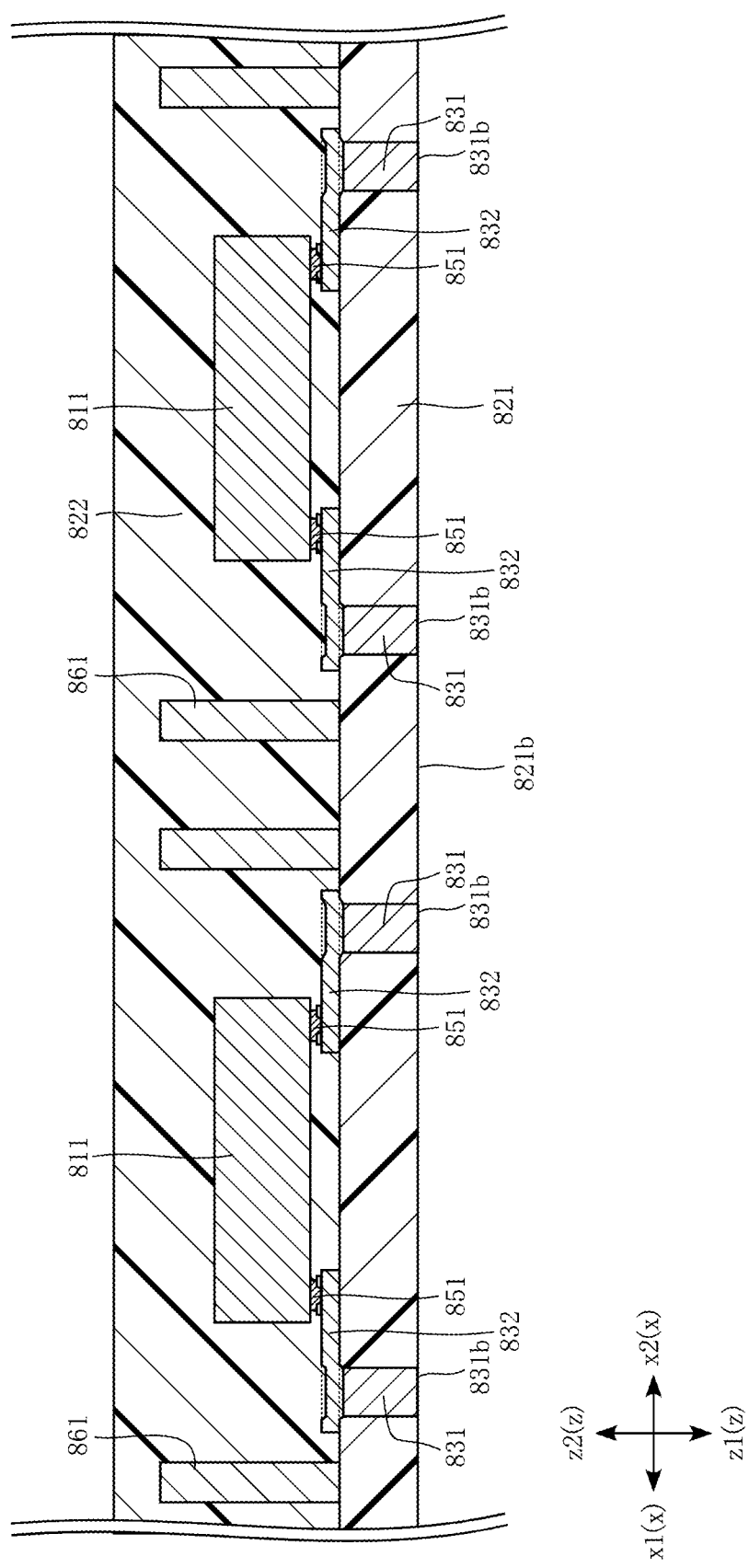
FIG. 19 is a cross-sectional view for explaining another process of the manufacturing method of the terahertz device according to the first embodiment.

Proceeding to FIG. 19, the support substrate 800 is removed. To remove the support substrate 800 (support substrate removing process), a grinding machine is employed. However, the grinding method is not limited to using the grinding machine. In this process, the support substrate 800 is ground toward the z2-side from the support substrate reverse face 802, until the support substrate 800 is completely removed. In addition to completely removing the support substrate 800, the underlying layer in the columnar conductor 831 is also ground. Therefore, the columnar conductor 831 becomes constituted of the plated layer, which is a metal layer containing Cu. In the case where the underlying layer in the columnar conductor 831 is left unremoved after the support substrate 800 is ground, the columnar conductor 831 includes the underlying layer and the plated layer. Through the support substrate removing process, the face of the first resin layer 821 oriented to the z1-side (first resin layer reverse face 821b), and the face of the columnar conductor 831 oriented to the z1-side (columnar conductor reverse face 831b) are exposed to outside. In the case where a glass substrate is employed as the support substrate 800, the glass substrate is removed by treatment with a chemical solution or laser irradiation, to thereby remove the support substrate 800.

Figure 20:
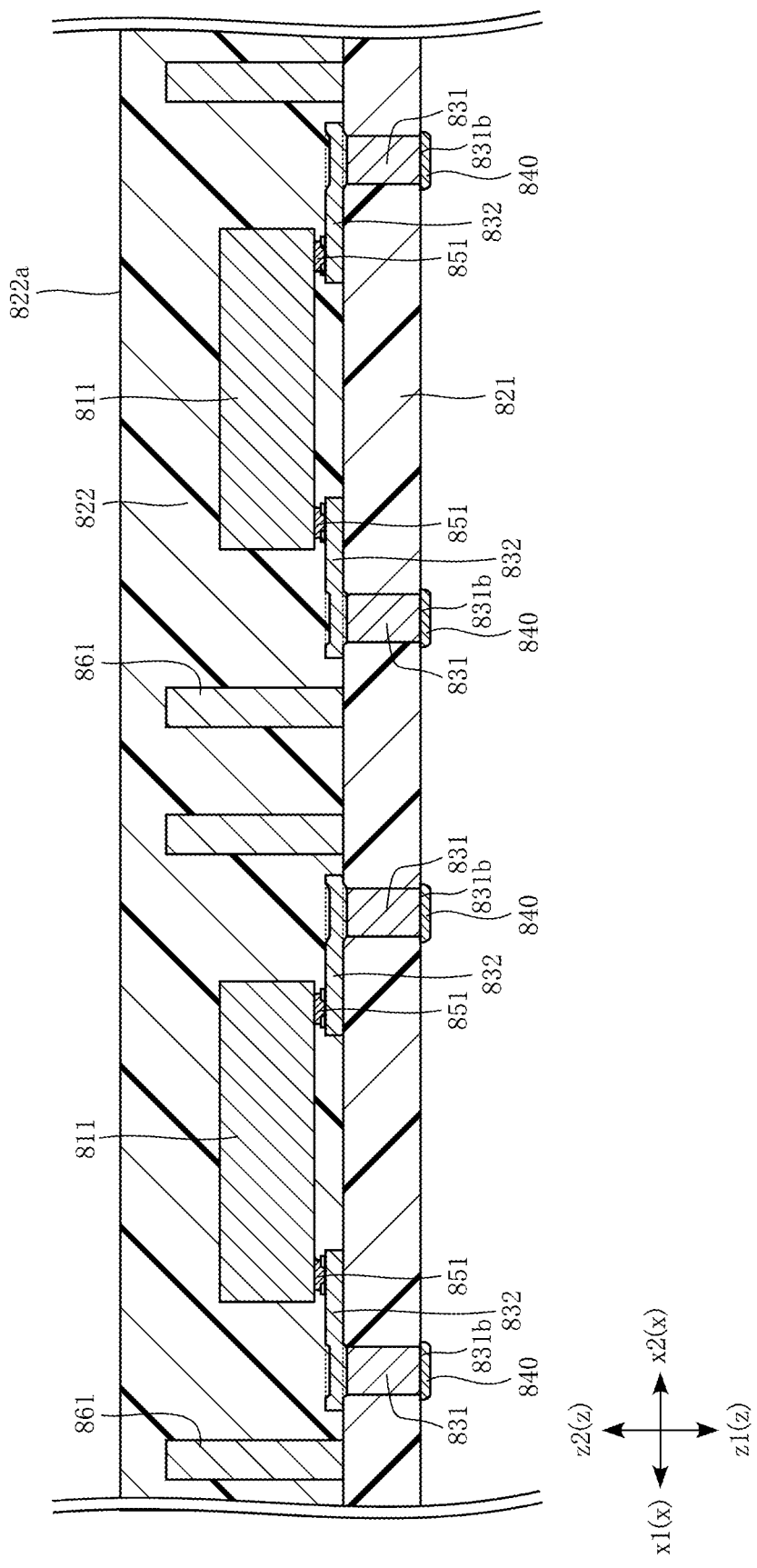
FIG. 20 is a cross-sectional view for explaining another process of the manufacturing method of the terahertz device according to the first embodiment.

Proceeding to FIG. 20, external electrodes 840 are formed. To form the external electrode 840 (external electrode forming process), a non-electrolytic plating process is performed. In this process, a Ni layer, a Pd layer, and a Au layer are sequentially precipitated, by non-electrolytic plating. More specifically, the Ni layer is formed so as to cover the columnar conductor reverse face 831b in contact therewith, the Pd layer is formed on the Ni layer, and then the Au layer is formed on the Pd layer. Through the mentioned process, the external electrode 840 is obtained as shown in FIG. 20. Here, the forming method of the external electrode 840 is not limited to the above. For example, the Ni layer and the Au layer may be sequentially precipitated, or only the Au layer may be precipitated. Further, only Sn may be employed, or a Sn layer may be formed on the Ni layer.

Figure 21:
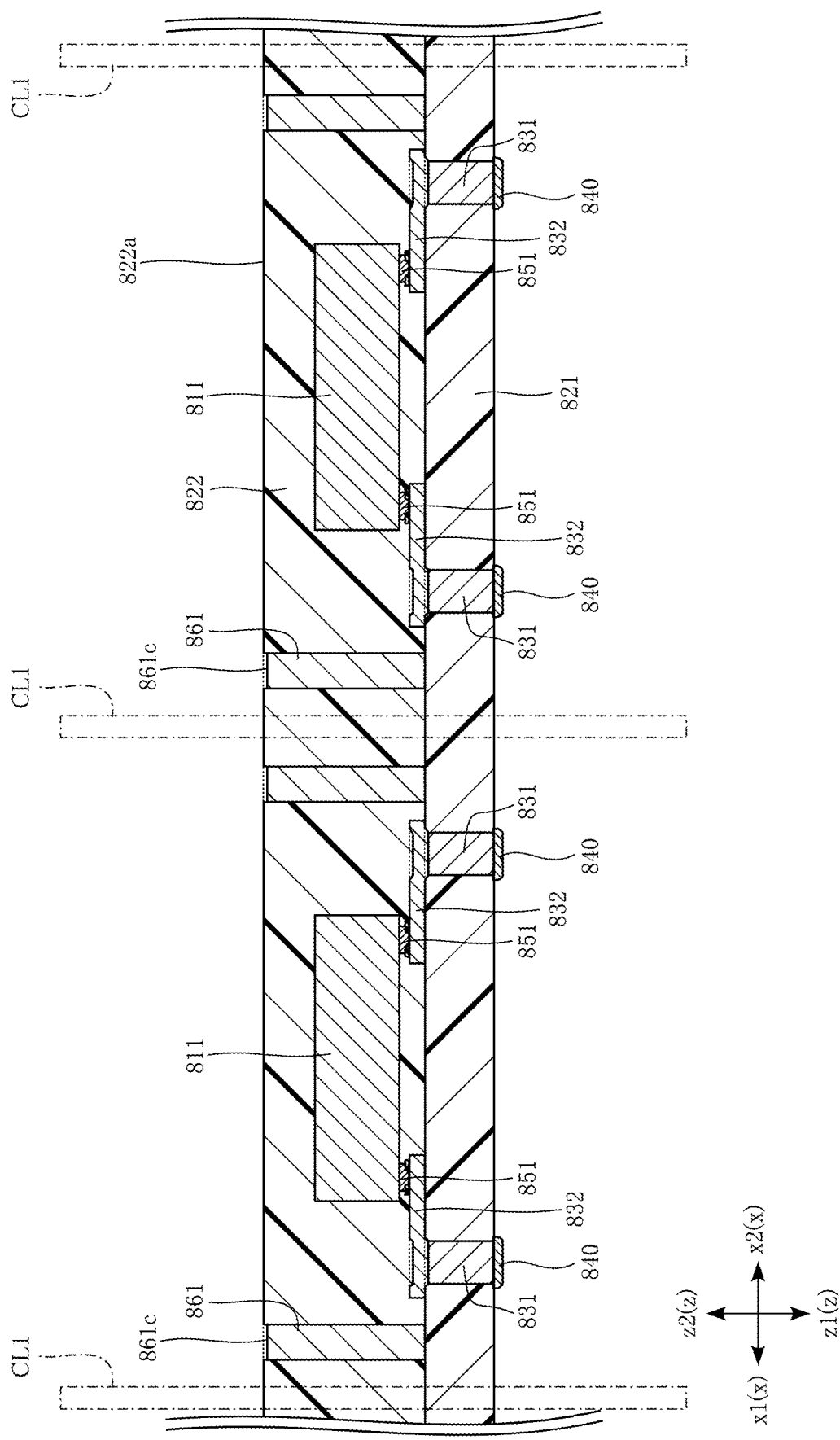
FIG. 21 is a cross-sectional view for explaining another process of the manufacturing method of the terahertz device according to the first embodiment.

Proceeding to FIG. 21, the second resin layer 822 is ground. To grind the second resin layer 822 (second resin layer grinding process), for example a grinding machine is employed, such that the second resin layer 822 is ground by a grinding stone. However, the grinding method of the second resin layer 822 is not specifically limited. In this process, the second resin layer 822 is ground toward the z1-side from the second resin layer obverse face 822a, until the frame-shaped conductor 861 is exposed. As result, the second resin layer obverse face 822a moves toward the z1-side, and the face of the frame-shaped conductor 861 oriented in the z2-direction (top face 861c) is exposed from the second resin layer 822 (second resin layer obverse face 822a). Through the grinding of the second resin layer 822 in this process, the frame-shaped conductors 861 are also slightly ground. Here, burrs may appear on the top face 861c after the grinding work, owing to the difference in material between the frame-shaped conductor 861 and the second resin layer 822. Accordingly, a chemical treatment is performed to remove the burrs. As result, the top face 861c of the frame-shaped conductor 861 is recessed from the second resin layer obverse face 822a, in the z-direction.

Thereafter, the wafer is divided into individual pieces each including one terahertz element 811. In the process of dividing into individual pieces (dicing process), the first resin layer 821 and the second resin layer 822 are cut, for example by blade dicing. Such dicing is performed along cutting lines CL1 shown in FIG. 21. In FIG. 21, the cutting lines CL1 are drawn in a rectangular shape, taking into account the thickness of the dicing blade to be used for the blade dicing. The cutting method is not limited to the blade dicing, but a different dicing method such as laser dicing or plasma dicing may be employed, depending on the material to be cut. Each of the individual pieces divided through the dicing process corresponds to the terahertz device A1 shown in FIG. 1 to FIG. 5.

Throughout the foregoing process, a plurality of terahertz devices A1 shown in FIG. 1 to FIG. 5 can be manufactured. However, the aforementioned manufacturing method of the terahertz device A1 is merely exemplary. For example, the second resin layer grinding process may be performed before the support substrate removing process and the external electrode forming process. In this case, it is preferable to attach dicing tapes on the second resin layer obverse face 822*a* of the second resin layer 822, before the external electrode forming process, to restrict the external electrode 840 from being formed on the top face 861*c* of the frame-shaped conductor 861, exposed from the second resin layer 822 owing to the non-electrolytic plating performed in the external electrode forming process. Further, in the case where a bonding material such as a solder bump is formed on the electrode pad of the terahertz element 811, it is unnecessary to form the bonding layer 851*b* of the bonding section 851.

Hereunder, advantageous effects provided by the terahertz device A1 according to the first embodiment, and the manufacturing method thereof, will be described.

The terahertz device A1 includes the first resin layer 21 and the second resin layer 22. The first resin layer 21 supports the terahertz element 11, via the plurality of wiring layers 32. The second resin layer 22 is formed on the first resin layer 21, so as to cover the terahertz element 11. In other words, the first resin layer 21 serves as the supporting member that supports the terahertz element 11, and the second resin layer 22 serves as the protecting member that covers the terahertz element 11. Accordingly, a difference in thermal expansion coefficient between the supporting member and the protecting member can be reduced. In particular, since the first resin layer 21 and the second resin layer 22 are both formed of an epoxy resin, the thermal expansion coefficient is barely different between the supporting member and the protecting member. Therefore, thermal stress generated at the interface between the supporting member (first resin layer 21) and the protecting member (second resin layer 22) can be reduced. The thermal stress originates, for example, from the heat generated by the terahertz element 11 when power is supplied to the terahertz device A1. Accordingly, the protecting member can be prevented from being separated from the supporting member, which leads to improved reliability of the terahertz device A1. Consequently, the terahertz device A1 can assume a package structure that is advantageous in modularizing the terahertz element 11.

In the terahertz device A1, the terahertz element 11 is supported by the first resin layer 21. The first resin layer 21 is formed through a molding process. In a terahertz device in which, unlike in the terahertz device A1 according to the present disclosure, the terahertz element 11 is supported, for example, by a semiconductor substrate (silicon substrate) instead of the first resin layer 21, a through electrode called a through-silicon via (TSV) has to be formed, to form a terminal on the bottom face of the terahertz device. Whereas, for example, an etching technique called Bosch process has to be employed to form the TSV, the more difficult it becomes to form the through hole, the thicker the semiconductor substrate is. In other words, it becomes difficult to form the through electrode penetrating through the supporting member (semiconductor substrate). According to this embodiment, in contrast, the first resin layer (first resin layer 821) is formed by molding, after the columnar conductor 31 (columnar conductor 831) is formed by electrolytic plating. Therefore, the through electrode (columnar conductor 31) penetrating through the supporting member (first resin layer 21) can be formed relatively easily. In other words, the manufacturing of the terahertz device A1 becomes easier, compared with the case of employing the semiconductor substrate as the supporting member. Consequently, the terahertz device A1 can assume a package structure that is advantageous in modularizing the terahertz element 11.

In the terahertz device A1, the grinding marks are formed on the first resin layer obverse face 211 of the first resin layer 21. Because of the grinding marks, minute recesses and bumps are formed on the first resin layer obverse face 211. Accordingly, the adhesion strength between the first resin layer 21 and the second resin layer 22 can be improved, owing to an anchor effect. Such a structure prevents the protecting member (second resin layer 22) from being separated from the supporting member (first resin layer 21), which leads to improved reliability of the terahertz device A1. Consequently, the terahertz device A1 can assume a package structure that is advantageous in modularizing the terahertz element 11.

In the terahertz device A1, the bonding sections 51 each include the insulation layer 511. Accordingly, when the bonding layer 851*b* (in particular, the portion corresponding to the third layer 512*c*) is molten by the heat of the reflow in the terahertz element mounting process, the bonding layer 851*b* can be prevented from spreading to unintended regions. Such a configuration suppresses occurrence of an accidental short circuit, thereby preventing malfunction of the terahertz device A1. Consequently, the terahertz device A1 can assume a package structure that is advantageous in modularizing the terahertz element 11.

In the terahertz device A1, the terahertz element 11 is covered with the encapsulating resin 20. In other words, the terahertz element 11 is not exposed to outside. In the case where the terahertz element 11 is exposed to outside, in other words to the ambient air, the terahertz device A1 may suffer malfunction. The malfunction may be caused, for example, by moisture or dust in the air, or vibration or shock. Therefore, covering the terahertz element 11 with the encapsulating resin 20 protects the terahertz element 11 from such impacts from outside, which leads to improved reliability of the terahertz device A1. Consequently, the terahertz device A1 can assume a package structure that is advantageous in modularizing the terahertz element 11.

In the terahertz device A1, the frame-shaped conductor 61 is formed so as to surround the terahertz element 11. Accordingly, the frame-shaped conductor 61 acts as an electromagnetic shield, and the terahertz device A1 can be prevented from suffering problems such as ambient noise and crosstalk. Therefore, the terahertz device A1 can present improved emission quality or reception quality of the terahertz wave. Consequently, the terahertz device A1 can assume a package structure that is advantageous in modularizing the terahertz element 11.

In the terahertz device A1, the terahertz wave emitted from the terahertz element 11 performs resonance reflection at the frame-shaped conductor 61 (inner face 611), thus to be oscillated in the z-direction. Accordingly, the terahertz device A1 can oscillate the terahertz wave with reduced noise component. In addition, the terahertz device A1 can oscillate the terahertz wave with an improved gain, because of the resonance reflection. Therefore, the terahertz device A1 can present improved emission quality or reception quality of the terahertz wave. Consequently, the terahertz device A1 can assume a package structure that is advantageous in modularizing the terahertz element 11.

In the terahertz device A1, the frame-shaped conductor 61 has a rectangular ring shape, in a plan view. Accordingly, the inner face 611 (reflecting surface) can be oriented generally parallel to the element side face 113 of the terahertz element 11. Such a configuration allows the terahertz wave from the terahertz element 11 to be vertically reflected by the inner face 611, when an antenna with a fixed polarization direction, such as a dipole antenna, a slot antenna, or a bowtie antenna is integrated in the terahertz element 11. Therefore, the terahertz device A1 can present improved emission quality or reception quality of the terahertz wave. Consequently, the terahertz device A1 can assume a package structure that is advantageous in modularizing the terahertz element 11.

In the terahertz device A1, the terahertz element 11 is flip-chip mounted on the first resin layer 21 where the plurality of wiring layers 32 are formed, via the bonding sections 51. In other words, no bonding wire is employed for the electrical conduction between the terahertz element 11 and the plurality of wiring layers 32. Such a configuration shortens the wiring route in the terahertz device A1, thereby suppressing parasitic impedance and parasitic inductance in the wiring route. Therefore, the terahertz device A1 is advantageous in driving the terahertz element 11 at a high frequency. Further, the flip-chip mounting can reduce the footprint, compared with wire bonding. Therefore, the terahertz device A1 can be manufactured in a reduced size. Consequently, the terahertz device A1 can assume a package structure that is advantageous in modularizing the terahertz element 11.

Hereunder, other embodiments of the terahertz device according to the present disclosure, and the manufacturing method thereof, will be described. The elements and arrangements same as or similar to those of the foregoing terahertz device and the manufacturing method thereof are given the same numeral, and the description of such elements will not be repeated.

Second Embodiment

FIG. 22 to FIG. 25 illustrates a terahertz device according to a second embodiment. The terahertz device B1 according to the second embodiment is different from the terahertz device A1, in including one or more electronic parts 16 different from the terahertz element 11.

Figure 22:
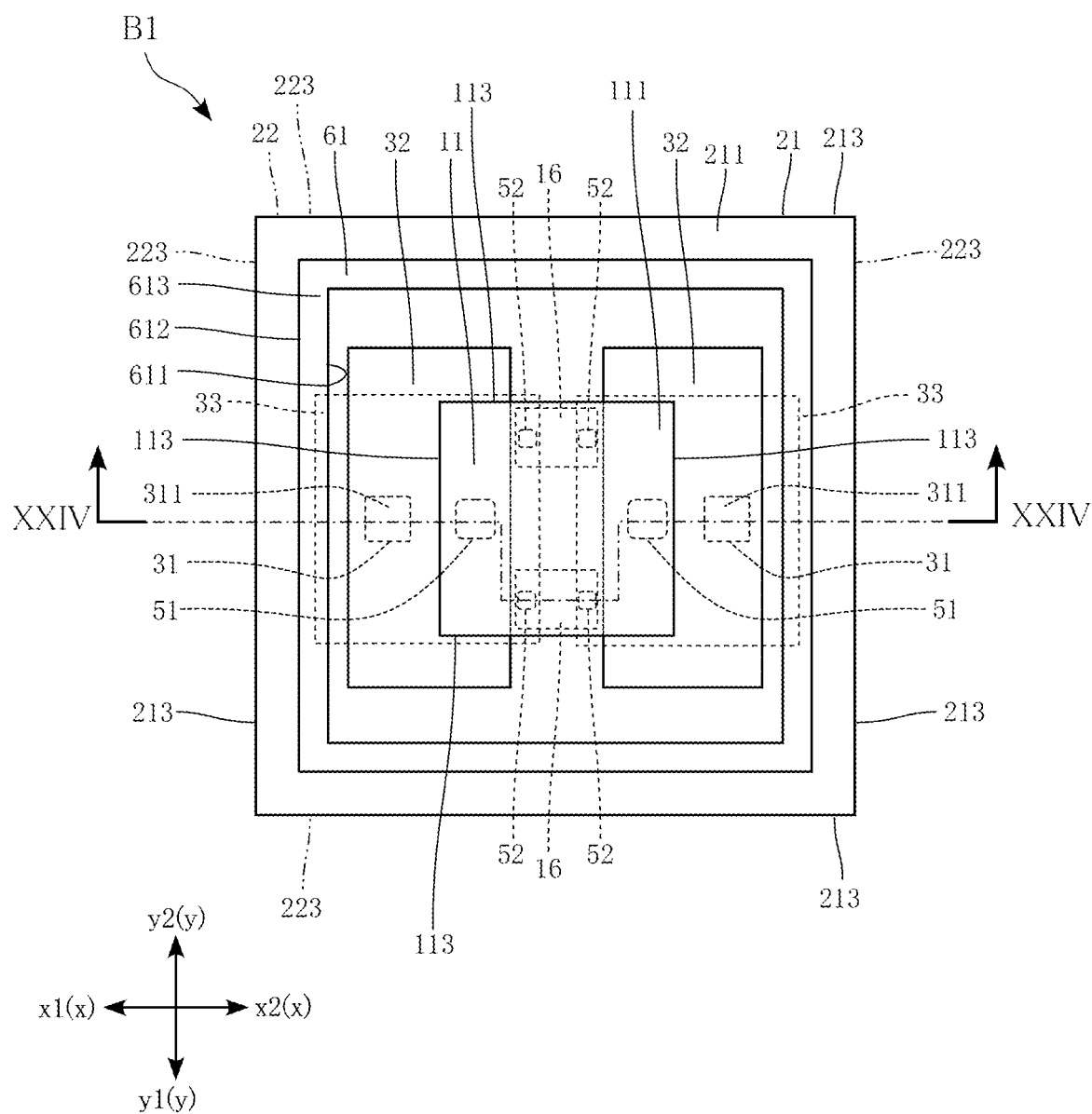
FIG. 22 is a plan view showing a terahertz device according to a second embodiment.
Figure 23:
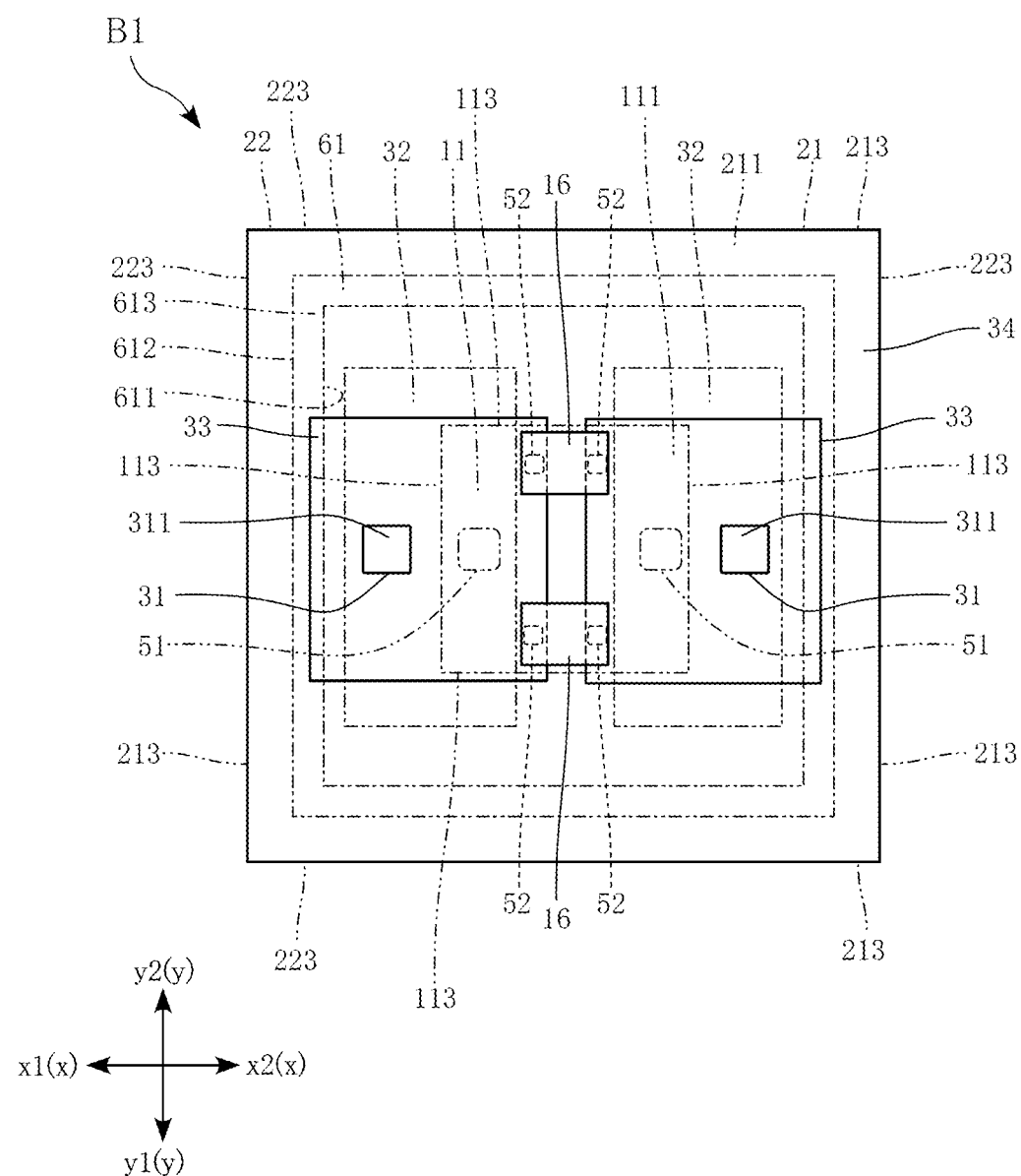
FIG. 23 is a plan view showing the terahertz device according to the second embodiment.
Figure 25:
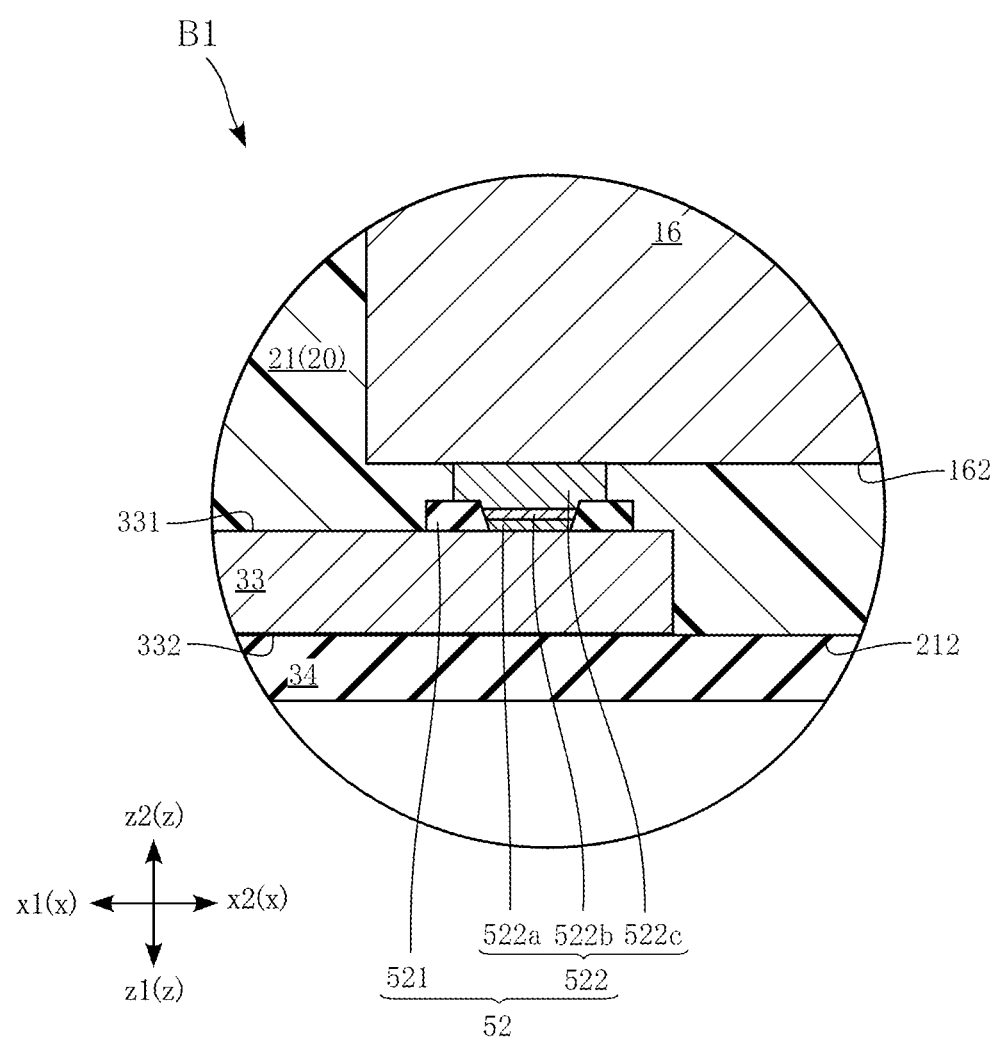
FIG. 25 is a partially enlarged cross-sectional view from FIG. 24.

FIG. 22 is a plan view showing the terahertz device B1, in which the second resin layer 22 is indicated by imaginary lines (dash-dot-dot lines). FIG. 23 is a plan view showing the terahertz device B1, in which the terahertz element 11, the encapsulating resin 20 (first resin layer 21 and second resin layer 22), the wiring layers 32, the bonding sections 51, and the frame-shaped conductor 61 are indicated by imaginary lines (dash-dot-dot lines). FIG. 24 is a cross-sectional view taken along a line XXIV-XXIV in FIG. 22. FIG. 25 is a partially enlarged cross-sectional view from FIG. 24.

As shown in FIG. 22 to FIG. 25, the terahertz device B1 includes the terahertz element 11, the one or more electronic parts 16, the encapsulating resin 20 (first resin layer 21 and second resin layer 22), the plurality of columnar conductors 31, a plurality of wiring layers 32 and 33, an outer protective film 34, the plurality of external electrodes 40, a plurality of bonding sections 51 and 52, and the frame-shaped conductor 61. The terahertz device B1 further includes, in addition to the components of the terahertz device A1, the one or more electronic parts 16, the plurality of wiring layer 33, the outer protective film 34, and the plurality of bonding sections 52, as shown in FIG. 22 to FIG. 25.

The one or more electronic parts 16 each serve as the functional center of the terahertz device B1, in collaboration with the terahertz element 11. The electronic parts 16 may be an active element, or a passive element. Examples of the active element include an integrated circuit (IC) such as an LSI, a voltage control element such as an LDO, amplifying element such as an operational amplifier, and discrete components such as a transistor or a diode. Examples of the passive element include a resistor, an inductor, and a capacitor. The electronic parts may be a semiconductor element including a semiconductor material, or an element without a semiconductor material. Although the terahertz device B1 includes two electronic parts 16 as shown in FIG. 23, the number of electronic parts 16 is not limited thereto.

The electronic parts 16 each have, for example, a rectangular shape in a plan view. The electronic parts 16 are, as shown in FIG. 24, located on the z1-side in the z-direction, with respect to the terahertz element 11. As shown in FIG. 22 and FIG. 23, the electronic parts 16 are smaller than the terahertz element 11, and entirely overlap therewith, in a plan view. The electronic parts 16 may be larger than the terahertz element 11 in a plan view. The electronic parts 16 may each entirely overlap or partially overlap with the terahertz element 11 in a plan view, or be located so as not to overlap with the terahertz element 11. The electronic parts 16 are each conductively bonded to the plurality of wiring layers 33, via the plurality of bonding sections 52. The electronic parts 16 are surface-mounted. The electronic parts 16 are both covered with the first resin layer 21.

As shown in FIG. 24, the electronic parts 16 each include an element obverse face 161 and an element reverse face 162. The element obverse face 161 and the element reverse face 162 are spaced apart from each other and oriented to opposite sides, in the z-direction. The element obverse face 161 is oriented to the z2-side, and the element reverse face 162 is oriented to the z1-side. The element obverse face 161 is covered with the first resin layer 21. On the element reverse face 162, a plurality of electrode pads (not shown) are formed. The plurality of electrode pads are, for example, each formed of aluminum (Al). The plurality of electrode pads each serve as terminals of the corresponding one of the electronic parts 16. The number, material, and position of the electrode pads are not limited to the example shown in FIG. 18 and FIG. 19.

In the terahertz device B1, the plurality of columnar conductors 31 are formed on the respective wiring layers 33. The columnar conductor reverse face 312 of the columnar conductor 31 is in contact with the corresponding wiring layer 33. The columnar conductors 31 are, for example, formed of Cu. The columnar conductors 31 may each include an underlying layer and a plated layer, stacked on each other. The underlying layer includes a Ti layer and a Cu layer. The Ti layer is formed on the wiring layer 33, and the Cu layer is formed on the Ti layer. The plated layer contains Cu, and is formed on the Cu layer of the underlying layer.

The plurality of wiring layers 33 each provide electrical conduction between the electronic parts 16 and the corresponding columnar conductor 31. The material of the wiring layers 33 includes an underlying layer and a plated layer stacked on each other. The underlying layer includes a Ti layer and a Cu layer stacked on each other, and has a thickness of approximately 200 to 800 nm. The plated layer contains Cu for example, and is thicker than the underlying layer. The material of the wiring layers 33 is not limited to the above. The footprint of the wiring layers 33 is not limited to the example shown in FIG. 23 and FIG. 24.

The wiring layers 33 each include a wiring layer obverse face 331 and a wiring layer reverse face 332. The wiring layer obverse face 331 and the wiring layer reverse face 332 are spaced apart from each other and oriented to opposite sides, in the z-direction. The wiring layer obverse face 331 is oriented to the z2-side, and the wiring layer reverse face 332 is oriented to the z1-side. The wiring layer obverse face 331 is covered with the first resin layer 21. On the wiring layer obverse face 331 of each of the wiring layers 33, one each of the columnar conductor 31 and the bonding section 52 are formed. A part of the wiring layer obverse face 331 is in contact with the columnar conductor reverse face 312. The wiring layer reverse face 332 is exposed from the first resin layer 21 (first resin layer reverse face 212). The wiring layer reverse face 332 is flush with the first resin layer reverse face 212. A part of the wiring layer reverse face 332 is in contact with the external electrode 40.

In the terahertz device B1, the plurality of external electrodes 40 are each without the columnar conductor shield 41, but instead include a wiring layer shield 42.

The plurality of wiring layer shields 42 each cover a part of the corresponding wiring layer reverse face 332. The wiring layer shields 42 are each in contact with the corresponding wiring layer reverse face 332. The terahertz element 11 is electrically connected to each of the wiring layer shields 42 via the bonding section 51, the wiring layer 32, the columnar conductor 31, and the wiring layer 33. The electronic parts 16 are each electrically connected to the wiring layer shields 42, via the corresponding bonding section 52 and wiring layer 33. The wiring layer shields 42 serve as the terminals of the terahertz device B1, and are electrically connected to both of the terahertz element 11 and the electronic parts 16.

The plurality of bonding sections 52 are each interposed between the corresponding one of the electronic parts 16 (more accurately, the electrode pad) and the wiring layer 33. The bonding sections 52 are formed of a conductive bonding material. By the plurality of bonding sections 52, the electronic parts 16 are fixed to the plurality of wiring layers 33, such that the electrical conduction is secured between the electronic parts 16 and the plurality of wiring layers 33, via the plurality of bonding sections 52. The bonding sections 52 each include, as shown in FIG. 25, an insulation layer 521 and a bonding layer 522.

As shown in FIG. 25, the insulation layer 521 is formed on the wiring layer 33. The insulation layer 521 is configured similarly to the insulation layer 511. The insulation layer 521 has a frame shape with an opening at the central portion, in a plan view. The insulation layer 521 has, for example, a rectangular ring shape in a plan view. However, the plan-view shape of the insulation layer 521 is not limited to the rectangular ring shape, but may be a circular ring shape, an elliptical ring shape, or a polygonal ring shape. The insulation layer 521 surrounds the bonding layer 522, in a plan view. The insulation layer 521 may be, for example, formed of a polyimide resin, without limitation thereto.

The bonding layer 522 serves to conductively bond the corresponding one of the electronic parts 16 to the wiring layer 33. The bonding layer 522 is formed on the wiring layer 33 (wiring layer obverse face 331). The bonding layer 522 is configured similarly to the bonding layer 512. More specifically, the bonding layer 522 covers the surface of the opening of the insulation layer 521. A part of the bonding layer 522 is filled in the opening of the insulation layer 521. The bonding layers 522 each include, as shown in FIG. 25, a first layer 522a, a second layer 522b, and a third layer 522c stacked on each other. The first layer 522a, the second layer 522b, and the third layer 522c are each configured similarly to the first layer 512a, the second layer 512b, and the third layer 512c of the bonding layer 512 of the bonding section 51, respectively.

The outer protective film 34 is an insulative resin film. The outer protective film 34 is, for example, formed of a polymer resin. Examples of the polymer resin include a polyimide resin and a phenol resin. The material of the outer protective film 34 is not limited to the above, provided that the material is insulative. The outer protective film 34 at least covers the wiring layer reverse face 332 exposed from the wiring layer shield 42 of the external electrode 40. The outer protective film 34 covers the wiring layer reverse face 332 exposed from the wiring layer shield 42, and the entirety of the first resin layer reverse face 212.

Referring now to FIG. 26 to FIG. 33, an exemplary manufacturing method of the terahertz device B1 according to the second embodiment will be described hereunder. FIG. 26 to FIG. 33 are cross-sectional views each showing a process in the manufacturing method of the terahertz device B1. Regarding the process according to the second embodiment same as or similar to that of the first embodiment, the foregoing process will be referred to, and the description of such process will not be repeated.

First, the support substrate 800 is prepared, in the similar way to the support substrate preparing process according to the first embodiment.

Then the wiring layers 833, the bonding sections 852, and the columnar conductors 831 are formed, as shown in FIG. 26 to FIG. 30. The wiring layer 833, the bonding section 852, and the columnar conductor 831 respectively correspond to the wiring layer 32, the bonding section 52, and the columnar conductor 31 of the terahertz device B1. The process of forming these components includes the following five steps.

Figure 26:
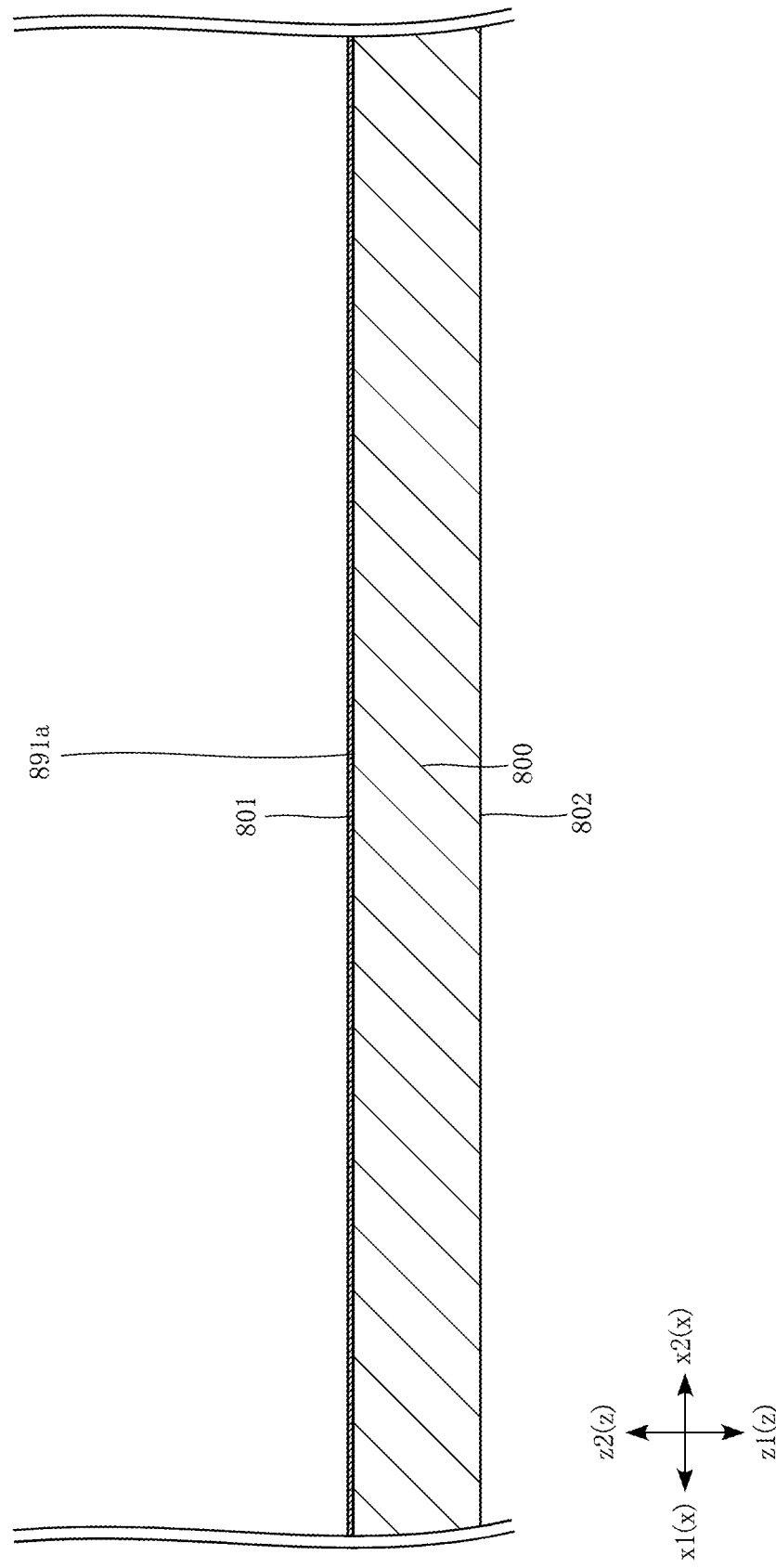
FIG. 26 is a cross-sectional view for explaining a process of the manufacturing method of the terahertz device according to the second embodiment.

At a first step, an underlying layer 891a is formed, as shown in FIG. 26. The underlying layer 891a may be formed, for example, through a sputtering process. In the process of forming the underlying layer 891a, a Ti layer is formed so as to cover the entirety of the support substrate obverse face 801, and then a Cu layer is formed in contact with the Ti layer. Thus, the underlying layer 891a is composed of the Ti layer and the Cu layer stacked on each other.

Figure 27:
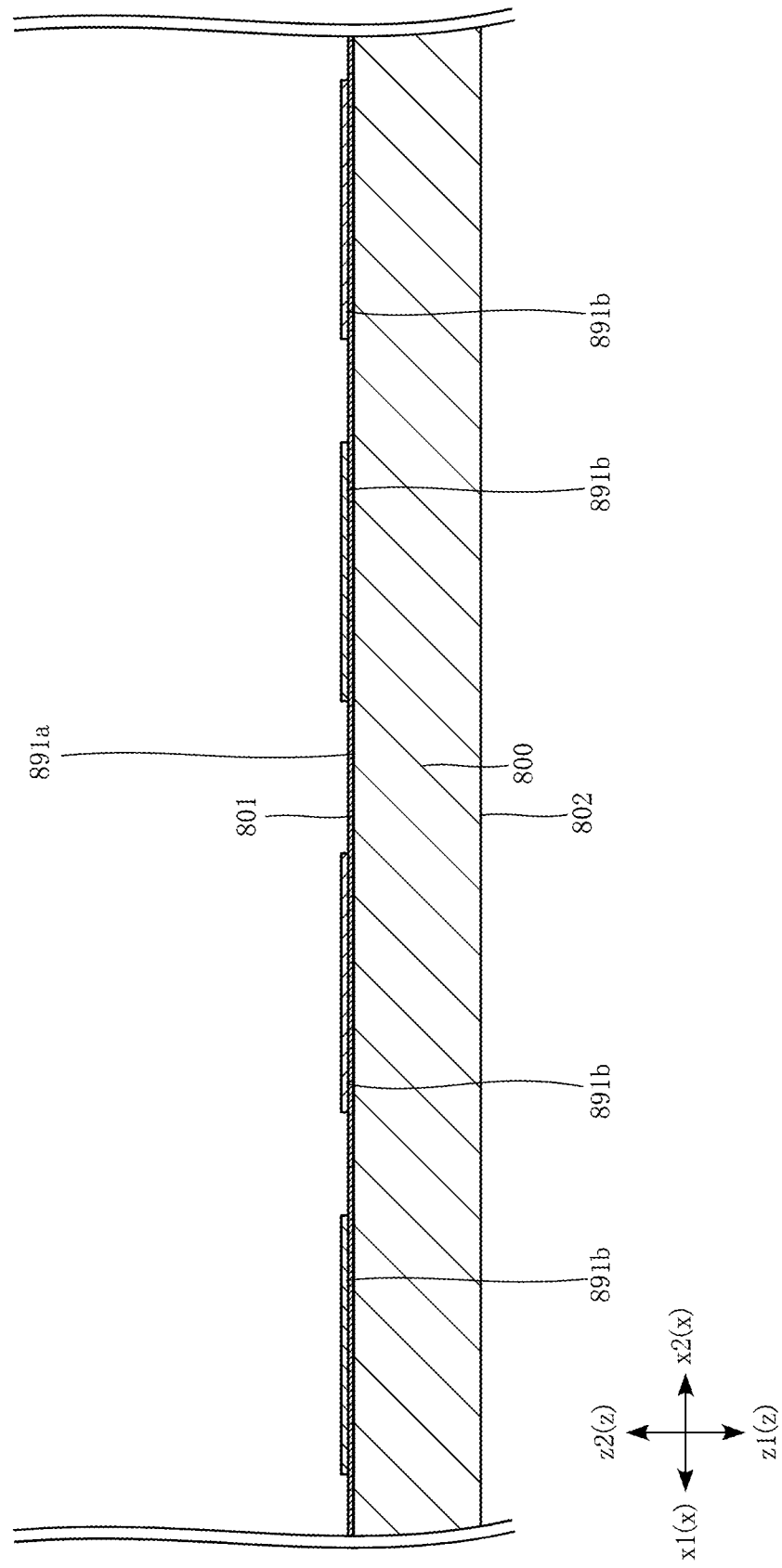
FIG. 27 is a cross-sectional view for explaining another process of the manufacturing method of the terahertz device according to the second embodiment.

At a second step, plated layers 891b are formed as shown in FIG. 27. The plated layers 891b may be formed, for example, through formation of a resist pattern by photolithography, and an electrolytic plating process. In the process of forming the plated layers 891b, a photosensitive resist is applied so as to cover the entirety of the underlying layer 891a, and a resist layer is patterned by exposure and developing of the photosensitive resist. As result, a resist pattern is formed, such that a part of the underlying layer 891a (where the plated layers 891b are to be formed) is exposed from the resist pattern. Then the plated layers 891b are precipitated on the underlying layer 891a exposed from the resist pattern, through an electrolytic plating process using the underlying layer 891a as the conduction path. In this process, for example a metal layer containing Cu is precipitated, to form the plated layers 891b. At this point, the plated layers 891b are integrally formed with the underlying layer 891a. Thereafter, the resist layer formed as above is entirely removed. Thus, the plated layers 891b shown in FIG. 27 are formed. The plated layers 891b, and the portions of the underlying layer 891a respectively covered with the plated layer 891b subsequently constitute the wiring layers 833. The wiring layer 833 corresponds to the wiring layer 33 of the terahertz device B1.

Figure 28:
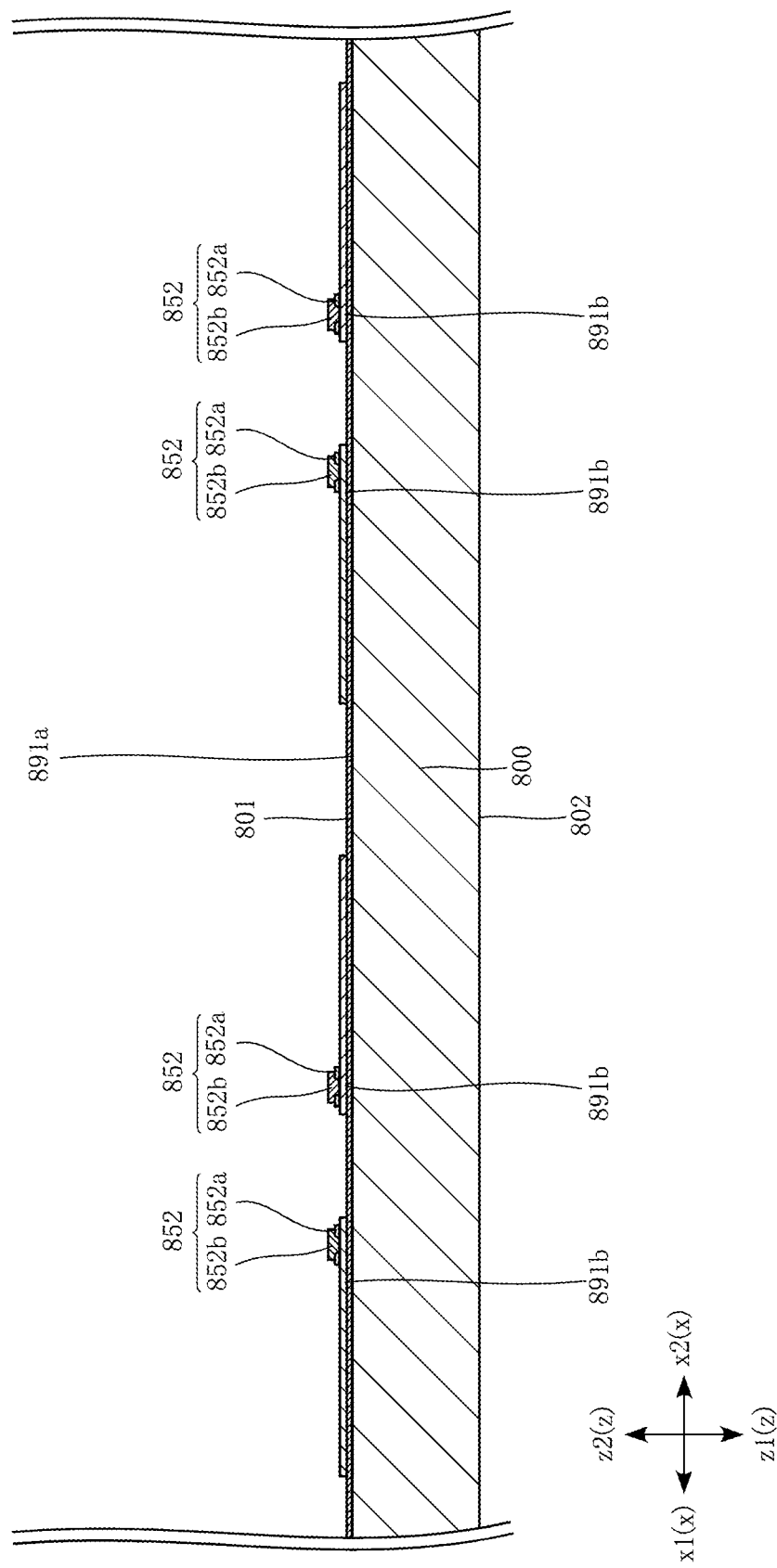
FIG. 28 is a cross-sectional view for explaining another process of the manufacturing method of the terahertz device according to the second embodiment.

At a third step, the bonding sections 852 are formed as shown in FIG. 28. In this process, insulation layers 852a and bonding layers 852b are formed, to constitute the bonding sections 852. To form the insulation layers 852a, photosensitive polyimide is applied so as to cover the entirety of the plated layers 891b, and the entirety of the underlying layer 891a exposed from the plated layers 891b. The photosensitive polyimide is applied, for example, with a spin coater. Then the frame-shaped insulation layers 852a are formed, through exposure and developing of the photosensitive polyimide applied. To form the bonding layers 852b, first a resist pattern to be used to form the bonding layer 852b is formed. To form the resist pattern, photosensitive resist is applied, and a resist layer is patterned by exposure and developing of the photosensitive resist. As result, the resist pattern is formed, such that a part of the plated layer 891b (where the bonding layers 852b are to be formed) is exposed from the resist pattern. The exposed portion is located inside of the frame-shaped insulation layer 852a, in a plan view. Then the bonding layers 852b are precipitated on the respective plated layers 891b exposed from the resist pattern, through an electrolytic plating process using the underlying layer 891a and the plated layer 891b as the conduction path. At this step, a metal layer containing Cu, a metal layer containing Ni, and an alloy layer containing Sn are sequentially stacked, to constitute the bonding layer 852b. The alloy layer containing Sn may be, for example, lead-free solder such as a Sn—Sb-based alloy or a Sn—Ag-based alloy. Thereafter, the resist pattern formed as above is removed. Thus, the bonding sections 852 each including the insulation layer 852a and the bonding layer 852b are formed, as shown in FIG. 28. The bonding section 852 corresponds to the bonding section 52 of the terahertz device B1.

Figure 29:
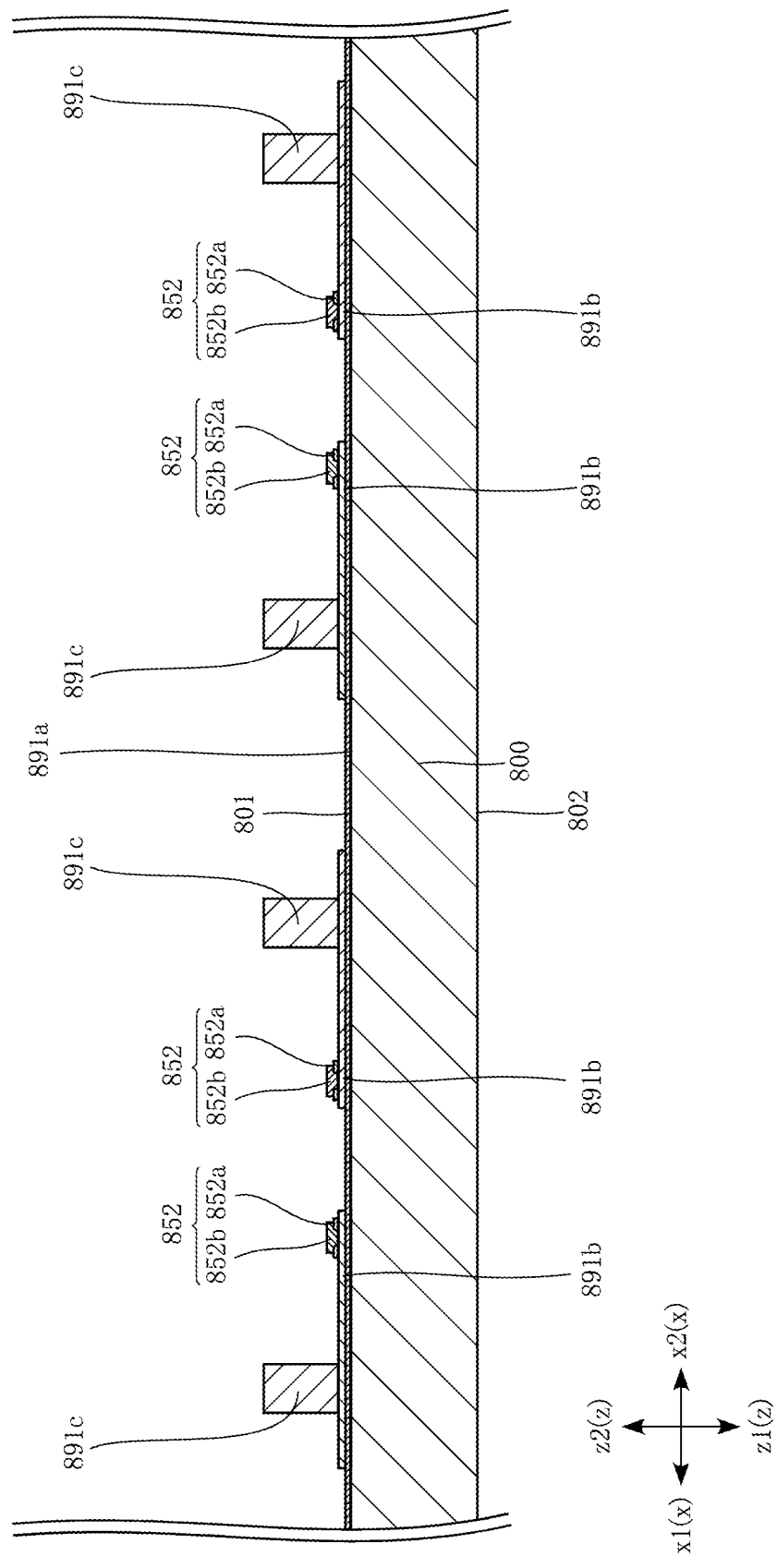
FIG. 29 is a cross-sectional view for explaining another process of the manufacturing method of the terahertz device according to the second embodiment.

At a fourth step, plated layers 891c are formed as shown in FIG. 29. The plated layers 891c may be formed, for example, through formation of a resist pattern by photolithography, and an electrolytic plating process. The plated layers 891c are formed in a similar way to the formation of the plated layers 891b. More specifically, to form the plated layers 891c, a resist pattern to be used to form the plated layers 891c is formed. As result, a part of the underlying layer 891a (where the plated layers 891c are to be formed) is exposed from the resist pattern that has been formed. Then the plated layers 891c are precipitated on the plated layer 891b exposed from the resist pattern, through an electrolytic plating process using the underlying layer 891a and the plated layer 891b as the conduction path. In this process, for example a metal layer containing Cu is precipitated, to form the plated layers 891c. The plated layers 891c are integrally formed with the underlying layer 891a. Thereafter, the resist pattern formed as above is removed. Thus, the plated layers 891c shown in FIG. 29 are formed. The plated layers 891c subsequently constitute the columnar conductor 831.

Figure 30:
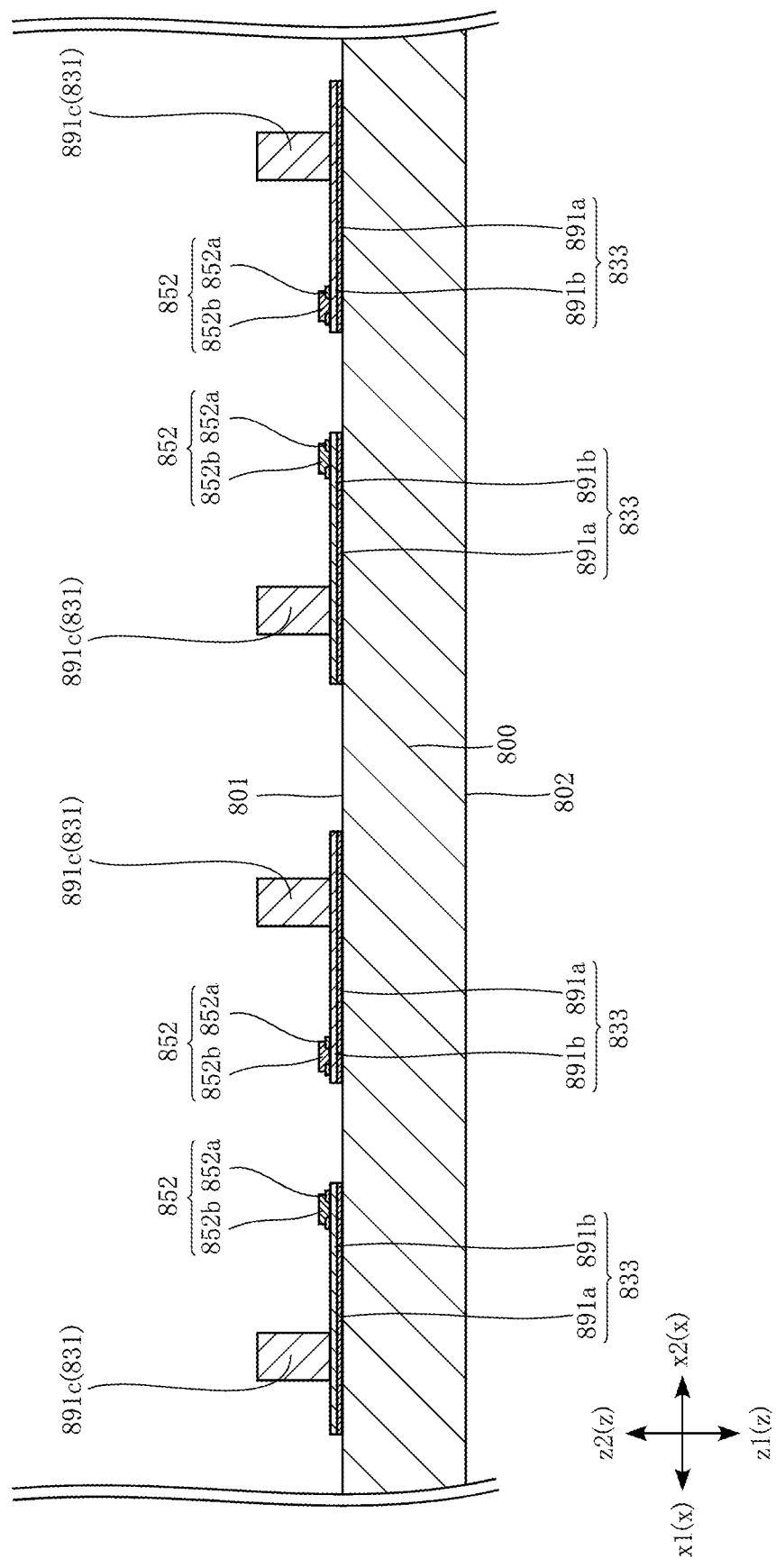
FIG. 30 is a cross-sectional view for explaining another process of the manufacturing method of the terahertz device according to the second embodiment.
Figure 31:
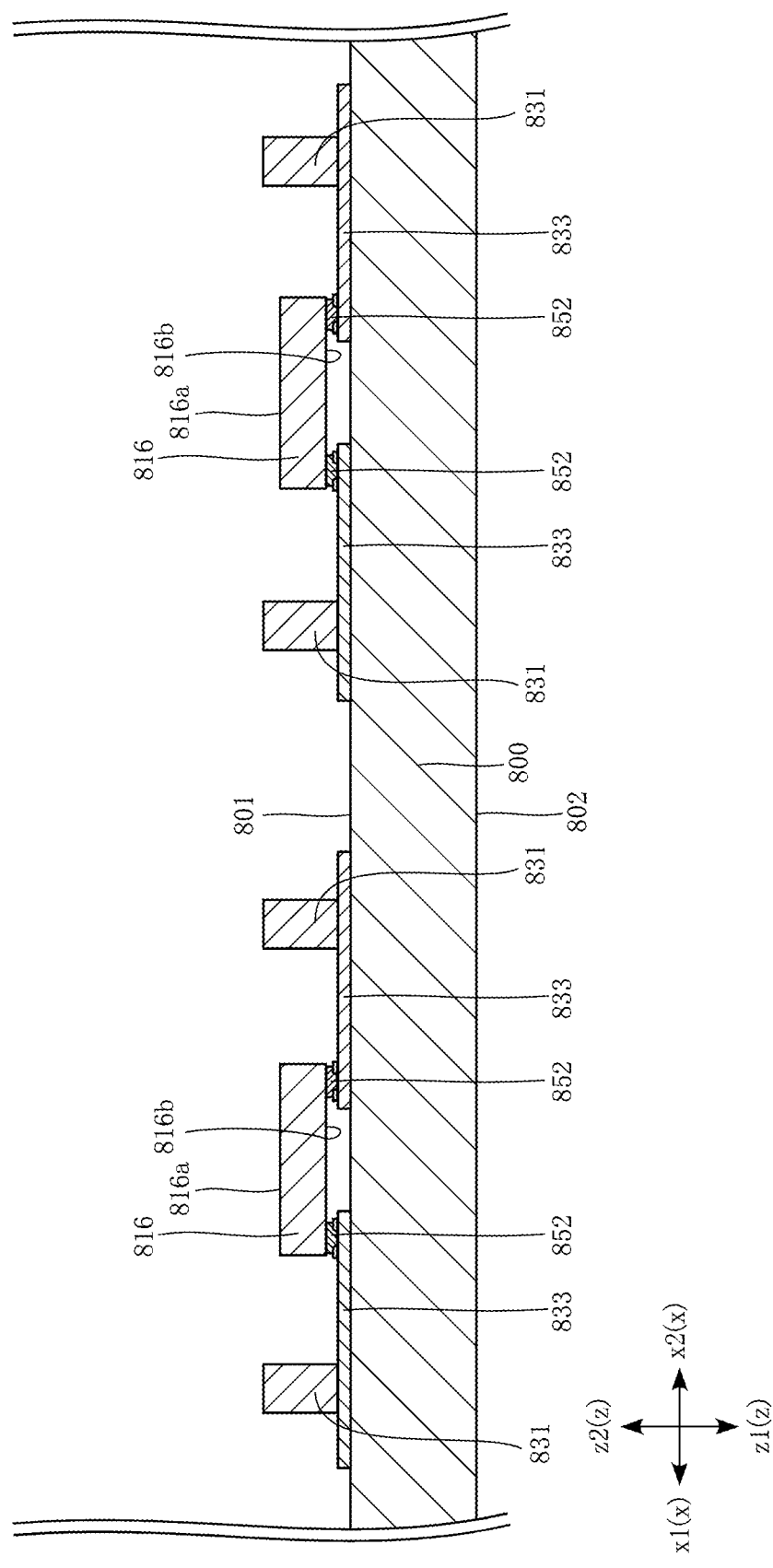
FIG. 31 is a cross-sectional view for explaining another process of the manufacturing method of the terahertz device according to the second embodiment.
Figure 32:
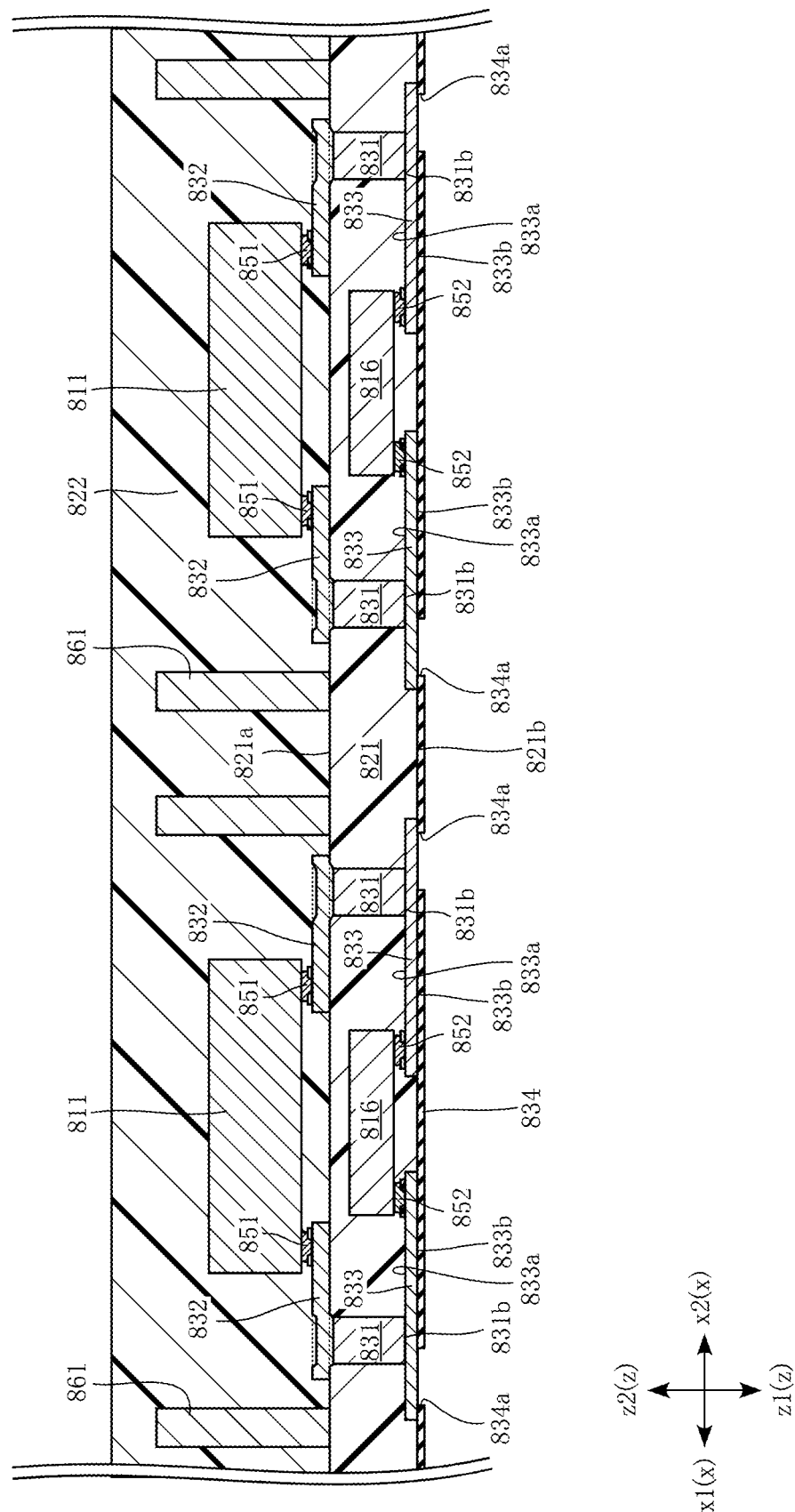
FIG. 32 is a cross-sectional view for explaining another process of the manufacturing method of the terahertz device according to the second embodiment.
Figure 33:
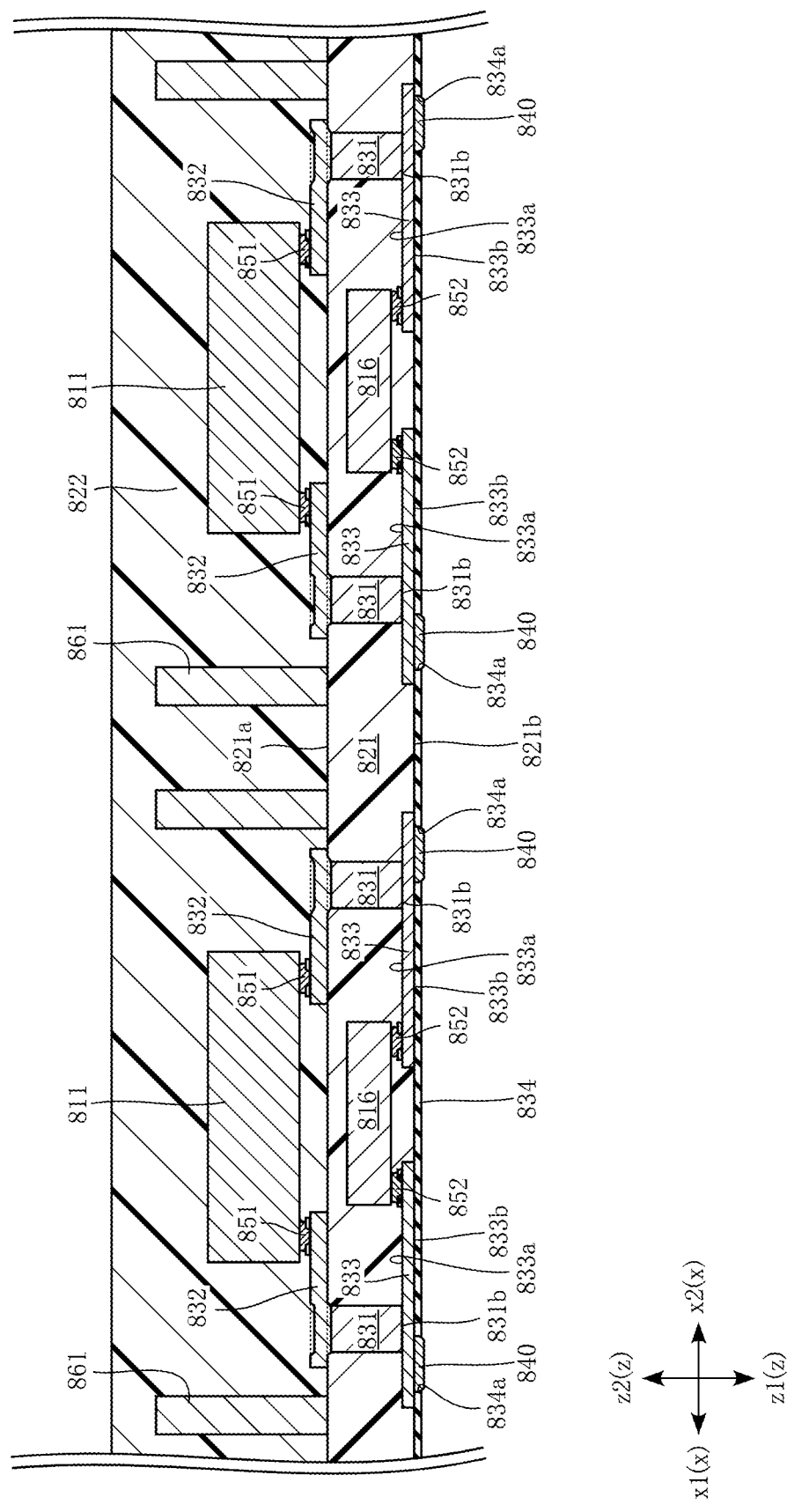
FIG. 33 is a cross-sectional view for explaining another process of the manufacturing method of the terahertz device according to the second embodiment.

At a fifth step, unnecessary portions of the underlying layer 891a are removed, as shown in FIG. 30. At this step, the portions of the underlying layer 891a uncovered with the plated layer 891b are removed, as unnecessary portions of the underlying layer 891a. The unnecessary portions of the underlying layer 891a are removed by wet etching, like the case of removing the unnecessary portions of the underlying layer 890a. Through the step of removing the unnecessary portions of the underlying layer 891a, the wiring layers 833 each including the plated layer 891b and the underlying layer 891a covered therewith are formed, as shown in FIG. 30. In FIG. 31 to FIG. 33, the plated layer 891b and the underlying layer 891a covered therewith are unified into the wiring layer 833, and the plated layer 891c is shown as the columnar conductor 831.

Through the mentioned five steps, the wiring layers 833, the bonding sections 852, and the columnar conductors 831 are obtained, as shown in FIG. 30. The combination of the step of forming the underlying layer 891a, the step of forming the plated layers 891b, and the step of removing the unnecessary portions of the underlying layer 891a, corresponds to the "second wiring layer forming process" in the present disclosure. The combination of the step of forming the underlying layer 891a, the step of forming the plated layer 891c, and the step of removing the unnecessary portions of the underlying layer 891a, corresponds to the "first conductor forming process" in the present disclosure.

Proceeding to FIG. 31, the plurality of electronic parts 816 are mounted. The electronic parts 816 respectively correspond to the electronic parts 16 of the terahertz device B1. The electronic parts 816 each include an element obverse face 816a oriented to the z2-side, and an element reverse face 816b oriented to the z1-side. On the element reverse face 816b, non-illustrated electrode pads are provided. The process of mounting the electronic parts 816 (electronic parts mounting process) is performed by a flip-chip bonding method. More specifically, flux is applied to the electronic parts 816, and then the electronic parts 816 are tentatively placed on the bonding sections 852, for example with a flip-chip bonder. At this point, the bonding sections 852 are each interposed between the wiring layer 833 and the non-illustrated electrode pad formed on the element reverse face 816b of the electronic parts 816. Thereafter, the bonding layer 852b of the bonding section 852 is molten by a reflow process, and joined to the electrode pad. Then the bonding layer 852b of the bonding section 852 is cured by cooling. As result, the electronic parts 816 are mounted on the wiring layers 833, and the electrode pad of the electronic parts 816 becomes electrically connected to the wiring layer 833, via the bonding section 852.

Then the first resin layer forming process, the first resin layer grinding process, the process of forming the wiring layers 832, the process of forming the bonding sections 851, the process of forming the frame-shaped conductor 861, the terahertz element mounting process, the second resin layer forming process, and the support substrate removing process are performed, similarly to the manufacturing method of the terahertz device A1 (see FIG. 10 to FIG. 19). In the manufacturing method of the terahertz device B1, the columnar conductor forming process is skipped.

Proceeding to FIG. 32, an outer protective film 834 is formed. To form the outer protective film 834 (outer protective film forming process), a polymer resin is formed over the wiring layer reverse face 833b and the first resin layer reverse face 821b, except for a part of the wiring layer reverse face 833b (where external electrodes 840 are to be subsequently formed). In this process, a polyimide resin or a phenol resin is employed, as the polymer resin. The outer protective film 834 formed as above includes openings 834a, from each of which a part of the wiring layer reverse face 833b is exposed.

Proceeding to FIG. 33, the external electrodes 840 are formed. The external electrode forming process according to this embodiment is, like the external electrode forming process according to the first embodiment, performed through a non-electrolytic plating process. As a result, a Ni layer, a Pd layer, and a Au layer are sequentially stacked, on the part of the wiring layer reverse face 833b exposed from the opening 834a of the outer protective film 834. The external electrodes 840 each include the Ni layer, the Pd layer, and the Au layer stacked on each other.

Then the dicing process is performed after going through the second resin layer grinding process, as in the first embodiment. As a result, the terahertz device B1 shown in FIG. 22 to FIG. 25 can be obtained. However, the aforementioned manufacturing method of the terahertz device B1 is merely exemplary. For example, in the case where a bonding material such as a solder bump is formed on the electrode pad of the electronic parts 816, it is unnecessary to form the bonding layer 852b of the bonding section 852.

Hereunder, advantageous effects provided by the terahertz device B1 according to the second embodiment, and the manufacturing method thereof, will be described.

The terahertz device B1 includes, like the terahertz device A1, the first resin layer 21 and the second resin layer 22. The first resin layer 21 supports the terahertz element 11, via the plurality of wiring layers 32. The second resin layer 22 is formed on the first resin layer 21, so as to cover the terahertz element 11. Accordingly, a difference in thermal expansion coefficient between the supporting member (first resin layer 21) and the protecting member (second resin layer 22) can be reduced, as in the first embodiment. Therefore, thermal stress generated at the interface between the supporting member and the protecting member can be reduced, and the protecting member can be prevented from being separated from the supporting member. Such a configuration contributes to improving the reliability of the terahertz device B1. Consequently, the terahertz device B1 can assume a package structure that is advantageous in modularizing the terahertz element 11.

The terahertz device B1 provides various other advantageous effects similar to those provided by the terahertz device A1, because of the configuration common to the terahertz devices A1 and B1.

Figure 34:
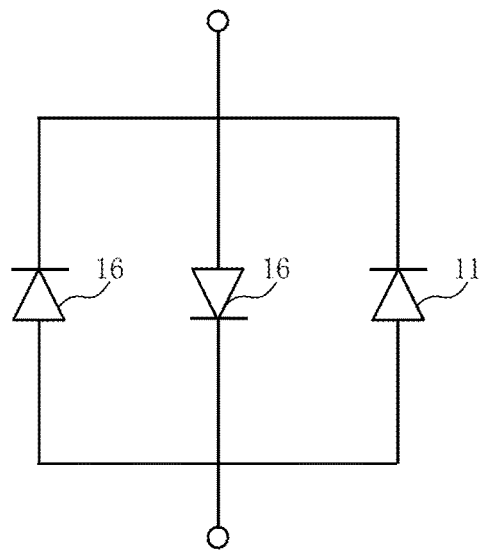
FIG. 34 is a circuit diagram showing an exemplary circuit configuration of the terahertz device according to the second embodiment.

The terahertz device B1 includes the terahertz element 11 and one or more electronic parts 16 that are different from the terahertz element 11. These are covered with the encapsulating resin 20. Accordingly, the terahertz device B1 can be formed as a multichip package with the addition of the function of the electronic parts 16. For example, when the two electronic parts 16 in the terahertz device B1 each include a Zener diode or a transient voltage suppressor (TVS) diode, a circuit configuration shown in FIG. 34 can be realized. Therefore, a surge protection function for the terahertz element 11 can be added, with the two electronic parts 16. Further, the terahertz element 11 and the one or more electronic parts 16 are mounted in a single package, and therefore the footprint on a circuit board can be reduced, compared with the case where these components are mounted in separate packages.

The terahertz device B1 includes the terahertz element 11 and the electronic parts 16. The terahertz element 11 is covered with the second resin layer 22, and the electronic parts 16 are covered with the first resin layer 21. The first resin layer 21 and the second resin layer 22 are stacked in the z-direction. In other words, the terahertz element 11 and the electronic parts 16 are mounted in a multilevel structure, in the z-direction. Stacking thus the terahertz element 11 and the electronic parts 16 in the z-direction leads to reduction in plan-view size of the terahertz device B1. Further, the terahertz element 11 and the electronic parts 16 are mounted in multilevel by the first resin layer 21 and the second resin layer 22, without employing a semiconductor substrate. Such a configuration eliminates the need to process the semiconductor substrate, thereby facilitating the multilevel mounting to be realized.

Hereunder, variations of the terahertz device B1 according to the second embodiment will be described. The following variations also provide the advantageous effects similar to those provided by the terahertz device B1.

Figure 35:
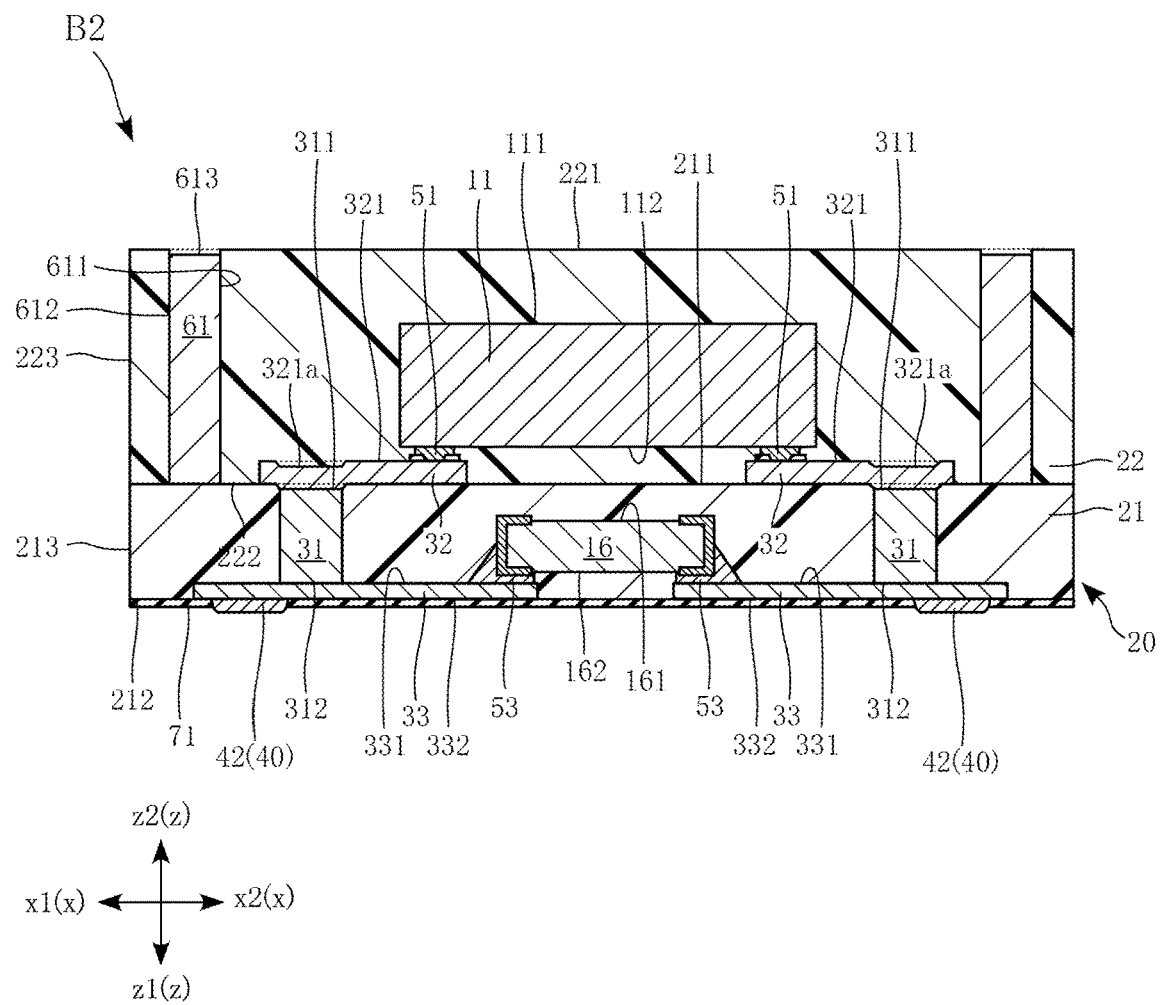
FIG. 35 is a cross-sectional view showing a terahertz device according to a variation of the second embodiment.

In the second embodiment, the configuration of the electronic parts 16 is not limited to the above. FIG. 35 illustrates a terahertz device B2, in which the configuration of the electronic parts 16 is different from that of the terahertz device B1. FIG. 35 is a cross-sectional view of the terahertz device B2, corresponding to the cross-section shown in FIG. 24. The electronic parts 16 according to this variation includes, as shown in FIG. 35, electrodes formed at the respective ends in the x-direction. Examples of the electronic parts 16 having such a configuration include a chip capacitor and a chip resistor. In FIG. 35, the electronic parts 16 are bonded to the wiring layers 33, via a bonding section 53. The bonding section 53 is formed of a conductive bonding material such as solder paste or silver paste. Fillets are formed on the bonding section 53.

Although the terahertz device B1 according to the second embodiment includes two electronic parts 16, the number and type of the electronic parts 16 are not limited to the above. For example, the terahertz device B1 may include a driver IC that controls the operation of the terahertz element 11, as one or more electronic parts 16.

Although the two electronic parts 16 according to the second embodiment are covered with the first resin layer 21, and located on the z1-side with respect to the terahertz element 11, the present disclosure is not limited to the above. For example, the terahertz element 11 and the electronic parts 16 may each be covered with the second resin layer 22, as shown in FIG. 36 to FIG. 39.

Figure 36:
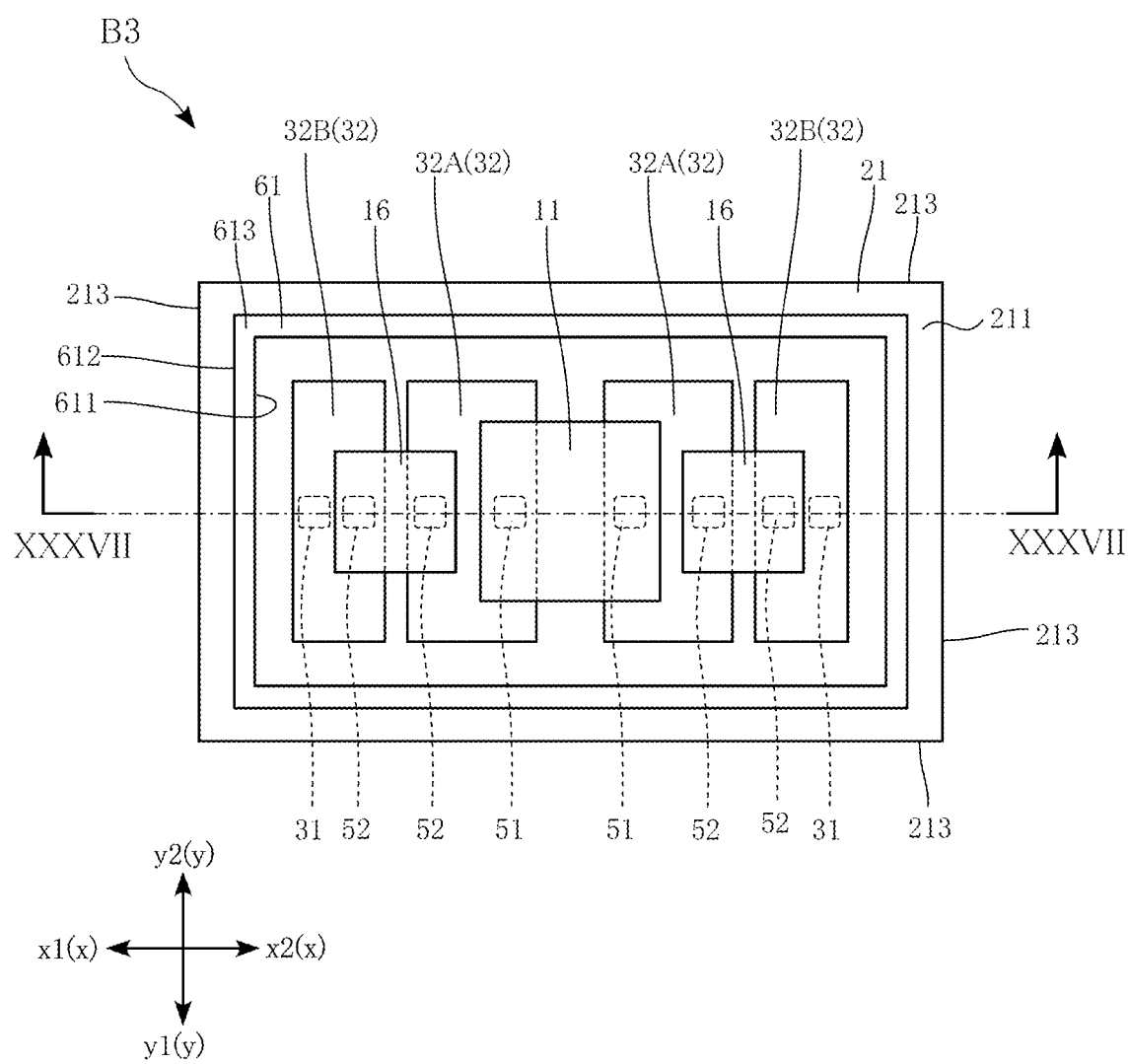
FIG. 36 is a plan view showing the terahertz device according to the variation of the second embodiment.
Figure 37:
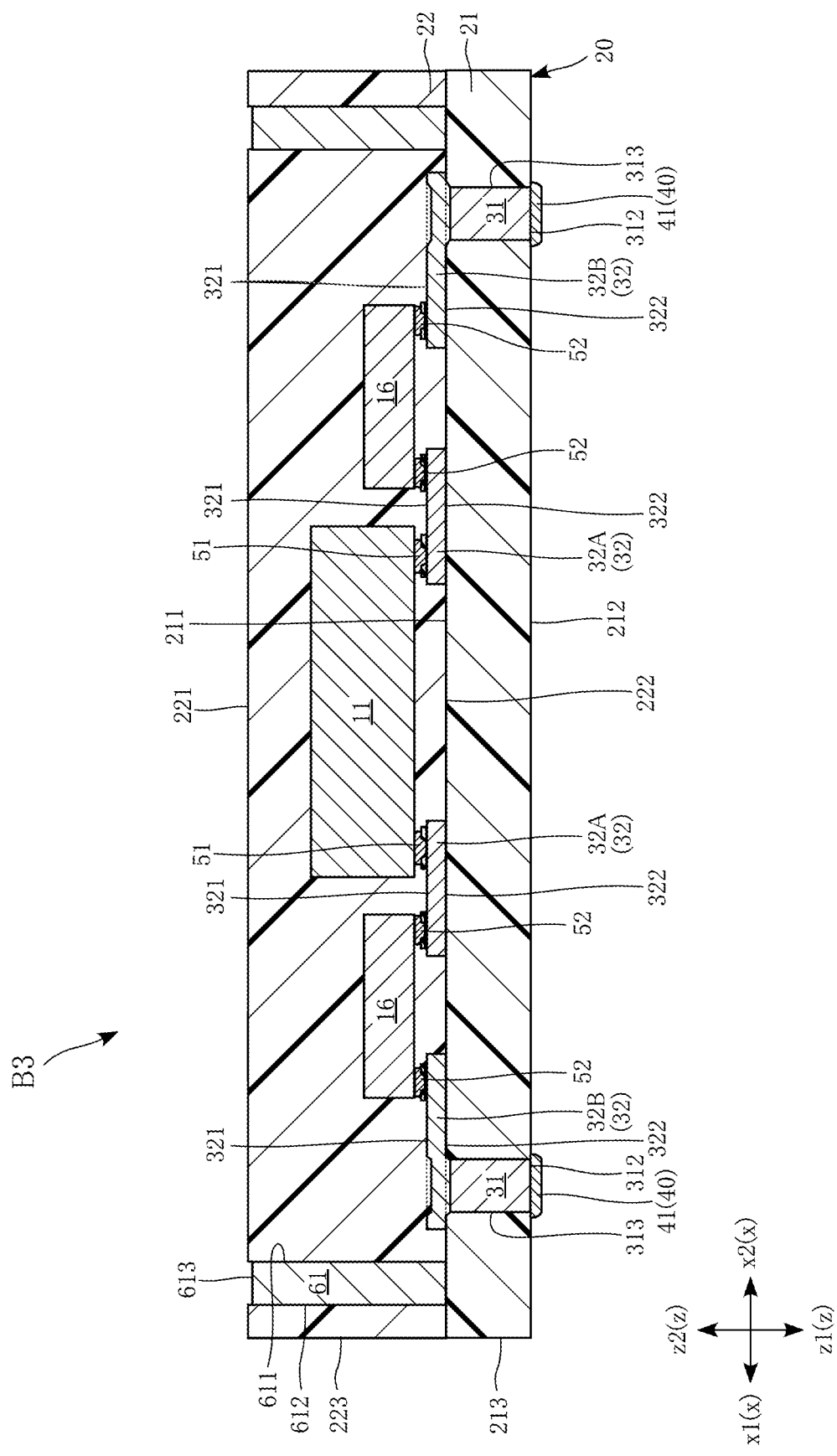
FIG. 37 is a cross-sectional view taken along a line XXXVII-XXXVII in FIG. 36.

FIG. 36 and FIG. 37 illustrate a terahertz device B3 according to another variation of the second embodiment. FIG. 36 is a plan view showing the terahertz device B3, in which the second resin layer 22 is not shown. FIG. 37 is a cross-sectional view taken along a line XXXVII-XXXVII in FIG. 36. In the terahertz device B3, the terahertz element 11 and the two electronic parts 16 are located inside the frame-shaped conductor 61, in a plan view. In the terahertz device B3, the terahertz element 11 and the two electronic parts 16 are aligned in the x-direction, in a plan view. The terahertz element 11 is located between the two electronic parts 16, in a plan view. The order in which the terahertz element 11 and the two electronic parts 16 are to be aligned is not limited to the example shown in FIG. 36. In the terahertz device B3, further, the wiring layers 32 include a plurality of wiring sections 32A and 32B, as shown in FIG. 37. The plurality of wiring sections 32A each include two bonding sections 51 and 52, formed on the wiring layer obverse face 321. The plurality of wiring sections 32B each include the bonding section 52 formed on the wiring layer obverse face 321, and the wiring layer reverse face 322 is in contact with the columnar conductor 31. Via the wiring sections 32A, the terahertz element 11 and the electronic parts 16 are electrically connected to each other. Via each of the wiring sections 32B, one of the electronic parts 16 and the corresponding columnar conductor 31 are electrically connected to each other.

Figure 38:
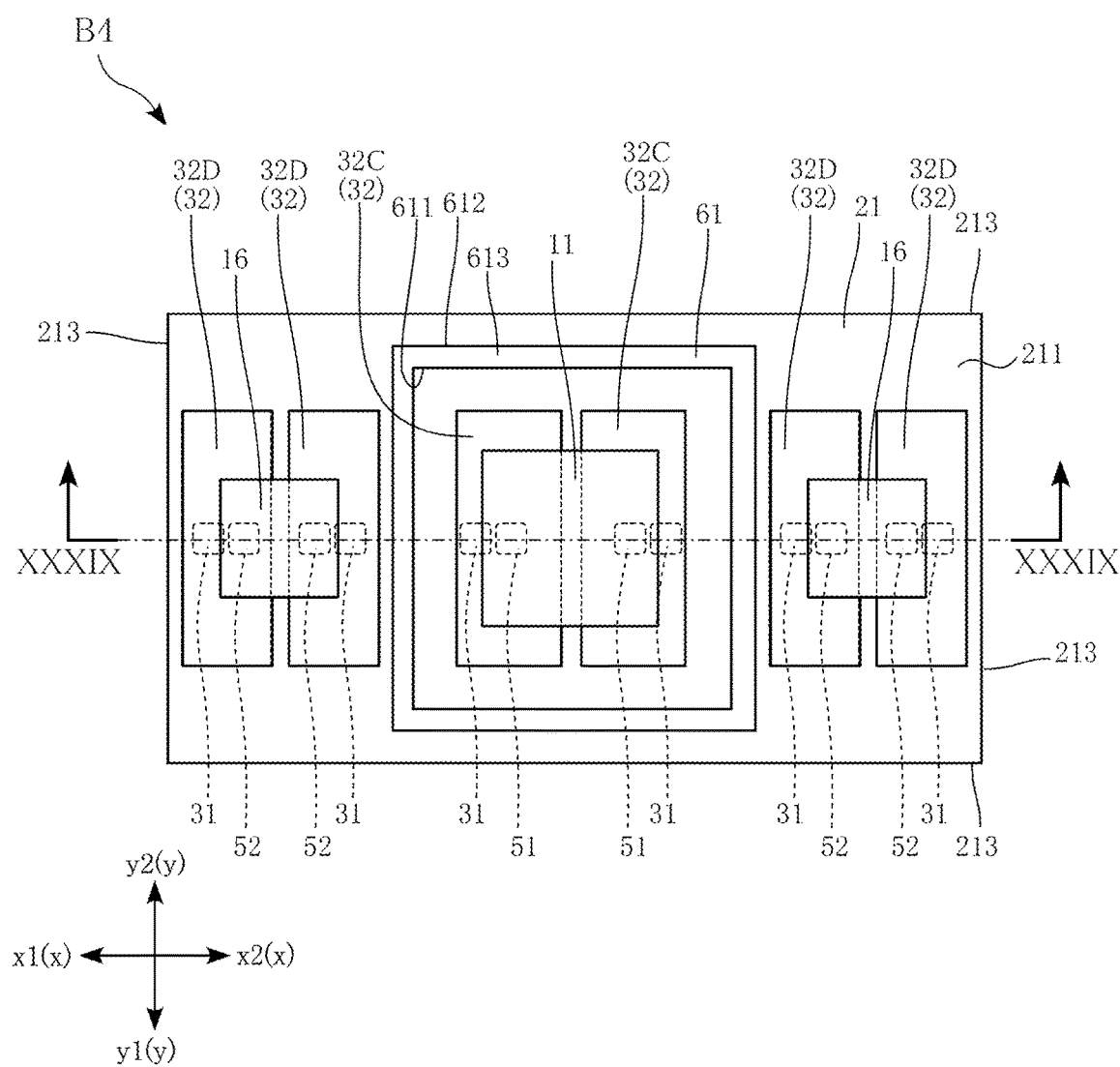
FIG. 38 is a plan view showing a terahertz device according to another variation of the second embodiment.
Figure 39:
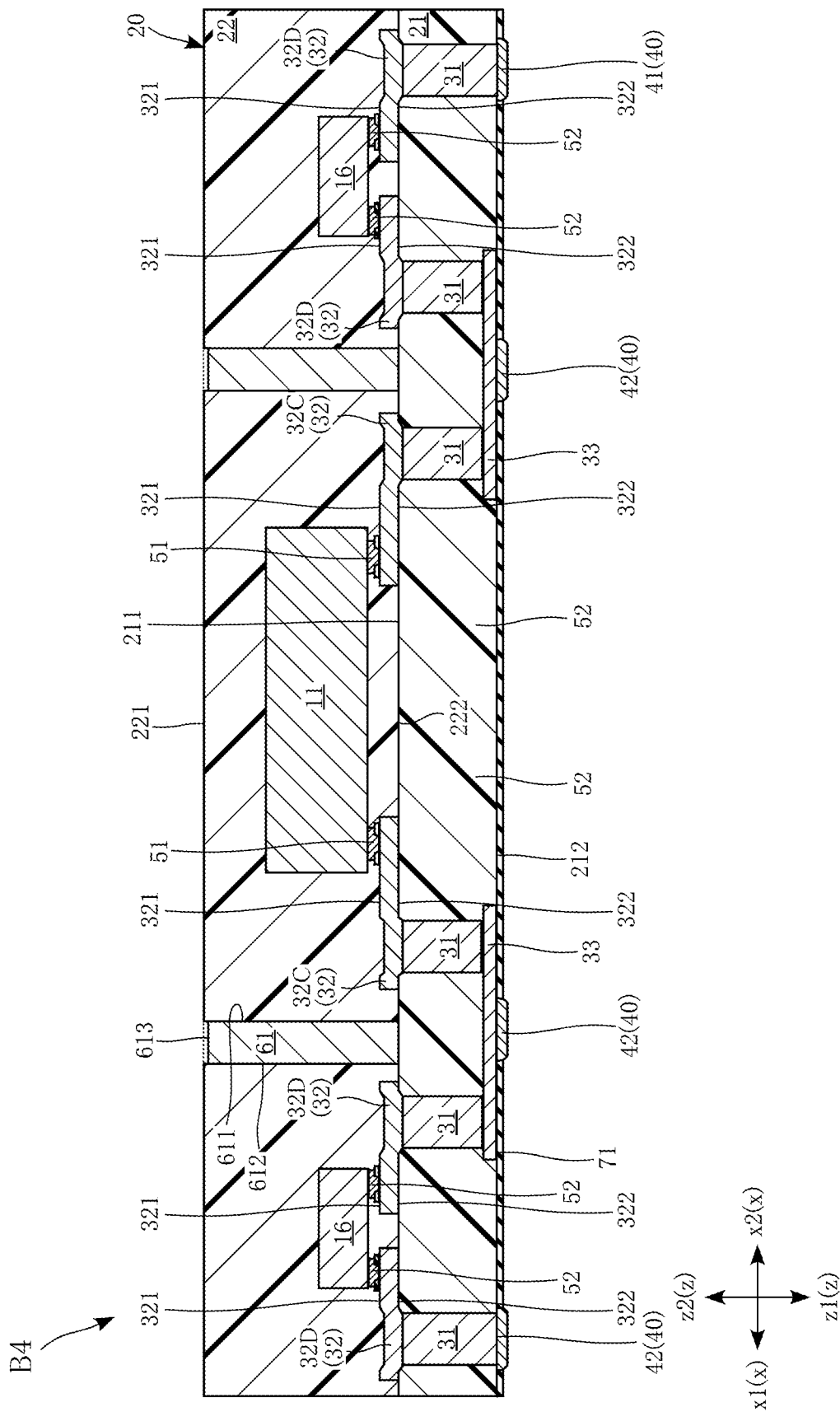
FIG. 39 is a cross-sectional view taken along a line XXXIX-XXXIX in FIG. 38.

FIG. 38 and FIG. 39 illustrate a terahertz device B4 according to another variation of the second embodiment. FIG. 38 is a cross-sectional view showing the terahertz device B4, in which the second resin layer 22 is unshown. FIG. 39 is a cross-sectional view taken along a line XXXIX-XXXIX in FIG. 38. In the terahertz device B4, in a plan view, the terahertz element 11 is located inside the frame-shaped conductor 61, and the electronic parts 16 are located outside the frame-shaped conductor 61, unlike in the terahertz device B3. In the terahertz device B4 also, the terahertz element 11 and the two electronic parts 16 are aligned in the x-direction in a plan view, as in the terahertz device B3. The terahertz element 11 is located between the two electronic parts 16, in a plan view. In this variation, however, a part of the frame-shaped conductor 61 is located between the terahertz element 11 and each of the electronic parts 16, in a plan view. The order in which the terahertz element 11 and the two electronic parts 16 are to be aligned is not limited to the example shown in FIG. 38. As shown in FIG. 39, further, the wiring layers 32 in the terahertz device B4 include a plurality of wiring sections 32C and 32D. The plurality of wiring sections 32C each include the bonding section 51 formed on the wiring layer obverse face 321, and the wiring layer reverse face 322 is in contact with the columnar conductor 31. The plurality of wiring sections 32D each include the bonding section 52 formed on the wiring layer obverse face 321, and the wiring layer reverse face 322 is in contact with the columnar conductor 31. In addition, the wiring layers 33 each provide electrical conduction between the region inside the frame-shaped conductor 61 and the region outside the frame-shaped conductor 61. The external electrodes 40 in the terahertz device B4 include both of the columnar conductor shield 41 and the wiring layer shield 42.

Third Embodiment

Figure 40:
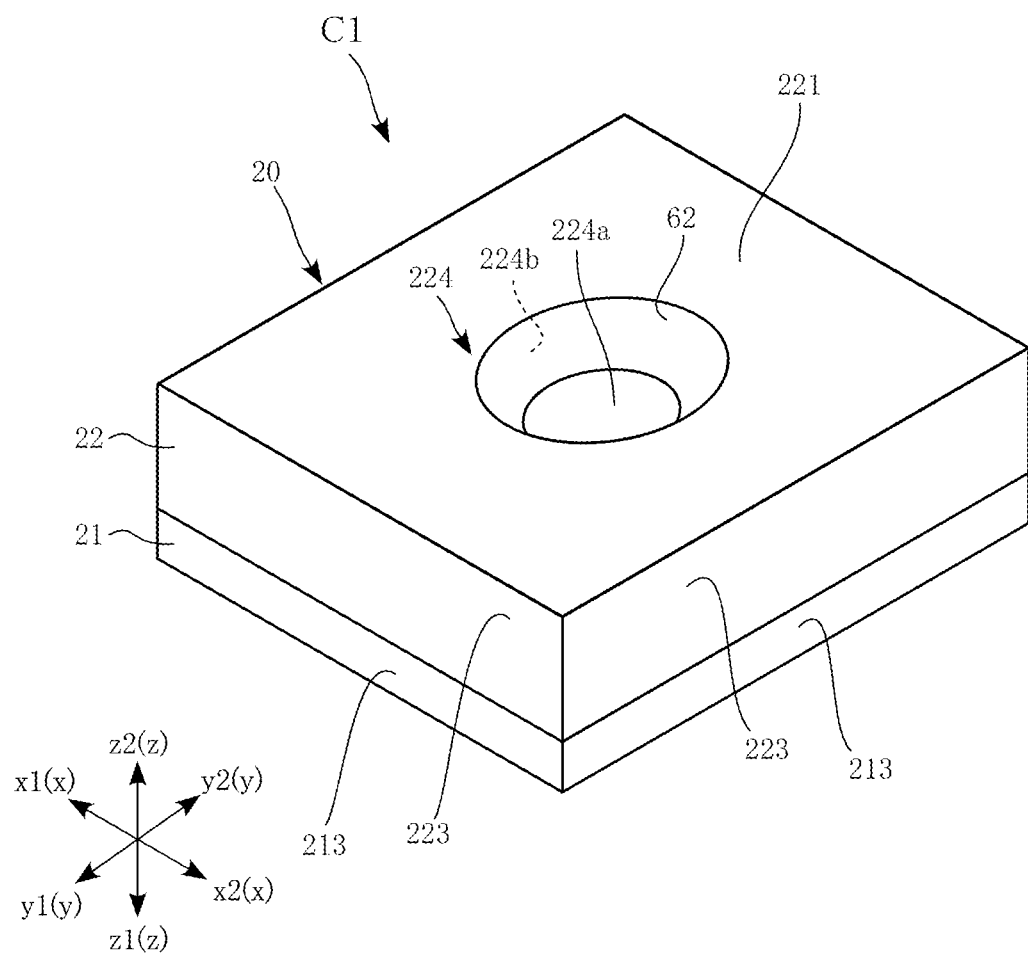
FIG. 40 is a perspective view showing a terahertz device according to a third embodiment.
Figure 41:
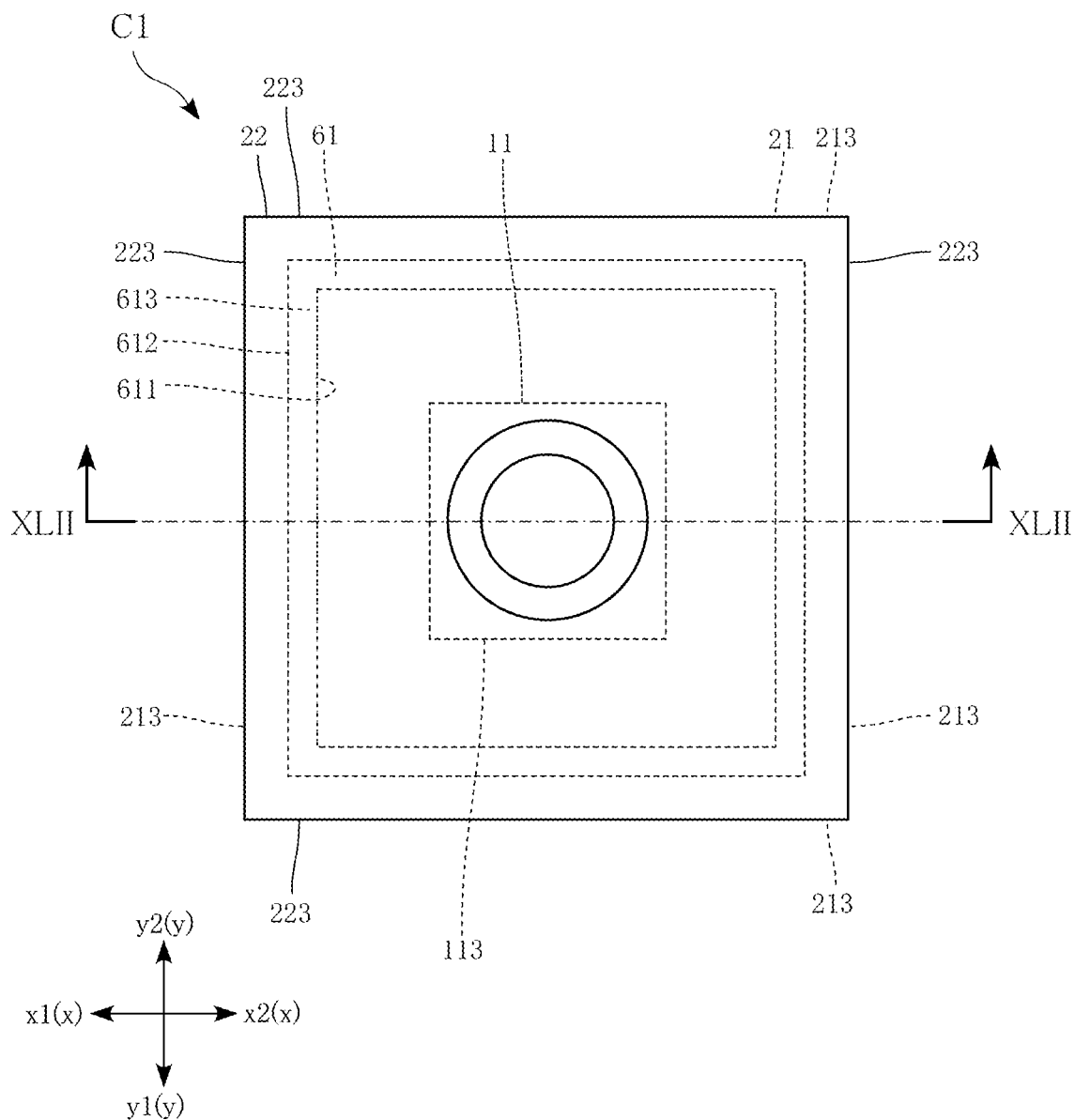
FIG. 41 is a plan view showing the terahertz device according to the third embodiment.
Figure 42:
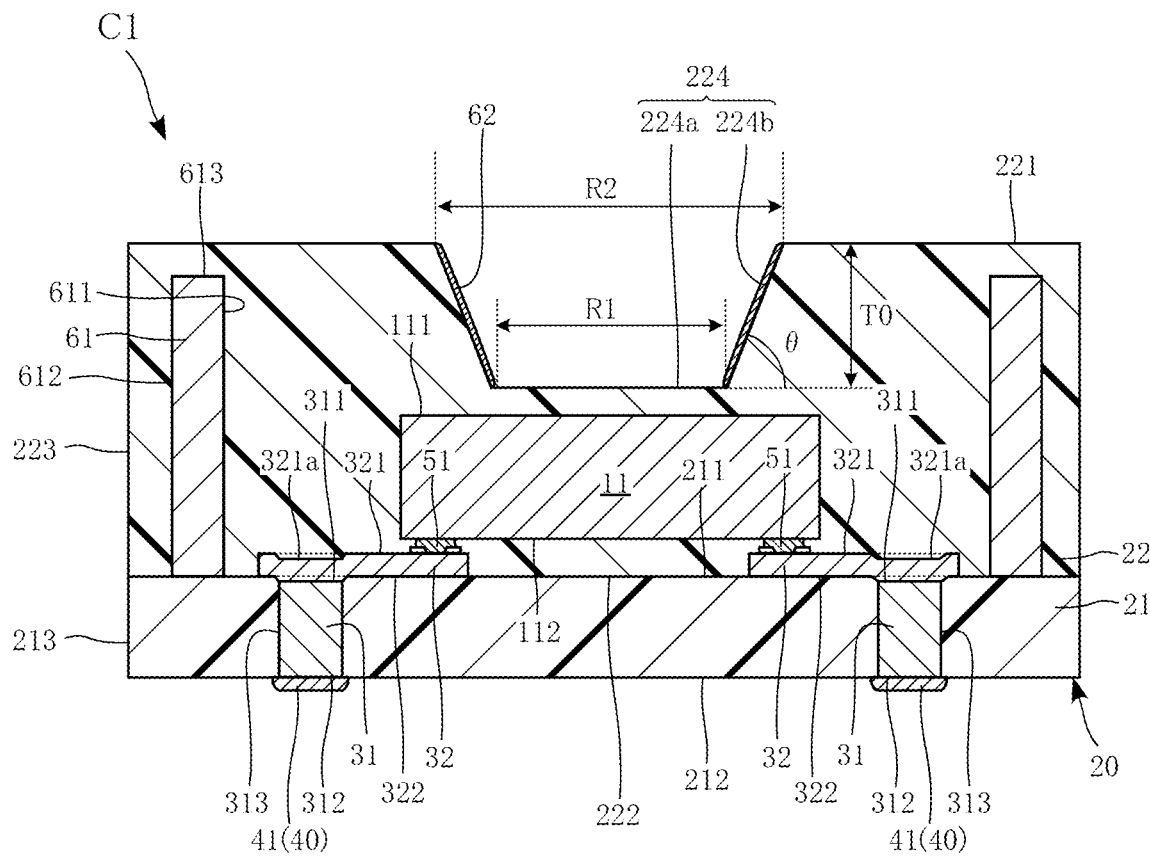
FIG. 42 is a cross-sectional view taken along a line XLII-XLII in FIG. 41.

FIG. 40 to FIG. 42 illustrate a terahertz device according to a third embodiment. The terahertz device C1 according to the third embodiment is different in the shape of the second resin layer 22, when compared with the terahertz device A1.

FIG. 40 is a perspective view showing the terahertz device C1. FIG. 41 is a plan view showing the terahertz device C1. FIG. 42 is a cross-sectional view taken along a line XLII-XLII in FIG. 41.

In the terahertz device C1, the second resin layer 22 includes a recess 224, recessed to the z1-side from the second resin layer obverse face 221. The method to form the recess 224 is not specifically limited but, for example, a laser processing may be employed. The recess 224 has, for example, a truncated circular cone shape. The cross-sectional area of the recess 224, orthogonal to the z-direction, becomes smaller in the direction from the z2-side toward the z1-side. As shown in FIG. 41, the recess 224 overlaps with the terahertz element 11, in a plan view. The recess 224 includes a bottom face 224a, and an intermediary face 224b.

The bottom face 224a is oriented in the same direction in which the second resin layer obverse face 221 is oriented. The bottom face 224a is orthogonal to the z-direction. As shown in FIG. 41, the bottom face 224a has, for example, a circular shape in a plan view. The bottom face 224a may be flat. The diameter R1 of the bottom face 224a (see FIG. 42) may preferably be approximately $\lambda/2 \leq R1 \leq \lambda$, where $\lambda$ represents the wavelength of the terahertz wave emitted from the terahertz element 11.

The intermediary face 224b is connected to the second resin layer obverse face 221 and the bottom face 224a, as shown in FIG. 40 and FIG. 42. The edge of the intermediary face 224b on the z2-side in the z-direction is connected to the second resin layer obverse face 221, and the edge of the intermediary face 224b on the z1-side is connected to the bottom face 224a. The intermediary face 224b is inclined with respect to the bottom face 224a. The diameter R2 of the opening of the recess 224 (see FIG. 42) may be set as $R2=R1+2\times(T0\times\tan(90-\theta))$, where $\theta$ represents the inclination angle of the intermediary face 224b with respect to the bottom face 224a, and T0 represents the depth (size in z-direction) of the recess 224.

The terahertz device C1 includes a metal film 62, covering the intermediary face 224b of the recess 224. The metal film 62 is, for example, formed of Cu. The material of the metal film 62 is not limited to Cu, provided that the material reflects the terahertz wave.

Although the top face 613 of the frame-shaped conductor 61 in the terahertz device C1 is covered with the second resin layer 22, as shown in FIG. 42, the top face 613 may be exposed from the second resin layer 22, as in the terahertz device A1.

Hereunder, advantageous effects provided by the terahertz device C1 according to the third embodiment, and the manufacturing method thereof, will be described.

The terahertz device C1 includes, like the terahertz device A1, the first resin layer 21 and the second resin layer 22. The first resin layer 21 supports the terahertz element 11, via the plurality of wiring layers 32. The second resin layer 22 is formed on the first resin layer 21, so as to cover the terahertz element 11. Accordingly, a difference in thermal expansion coefficient between the supporting member (first resin layer 21) and the protecting member (second resin layer 22) can be reduced, as in the first embodiment. Therefore, thermal stress generated at the interface between the supporting member and the protecting member can be reduced, and the protecting member can be prevented from being separated from the supporting member. Such a configuration contributes to improving the reliability of the terahertz device C1. Consequently, the terahertz device C1 can assume a package structure that is advantageous in modularizing the terahertz element 11.

The terahertz device C1 provides various other advantageous effects similar to those provided by the terahertz devices A1 and B1, because of the configuration common to the terahertz devices A1, B1, and C1.

In the terahertz device C1, the second resin layer 22 includes the recess 224. The recess 224 overlaps with the terahertz element 11, in a plan view. The center of the recess 224 coincides with the center of the terahertz element 11, in a plan view. The recess 224 includes the intermediary face 224b, which is covered with the metal film 62. With the mentioned configuration, the recess 224 acts as a horn antenna, and therefore the gain, directionality, and polarization of the terahertz wave to be oscillated or received can be controlled, by adjusting the shape and size of the recess 224. Thus, the terahertz device C1 includes a horn antenna integrated therein. Consequently, the terahertz device C1 can assume a package structure of a higher function than the terahertz device A1, in terms of the modularization of the terahertz element 11. Here, since the recess 224 has a truncated circular cone shape, the terahertz device C1 is excited by $TE_{11}$ wave of the basic mode.

Hereunder, variations of the terahertz device C1 according to the third embodiment will be described. The following variations also provide the advantageous effects similar to those provided by the terahertz device C1.

Although the third embodiment represents the case where the recess 224 is formed in the second resin layer 22 in the terahertz device A1, the recess 224 may be formed in the second resin layer 22 in the terahertz device B1, without limitation to the above.

Although the recess 224 is formed in the truncated circular cone shape in the third embodiment, the shape of the recess 224 is not specifically limited. For example, the recess 224 may have a square cone shape. FIG. 43 to FIG. 47 illustrate the terahertz device according to such a variation. FIG. 43 to FIG. 47 represent the case where the recess 224 has a square cone shape.

Figure 43:
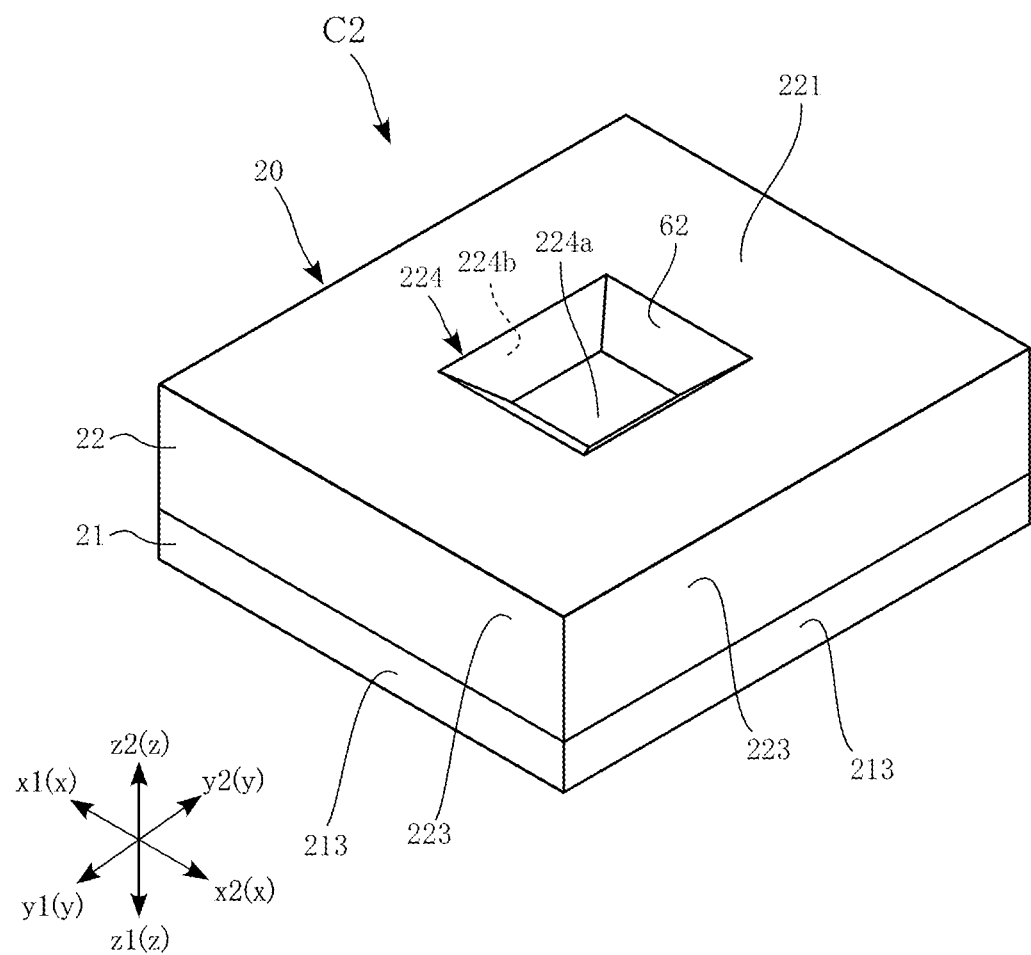
FIG. 43 is a perspective view showing a terahertz device according to a first variation of the third embodiment.
Figure 44:
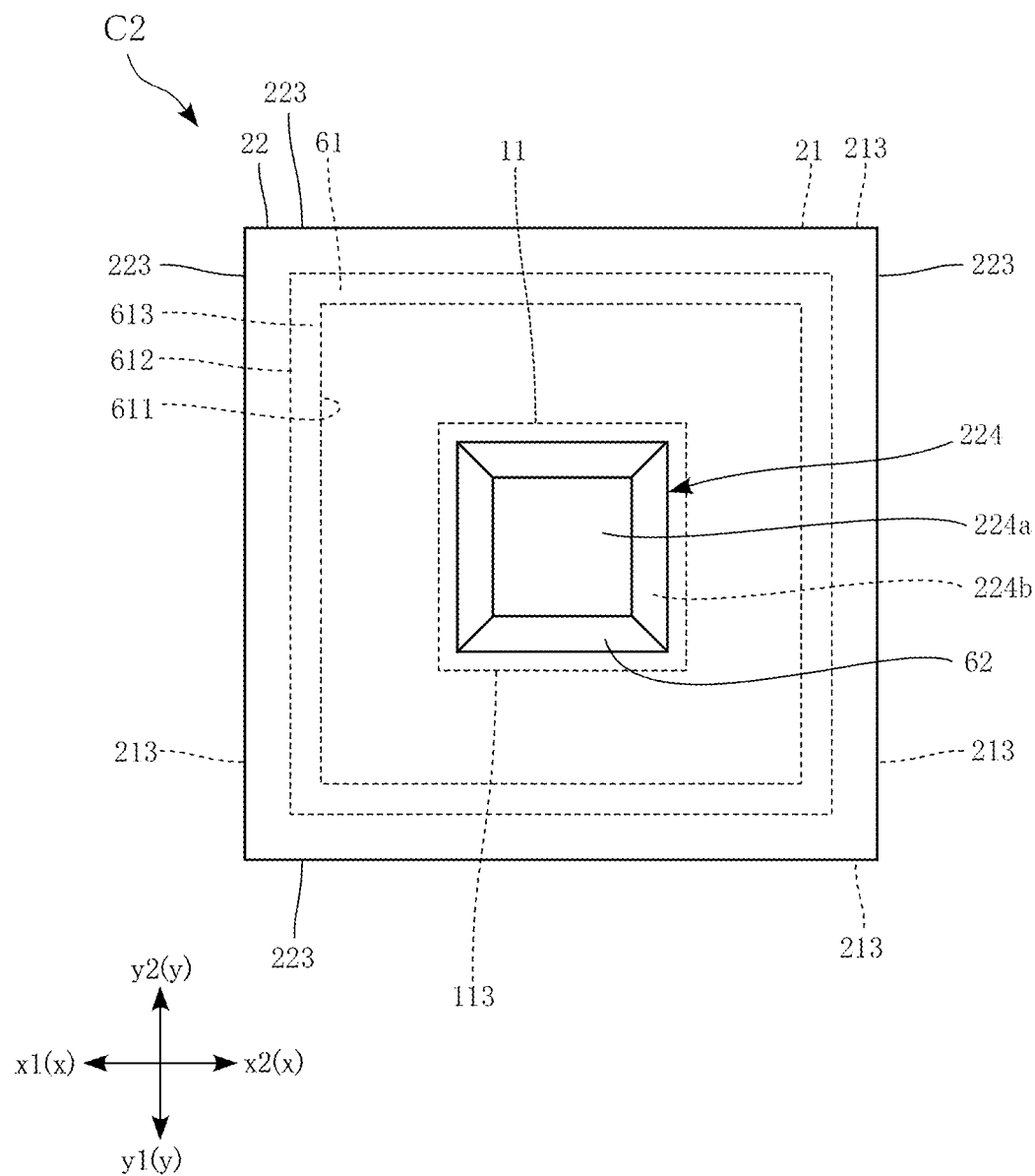
FIG. 44 is a plan view showing the terahertz device according to the first variation of the third embodiment.

FIG. 43 and FIG. 44 illustrate a terahertz device C2 according to a first variation of the third embodiment. FIG. 43 is a perspective view showing the terahertz device C2, and FIG. is a plan view showing the terahertz device C2. In the terahertz device C2, the recess 224 has a square shape in a plan view and, in particular, the two diagonal lines of the recess 224 in a plan view generally coincide with the two diagonal lines of the terahertz element 11 in a plan view. In this variation also, the center of the recess 224 coincides with the center of the terahertz element 11, in a plan view. In the terahertz device C2 also, the recess 224 acts as a horn antenna, as in the terahertz device C1. Therefore, the terahertz device C2 can assume a package structure in which a horn antenna is integrated, for the modularization of the terahertz element 11.

Figure 45:
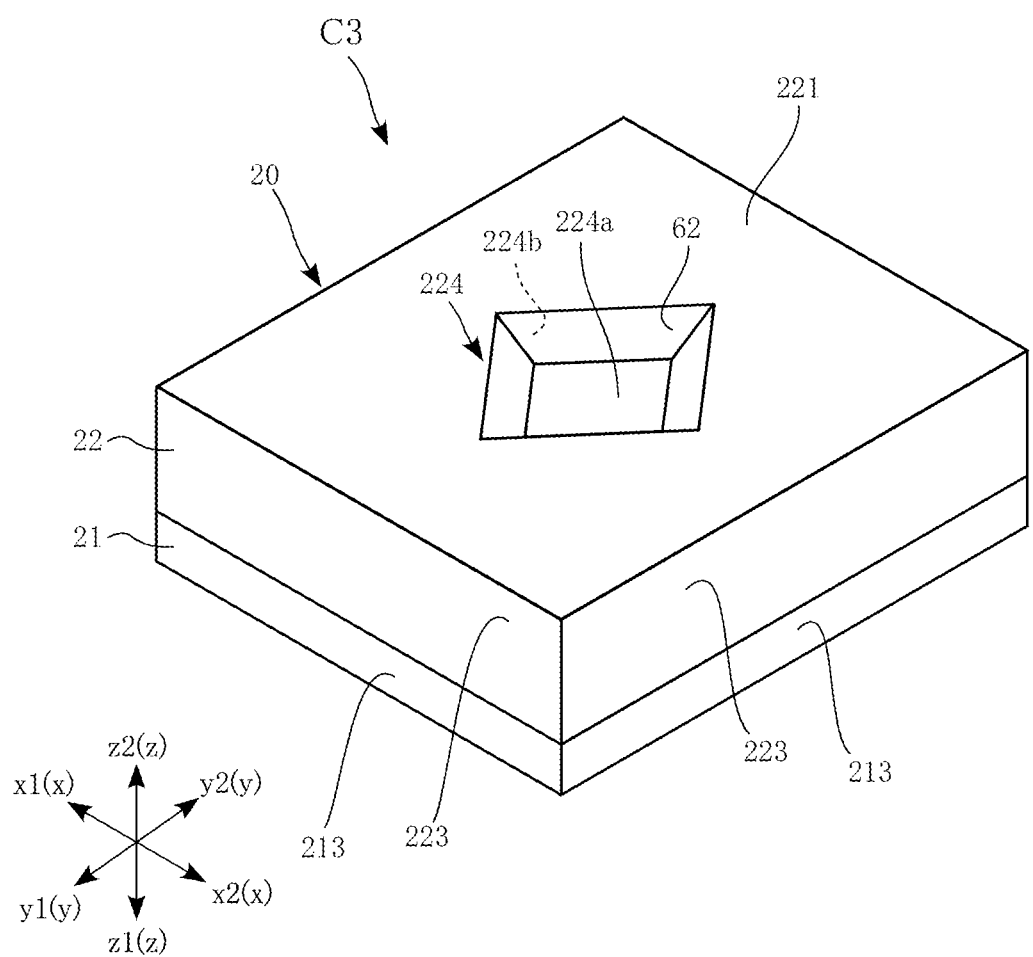
FIG. 45 is a perspective view showing a terahertz device according to a second variation of the third embodiment.
Figure 46:
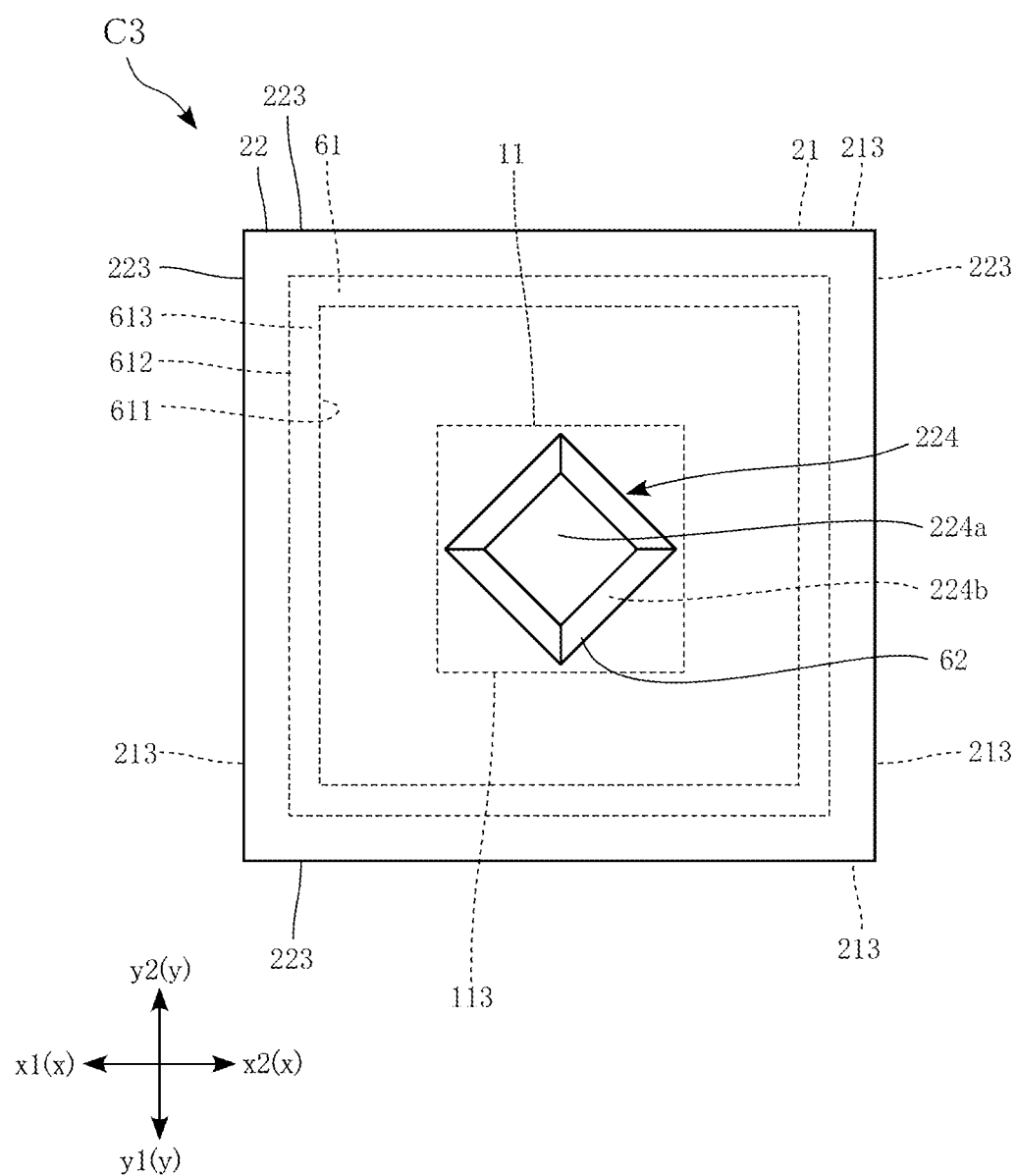
FIG. 46 is a plan view showing the terahertz device according to the second variation of the third embodiment.

FIG. 45 and FIG. 46 illustrate a terahertz device C3 according to a second variation of the third embodiment. FIG. 45 is a perspective view showing the terahertz device C3. FIG. 46 is a plan view showing the terahertz device C3. In the terahertz device C3, the recess 224 has a square shape in a plan view and, in particular, the two diagonal lines of the recess 224 in a plan view respectively extend in the x-direction and the y-direction. In this variation also, the center of the recess 224 coincides with the center of the terahertz element 11, in a plan view. In the terahertz device C3 also, the recess 224 acts as a horn antenna, as in the terahertz device C1. Therefore, the terahertz device C3 can assume a package structure in which a horn antenna is integrated, for the modularization of the terahertz element 11. In the terahertz device C3, further, the recess 224 acts as a horn antenna called a diagonal horn, and is compatible with multimode oscillation.

Figure 47:
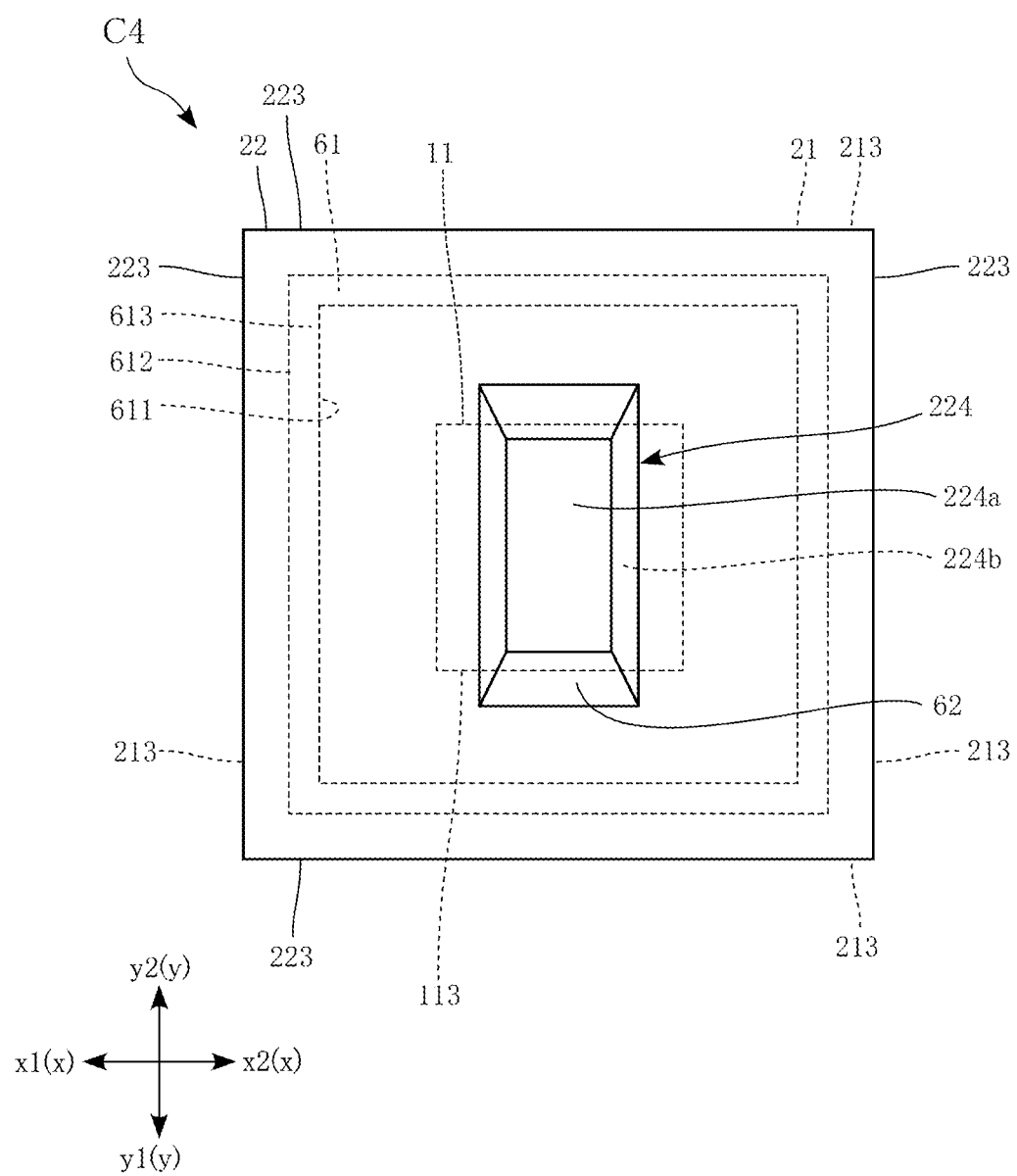
FIG. 47 is a plan view showing a terahertz device according to a third variation of the third embodiment.

FIG. 47 illustrates a terahertz device C4 according to a third variation of the third embodiment. FIG. 47 is a plan view showing the terahertz device C4. In the terahertz device C4, the recess 224 has a rectangular shape in a plan view. Although the recess 224 shown in FIG. 47 has a rectangular shape with the long sides extending in the y-direction in a plan view, the rectangle may have the long sides extending in the x-direction. In this variation also, the center of the recess 224 coincides with the center of the terahertz element 11, in a plan view. In the terahertz device C4 also, the recess 224 acts as a horn antenna, as in the terahertz device C1. Therefore, the terahertz device C4 can assume a package structure in which a horn antenna is integrated, for the modularization of the terahertz element 11. In the terahertz device C4, further, since the recess 224 has the rectangular shape, the terahertz device C4 is excited by $TE_{01}$ wave of the basic mode.

Figure 48:
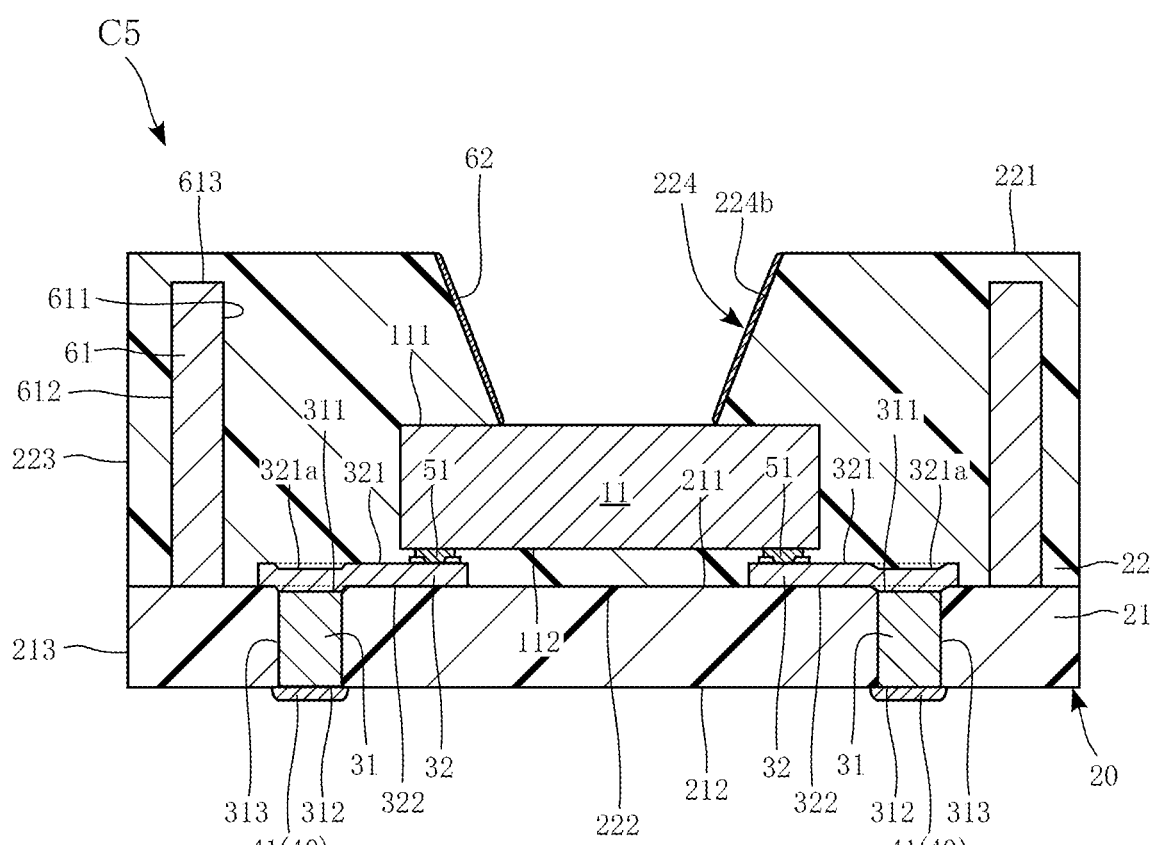
FIG. 48 is a cross-sectional view showing a terahertz device according to a fourth variation of the third embodiment.

Although the element obverse face 111 is covered with the second resin layer 22 in the third embodiment, the present disclosure is not limited to such a configuration. For example, a part of the element obverse face 111 may be exposed, because of the presence of the recess 224. FIG. 48 illustrates a terahertz device C5 according to a fourth variation of the third embodiment. FIG. 48 is a cross-sectional view of the terahertz device C5, corresponding to the cross-section shown in FIG. 42.

In the terahertz device C5, the recess 224 is without the bottom face 224a and, as shown in FIG. 48, has an opening along the edge on the z1-side. Accordingly, a part of the element obverse face 111 is exposed from the second resin layer 22. In other words, in the terahertz device C5, a part of the element obverse face 111 is covered with the second resin layer 22, and the remaining part is exposed from the second resin layer 22.

The terahertz device C5 also provides the advantageous effects similar to those provided by the terahertz device C1.

Figure 49:
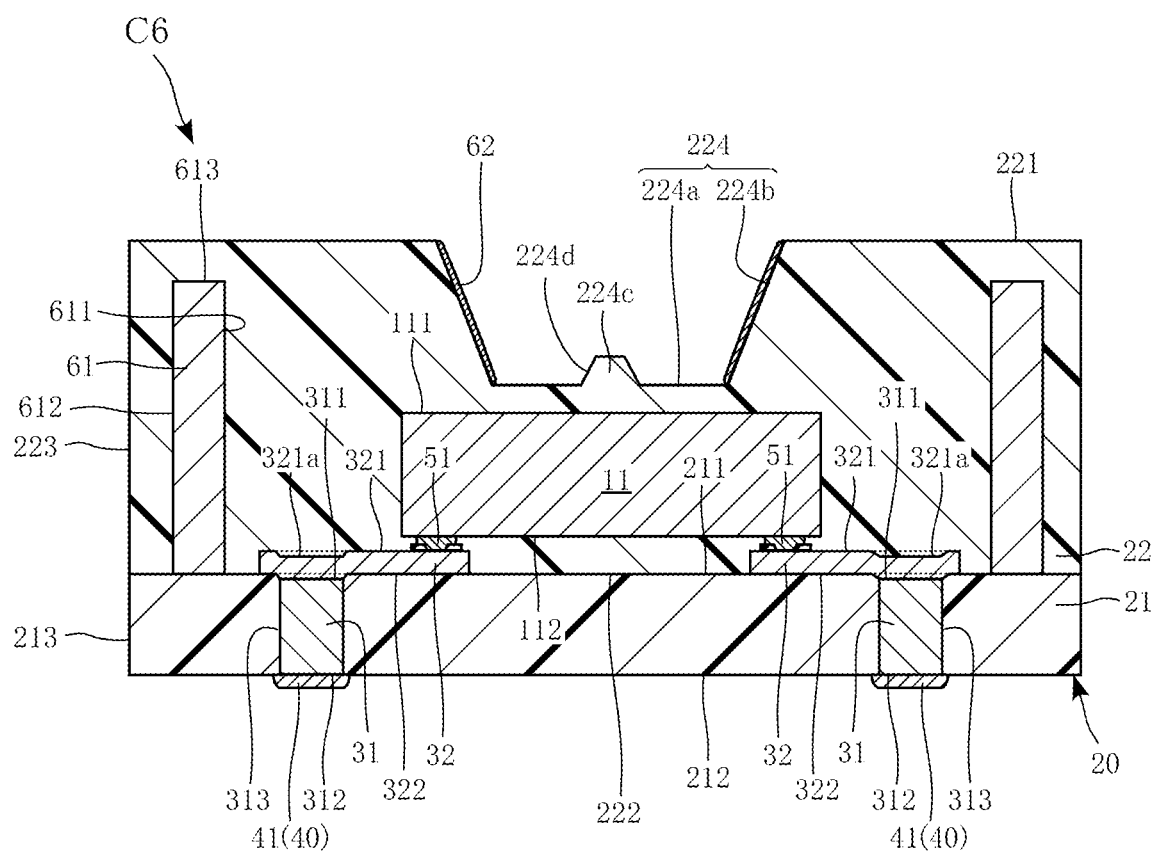
FIG. 49 is a cross-sectional view showing a terahertz device according to a fifth variation of the third embodiment.

Although the bottom face 224a of the recess 224 is flat in the third embodiment, the present disclosure is not limited to such a configuration. For example, the bottom face 224a may include a portion protruding to the z2-side. FIG. 49 illustrates a terahertz device C6 according to a fifth variation of the third embodiment. FIG. 49 is a cross-sectional view of the terahertz device C6, corresponding to the cross-section shown in FIG. 42.

In the terahertz device C6, recess 224 further includes a protruding portion 224c. The protruding portion 224c protrudes to the z2-side, from the bottom face 224a of the recess 224, as shown in FIG. 49. The protruding portion 224c is, for example, formed in a truncated circular cone shape. The shape of the protruding portion 224c is not limited to the truncated circular cone shape, but may be a square cone shape, or a circular cone shape. The cross-section of the protruding portion 224c orthogonal to the z-direction becomes smaller, in the direction from the z1-side toward the z2-side. The protruding portion 224c includes a side face 224d elevated from the bottom face 224a. The side face 224d is inclined with respect to the bottom face 224a. The center of the protruding portion 224c coincides with the center of the recess 224, in a plan view. Although the side face 224d shown in FIG. 49 is exposed to outside, the side face 224d may be covered with the metal film 62. In a plan view, the center of the protruding portion 224c generally coincides with the center of the terahertz element 11.

The terahertz device C6 also provides the advantageous effects similar to those provided by the terahertz device C1.

Fourth Embodiment

Figure 50:
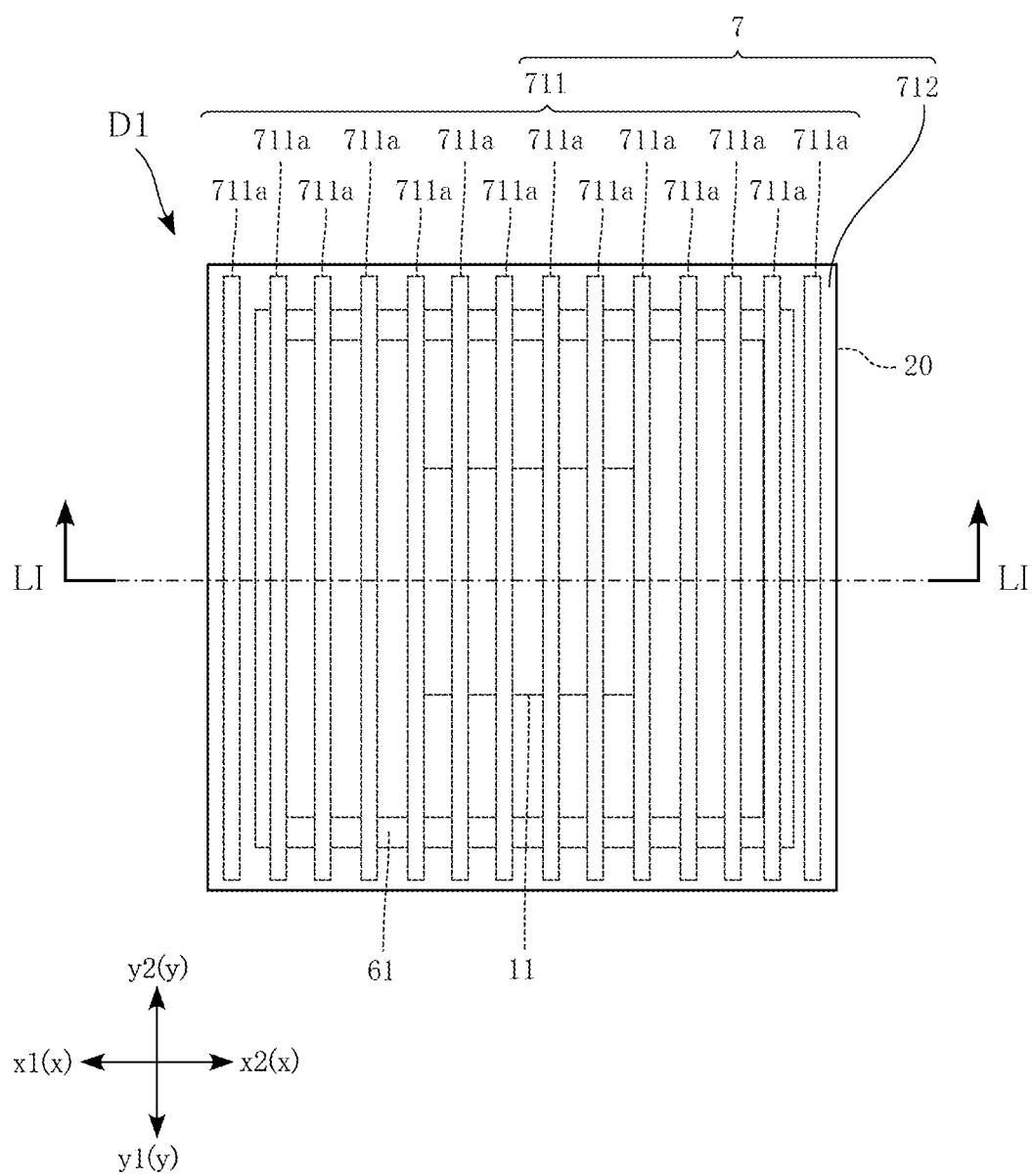
FIG. 50 is a plan view showing a terahertz device according to a fourth embodiment.
Figure 51:
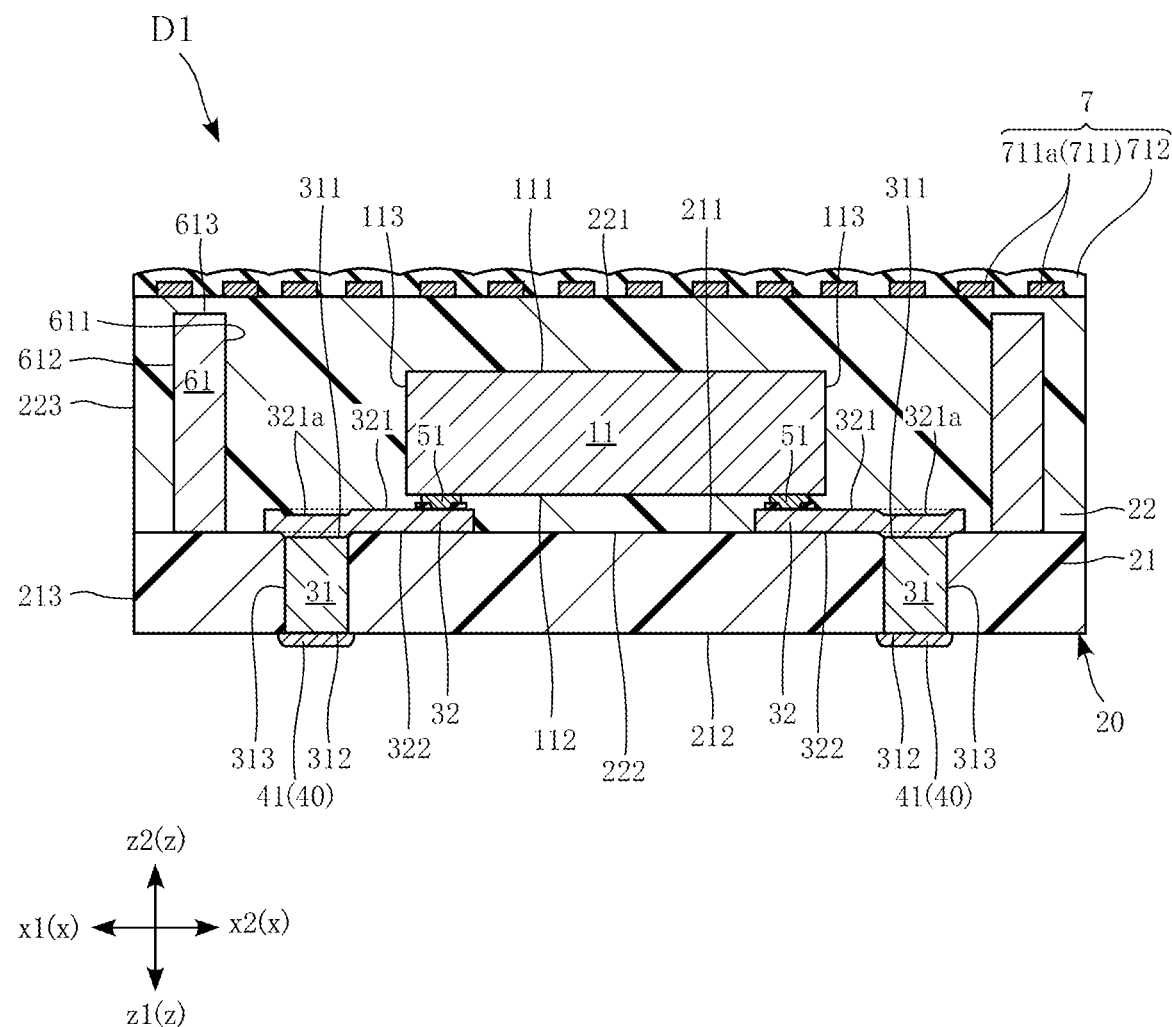
FIG. 51 is a cross-sectional view taken along a line LI-LI in FIG. 50.

FIG. 50 and FIG. 51 illustrate a terahertz device according to a fourth embodiment. The terahertz device D1 according to the fourth embodiment is different from the terahertz device A1, in that an electromagnetic wave controller is provided on the second resin layer obverse face 221, through which the terahertz wave is emitted (or received). In this embodiment, the electromagnetic wave controller serves to control the terahertz wave, and the modes of the control include, for example, polarization control, frequency control, directionality control, distribution control, resonance control, and near-field control. Although this embodiment represents the terahertz device D1 formed by additionally providing the electromagnetic wave controller to the terahertz device A1, the electromagnetic wave controller may be added to the terahertz device B1 or C1, or to the variations thereof.

FIG. 50 is a plan view showing the terahertz device D1. FIG. 51 is a cross-sectional view taken along a line LI-LI in FIG. 50.

As described above, the terahertz device D1 further includes the electromagnetic wave controller 7, unlike the terahertz device A1. The electromagnetic wave controller 7 is formed on the second resin layer obverse face 221. In the terahertz device D1, a metamaterial structure is integrated, to act as the electromagnetic wave controller 7. The electromagnetic wave controller 7 overlaps with the element obverse face 111 of the terahertz element 11, in a plan view. The electromagnetic wave controller 7 according to this embodiment, in other words the metamaterial structure, includes a pattern layer 711 and a protective layer 712, as shown in FIG. 50 and FIG. 51.

The pattern layer 711 is formed on the second resin layer obverse face 221. As shown in FIG. 50, the pattern layer 711 overlaps with the terahertz element 11, in a plan view. As shown in FIG. 50, further, the pattern layer 711 overlaps with the region surrounded by the frame-shaped conductor 61, in a plan view. The pattern layer 711 includes a plurality of metal members 711a, arranged in a louver pattern. The metal members 7111a each have a belt-like shape extending in the y-direction, in a plan view. The metal members 711a are aligned in the x-direction. Thus, the pattern layer 711 includes the plurality of belt-like metal members 711a, arranged in the louver pattern.

The protective layer 712 is formed so as to cover the pattern layer 711. The protective layer 712 is formed of an insulative material, such as an epoxy-based resin, a polymer-based resin, a silicon oxide film (e.g., $SiO_2$), or a silicon nitride film (e.g., SiN). As shown in FIG. 51, the protective layer 712 has an uneven surface (oriented to z2-side in FIG. 51) but, without limitation thereto, the protective layer 712 may have a flat surface. In the surface of the protective layer 712, protruding portions (convex portion) overlap with the respective metal members 711a in a plan view, and recessed portions (concave portion) do not overlap with the metal members 711a, in a plan view.

The terahertz device D1 provides the advantageous effects similar to those provided by the terahertz device A1.

In the terahertz device D1, the electromagnetic wave controller 7 is formed on the second resin layer obverse face 221 of the second resin layer 22. Accordingly, the terahertz wave from the terahertz element 11 is emitted to outside, through the electromagnetic wave controller 7. Likewise, the terahertz wave from outside is incident into the terahertz element 11, through the electromagnetic wave controller 7. Such a configuration enables the terahertz device D1 to control the terahertz wave emitted or received, using the electromagnetic wave controller 7. Consequently, the terahertz device D1 can assume a package structure capable of controlling the terahertz wave.

In the terahertz device D1, the electromagnetic wave controller 7 includes the pattern layer 711, which includes the plurality of metal members 711a arranged in a louver pattern (see FIG. 50 and FIG. 51). In this case, the electromagnetic wave controller 7 acts as a polarizing filter. In other words, the electromagnetic wave controller 7 serves to polarize the terahertz wave emitted from the terahertz element 11.

Although the pattern layer 711 in the terahertz device D1 is formed as a single layer in the z-direction, a plurality of pattern layers may be stacked. In addition, although the plurality of metal members 711a constituting the pattern layer 711 are arranged in a louver pattern in the terahertz device D1, a plurality of metal members 711a each having, for example, a circular ring shape in a plan view may be concentrically arranged, without limitation to the above. In this case, the plurality of metal members 711a are different from one another in inner diameter, and the outer diameter of a given metal member 711a is smaller than the inner diameter of the metal member 711a located on the outer side. Alternatively, a plurality of metal members 711a, each having a small circular shape in a plan view, may be regularly arranged (e.g., photonic crystal structure to be subsequently described).

FIG. 52 to FIG. 56 each illustrate a variation of the terahertz device D1 according to the fourth embodiment.

Figure 52:
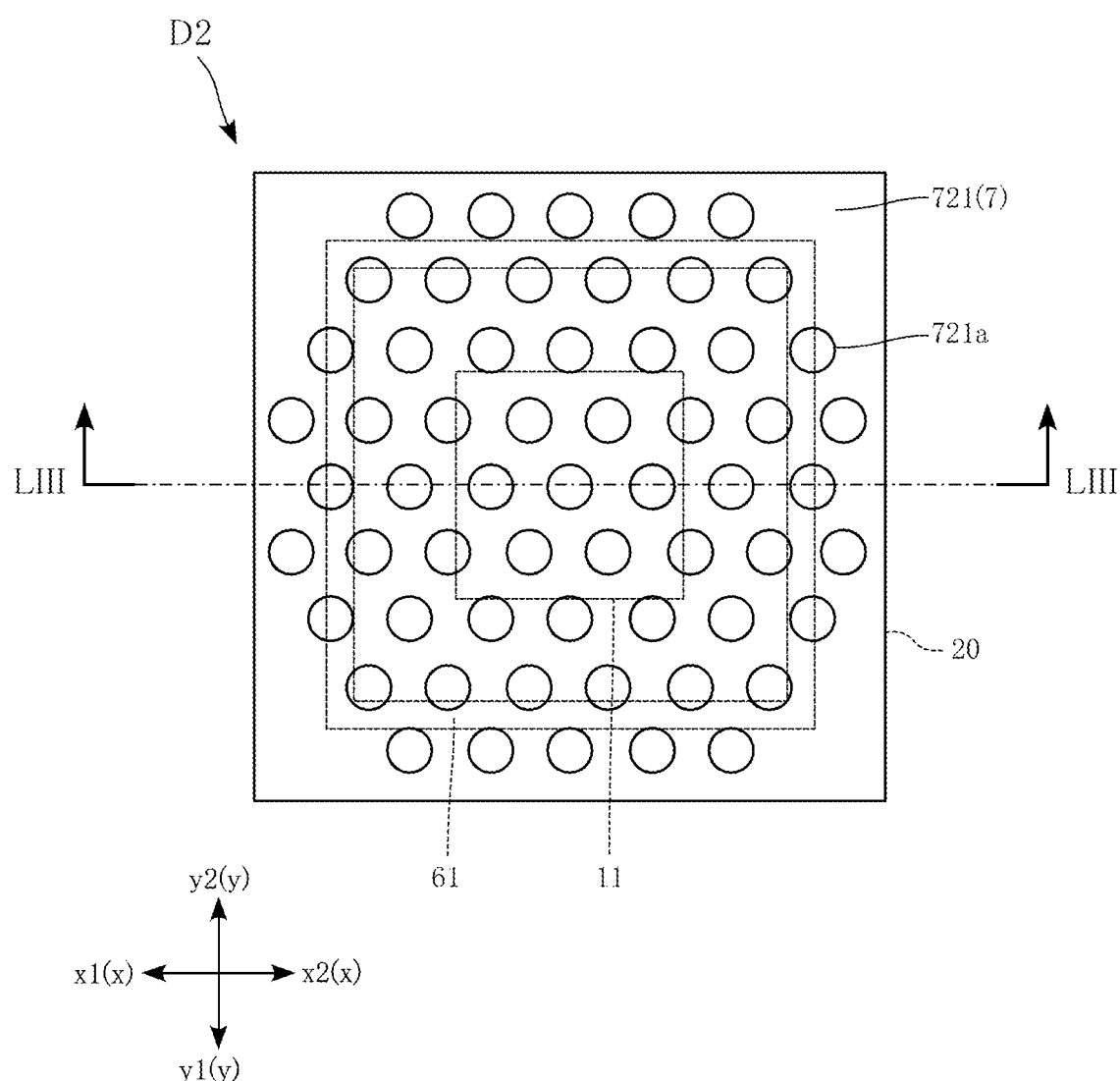
FIG. 52 is a plan view showing a terahertz device according to a first variation of the fourth embodiment.
Figure 53:
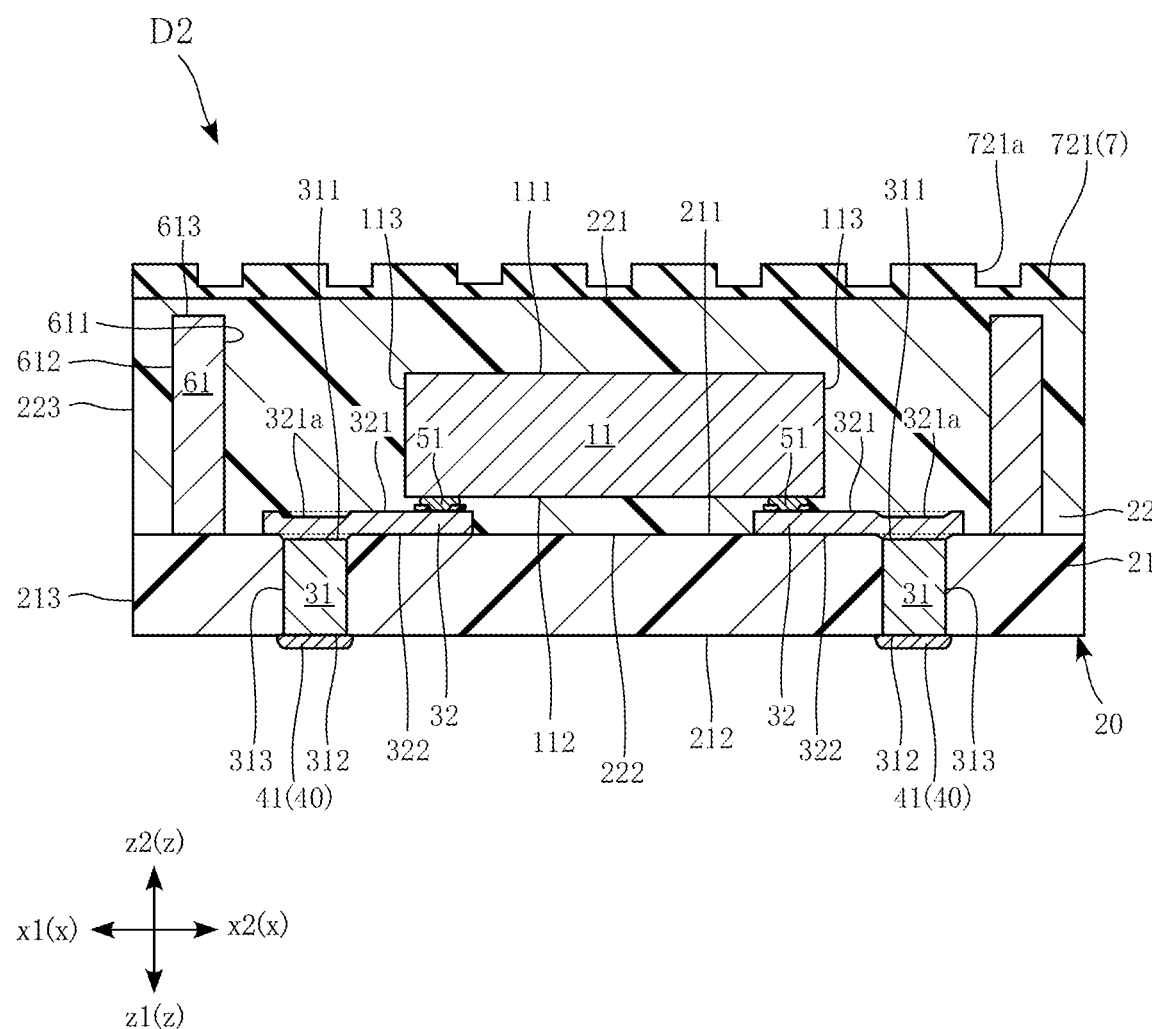
FIG. 53 is a cross-sectional view taken along a line LIII-LIII in FIG. 52.

FIG. 52 and FIG. 53 illustrate a terahertz device according to a first variation of the fourth embodiment. The terahertz device D2 according to the first variation is different from the terahertz device D1, in the configuration of the electromagnetic wave controller 7. FIG. 52 is a plan view showing the terahertz device D2. FIG. 53 is a cross-sectional view taken along a line LIII-LIII in FIG. 52.

In this variation, a photonic crystal structure is integrated in the terahertz device D2, as the electromagnetic wave controller 7. Here, the photonic crystal refers to a structure in which two or more types of optical materials (or one material and air) are periodically arranged.

The terahertz device D2 includes a dielectric member 721, formed on the second resin layer obverse face 221 of the second resin layer 22. The dielectric member 721 is, for example, formed of a silicon oxide film, without limitation thereto. The dielectric member 721 includes a plurality of recesses 721a, formed on the surface thereof (oriented to z2-side, i.e., same direction in which the second resin layer obverse face 221 is oriented). The plurality of recesses 721a each have, for example, a circular shape in a plan view, and are arranged in a dot pattern. The arrangement of the plurality of recesses 721a is not limited to the dot pattern, provided that the electromagnetic wave controller 7 is configured as a photonic crystal structure. A part of the plurality of recesses 721a arranged in the dot pattern overlaps, as shown in FIG. 53, with the terahertz element 11 in a plan view. Further, a part of the plurality of recesses 721a arranged in the dot pattern overlaps, as shown in FIG. 53, with the region surrounded by the frame-shaped conductor 61, in a plan view.

In the terahertz device D2, the plurality of recesses 721a are arranged so as to cause the electromagnetic wave controller 7 to act as a frequency filter. However, the arrangement of the plurality of recesses 721a is not limited thereto. For example, the plurality of recesses 721a may be arranged so as to cause the electromagnetic wave controller 7 to act as a resonator of a high quality factor, or a member that performs distribution control. For example, the periodicity of the arrangement shown in FIG. 53 may be disturbed, by excluding one to three pieces of recesses 721a close to the center. In this case, the electromagnetic wave controller 7 acts as a resonator of a high quality factor. Further, when the periodicity is slowly changed (spacing between adjacent recesses 721a is slowly changed), the electromagnetic wave controller 7 acts as a distribution control member.

The terahertz device D2 also provides the advantageous effects similar to those provided by the terahertz device D1. In this variation, the electromagnetic wave controller 7 includes the dielectric member 721, in which the plurality of recesses 721a are arranged in a predetermined pattern (see FIG. 52 and FIG. 53). Such a configuration allows the electromagnetic wave controller 7 to act as a frequency filter. In this case, the electromagnetic wave controller 7 can control the frequency of the terahertz wave emitted from the terahertz element 11.

Although the electromagnetic wave controller 7 according to this variation includes the plurality of recesses formed in the dielectric member 721, and arranged as the photonic crystal structure, the present disclosure is not limited to the above. For example, the plurality of recesses arranged as the photonic crystal structure may be directly formed on the second resin layer 22. In this case also, similar advantageous effects to those provided by the terahertz device D2 can be attained.

Figure 54:
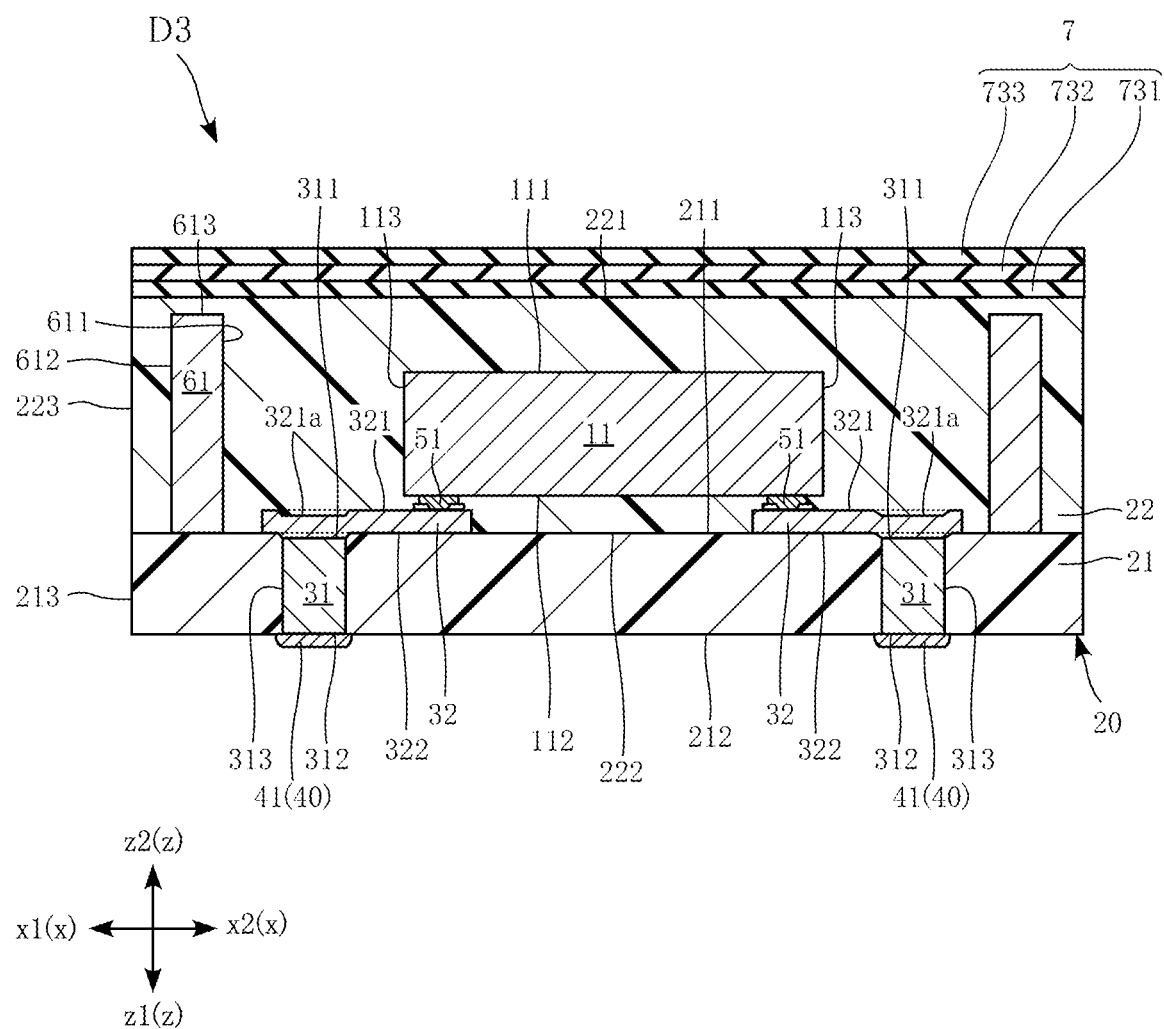
FIG. 54 is a cross-sectional view showing a terahertz device according to a second variation of the fourth embodiment.

FIG. 54 illustrates a terahertz device according to a second variation of the fourth embodiment. The terahertz device D3 according to the second variation is different from the terahertz devices D1 and D2, in the configuration of the electromagnetic wave controller 7. FIG. 54 is a cross-sectional view of the terahertz device D3, corresponding to the cross-section of the terahertz device D1 shown in FIG. 51.

In this variation, a layered structure in which a plurality of thin films, different from one another in refractive index, are stacked is integrated in the terahertz device D3, as the electromagnetic wave controller 7. The electromagnetic wave controller 7 according to this variation includes, as shown in FIG. 54, a first thin film 731 stacked on the second resin layer obverse face 221, a second thin film 732 stacked on the first thin film 731, and a third thin film 733 stacked on the second thin film 732. The first thin film 731, the second thin film 732, and the third thin film 733 overlap with the terahertz element 11, in a plan view. The first thin film 731, the second thin film 732, and the third thin film 733 overlap with the region surrounded by the frame-shaped conductor 61, in a plan view. Although three layers of thin film are provided in the example shown in FIG. 54, the number of thin films is not specifically limited. The refractive index of the first thin film 731, the second thin film 732, and the third thin film 733 can be expressed as $n_{731}$, $n_{732}$, and $n_{733}$, respectively, when the refractive index of the encapsulating resin 20 is $n_{20}$. In this embodiment, the electromagnetic wave controller 7 controls the terahertz wave, emitted from the terahertz element 11 and outputted from the terahertz device D3, by thus varying the refractive index of the plurality of thin films. The combination of the refractive indices $n_{731}$, $n_{732}$, and $n_{733}$ of the respective thin films may be altered, so as to output an appropriate terahertz wave.

The terahertz device D3 also provides the advantageous effects similar to those provided by the terahertz device D1.

Figure 55:
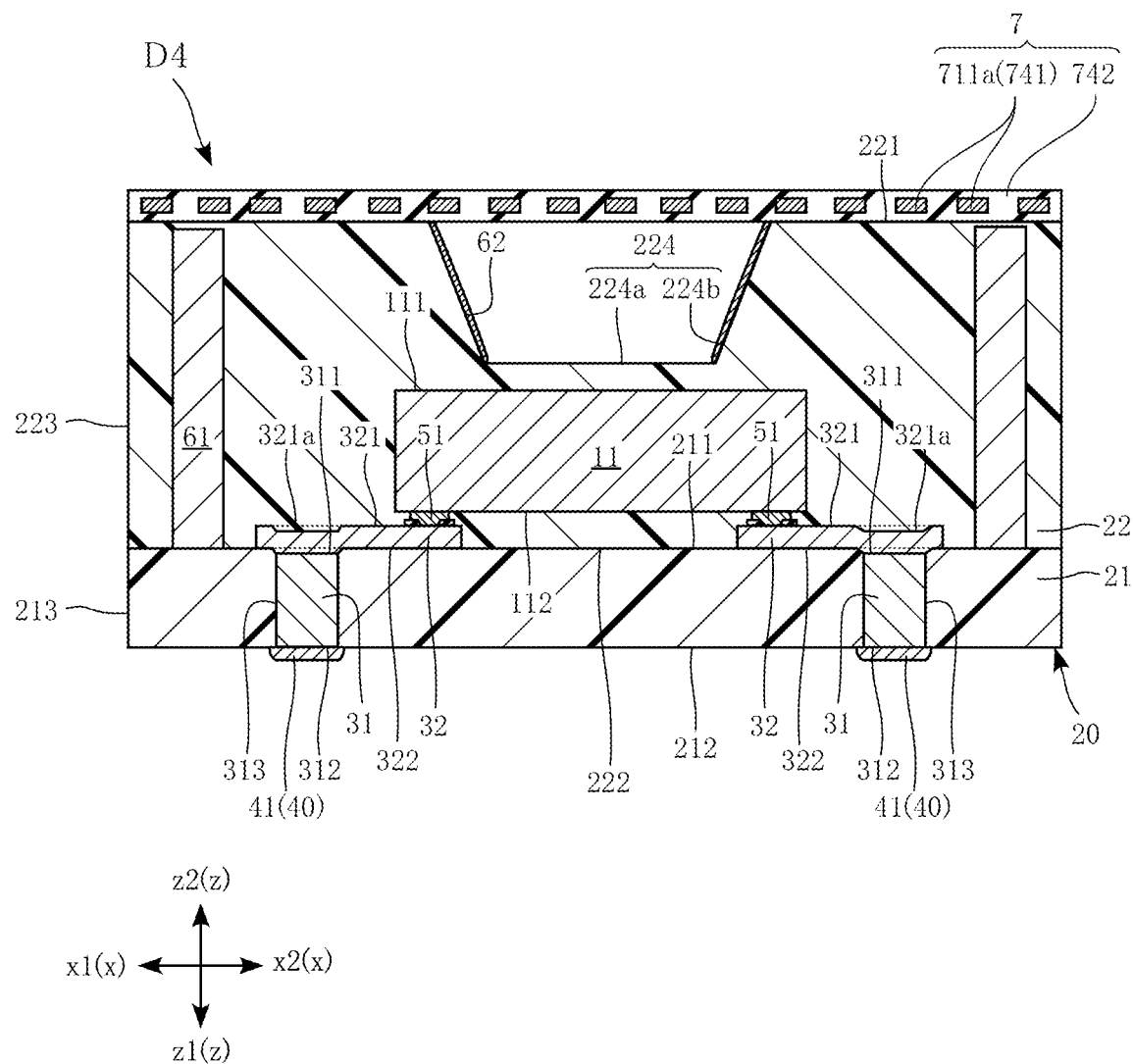
FIG. 55 is a cross-sectional view showing a terahertz device according to a third variation of the fourth embodiment.

FIG. 55 illustrates a terahertz device according to a third variation of the fourth embodiment. The terahertz device D4 according to the third variation is different from the terahertz device D3, in that the electromagnetic wave controller 7 is formed on the second resin layer 22 in which the recess 224 is formed. FIG. 55 is a cross-sectional view of the terahertz device D4, corresponding to the cross-section of the terahertz device D1 shown in FIG. 51.

In this variation, the electromagnetic wave controller 7 includes a pattern layer 741 and a dielectric member 742. The pattern layer 741 is configured similarly to the pattern layer 711 of the terahertz device D1. Accordingly, the pattern layer 741 includes a plurality of metal members 711a. The dielectric member 742 covers the pattern layer 741. The dielectric member 742 may be a sheet formed of a dielectric material, or a dielectric substrate. The dielectric member 742 may be formed of the same material as that of the dielectric member 721 of the terahertz device D2. The dielectric member 742 is formed on the second resin layer obverse face 221, so as to also close the recess 224 in the second resin layer 22. In this variation, therefore, the recess 224 in the second resin layer 22 is a void. Here, the electromagnetic wave controller 7 according to this variation may include a plurality of pattern layers 741 stacked on each other. In this case, the plurality of pattern layers 741 are stacked in the z-direction, and the dielectric member 742 is interposed between each pair of the pattern layers 741.

The terahertz device D4 also provides the advantageous effects similar to those provided by the terahertz device D1.

Figure 56:
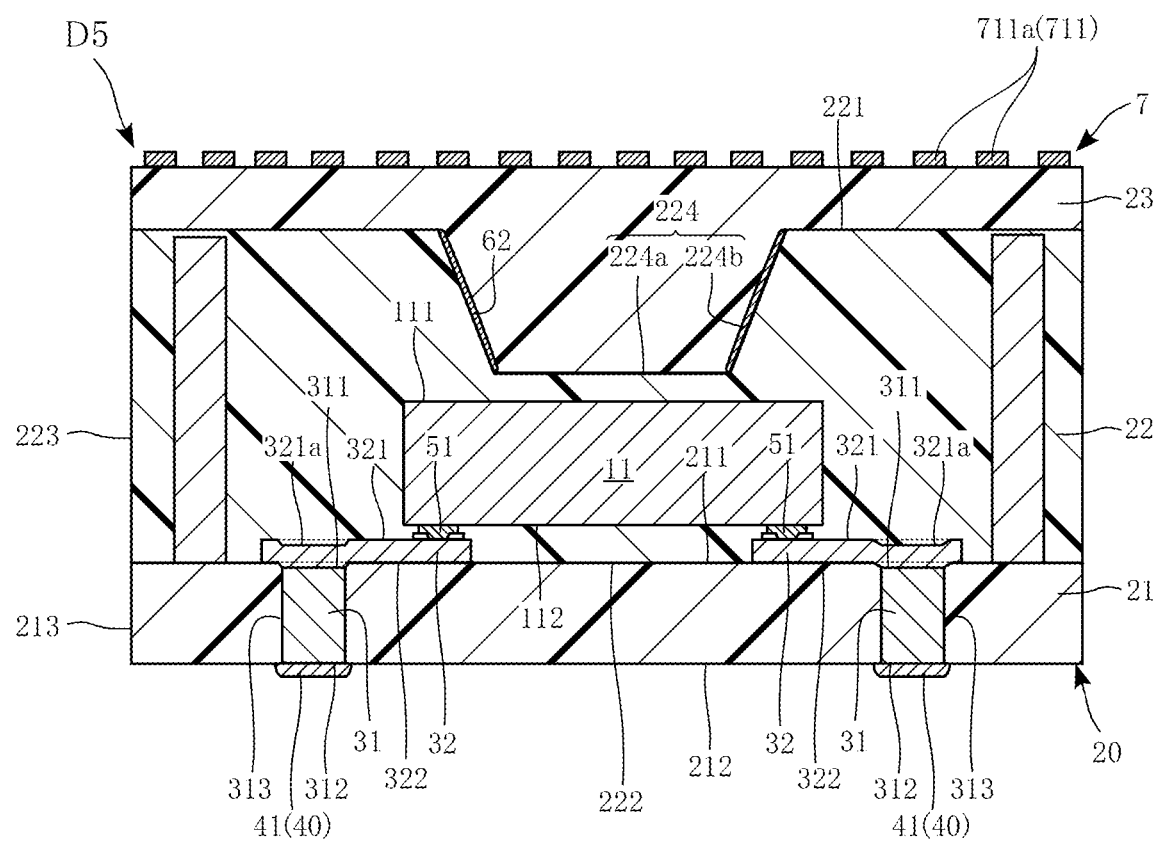
FIG. 56 is a cross-sectional view showing a terahertz device according to a fourth variation of the fourth embodiment.

FIG. 56 illustrates a terahertz device according to a fourth variation of the fourth embodiment. The terahertz device D5 according to the fourth variation is different from the terahertz device D4, in further including a third resin layer 23. FIG. 56 is a cross-sectional view of the terahertz device D5, corresponding to the cross-section of the terahertz device D1 shown in FIG. 51.

The third resin layer 23 is formed on the second resin layer 22. A part of the third resin layer 23 is filled in the recess 224 in the second resin layer 22. On the third resin layer 23, the electromagnetic wave controller 7 is provided. The third resin layer 23 is interposed between the second resin layer 22 and the electromagnetic wave controller 7.

In this variation, the electromagnetic wave controller 7 is, like the terahertz device D1 (see FIG. 50 and FIG. 51), formed of the pattern layer 711 including the plurality of metal members 711a. Although the electromagnetic wave controller 7 shown in FIG. 56 is without the protective layer 712, unlike the terahertz device D1, the electromagnetic wave controller 7 may include the protective layer 712 as in the terahertz device D1.

The terahertz device D5 also provides the advantageous effects similar to those provided by the terahertz device D1.

Although the pattern layer 711 is formed on the third resin layer 23 in the terahertz device D5, the present disclosure is not limited to the above. The pattern layer 711 may be buried in the third resin layer 23. When the pattern layer 711 is buried in the third resin layer 23, the terahertz device D5 may include a plurality of pattern layers 711. In this case, each of the pattern layers 711 may be buried in the third resin layer 23. Alternatively, the uppermost one of the pattern layers 711 (farthest on the z2-side) may be formed on the third resin layer 23 so as to be exposed therefrom, while the remaining pattern layers 711 on the lower side (on the z1-side) are buried in the third resin layer 23.

Hereunder, other variations of the terahertz device according to the present disclosure will be described. The following variations may be combined as desired.

In the terahertz device according to the present disclosure, the configuration of the external electrodes 40 is not limited to the examples according to the first embodiment to the fourth embodiment. For example, the external electrodes 40 may each be a spherical solder bump (solder ball). FIG. 57 illustrates the terahertz device A1 according to the first embodiment, but in which the external electrodes 40 (columnar conductor shields 41) are each formed of a solder ball. FIG. 57 is a cross-sectional view of the terahertz device according to such variation, corresponding to the cross-section shown in FIG. 4. The configuration shown in FIG. 57 is merely exemplary, and the external electrode 40 may be formed of the solder ball, in the terahertz devices according to the first embodiment to the fourth embodiment, and the variations thereof. Further, the wiring layer shield 42 of the external electrode 40 may be formed of the solder ball.

Figure 58:
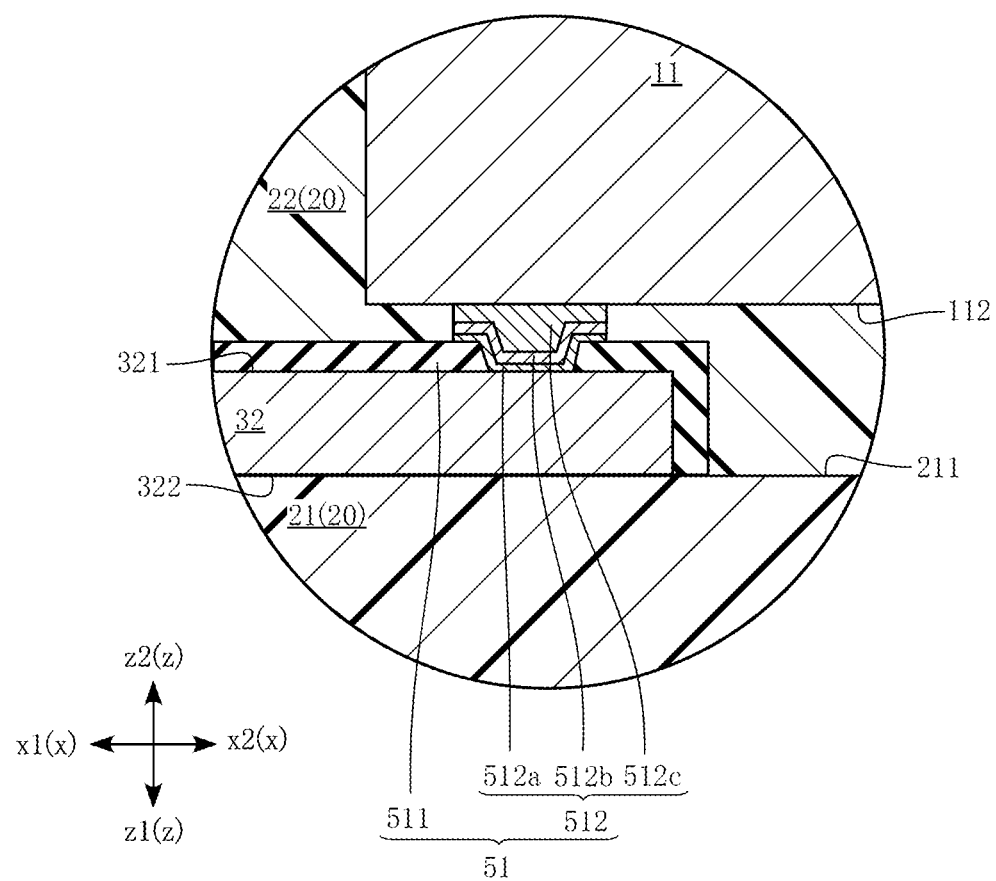
FIG. 58 is a cross-sectional view showing a variation of a bonding section.

In the terahertz device according to the present disclosure, the configuration of the bonding sections 51 is not limited to the examples according to the first embodiment to the fourth embodiment. FIG. 58 illustrates the terahertz device A1 according to the first embodiment, but with a different configuration of the bonding section 51. FIG. 58 is a partially enlarged cross-sectional view of the terahertz device according to such variation, corresponding to the partially enlarged cross-sectional view of FIG. 5. In the bonding section 51 according to this variation, the insulation layer 511 is, for example, formed of solder resist covering the wiring layer 32. The insulation layer 511 includes an opening formed at a position on the wiring layer 32. The bonding layer 512 is partially filled in the opening formed in the insulation layer 511. In the bonding layer 512, the first layer 512a is, for example, formed of an underlying layer and a plated layer stacked on each other. The underlying layer includes a Ti layer and a Cu layer for example, and the plated layer is formed of a metal containing Cu, for example. The second layer 512b is, for example, formed of a metal containing Ni. The third layer 512c is, for example, formed of an alloy containing Sn. Examples of such alloy include lead-free solder such as a Sn—Sb-based alloy or a Sn—Ag-based alloy. The configuration shown in FIG. 58 is merely exemplary, and the bonding section 51 may be formed as shown in FIG. 58, in the terahertz devices according to the first embodiment to the fourth embodiment, and the variations thereof. Likewise, in the terahertz device according to the present disclosure, the configuration of the bonding section 52 is not limited to the example according to the second embodiment, and the bonding section 52 may also be configured in the same way as the bonding section 51 shown in FIG. 58.

The terahertz device according to the present disclosure may be without the frame-shaped conductor 61. However, from the viewpoint of improving the emission quality and reception quality of the terahertz wave, it is preferable to provide the frame-shaped conductor 61.

In the terahertz device according to the present disclosure, the element obverse face 111 of the terahertz element 11 may be exposed from the second resin layer obverse face 221 of the second resin layer 22. Such a configuration can be obtained, for example, by grinding the second resin layer 822 until the element obverse face 811a of the terahertz element 811 is exposed, in the second resin layer grinding process. In the case of this variation, since the element obverse face 111 of the terahertz element 11 is exposed to outside of the terahertz device, it is preferable to form a protective film that covers the element obverse face 111. Since the second resin layer 22 is ground until the element obverse face 111 of the terahertz element 11 is exposed in this variation, the thickness of the second resin layer 22 (size in z-direction) can be reduced. Therefore, the thickness of the terahertz device (size in z-direction) can be reduced, which leads to reduction in size of the terahertz device. Further, since the element obverse face 111 of the terahertz element 11 is exposed from the second resin layer 22, the heat dissipation efficiency from the terahertz element 11 can be improved.

In the terahertz device according to the present disclosure, the footprint of the wiring layers 32 and the footprint of the wiring layers 33 are not limited to the examples according to the first embodiment to the fourth embodiment. The footprint may be modified as desired depending on, for example, the number and position of the electrode pads of the terahertz element 11, the number and position of the electrode pads of one or more electronic parts 16, the electrical conduction path between the terahertz element 11 and the one or more electronic parts 16, and the number and position of the terminals of the terahertz device (external electrodes 40).

Figure 59:
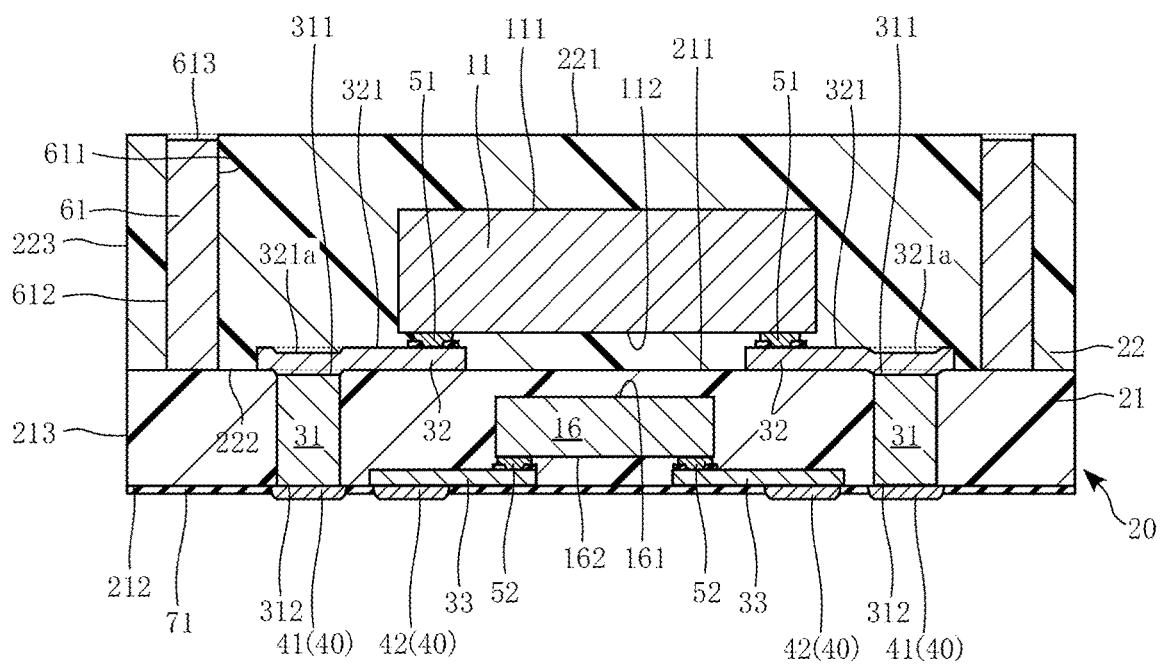
FIG. 59 is a cross-sectional view showing another variation of the external electrode.

In the terahertz device according to the present disclosure, the configuration of the external electrodes 40 is not limited to the examples according to the first embodiment to the fourth embodiment. FIG. 59 illustrates an example in which the external electrodes 40 include both of the columnar conductor shields 41 and the wiring layer shields 42. FIG. 60 illustrates the terahertz device B1 according to the second embodiment, but in which the external electrodes 40 do not include the wiring layer shield 42, but only include the columnar conductor shields 41. FIG. 59 and FIG. 60 are cross-sectional views of the terahertz device according to this variation, corresponding to the cross-section shown in FIG. 24. In the example shown in FIG. 59, the columnar conductor 31 is not located on the wiring layer 33, and the terahertz element 11 and the electronic parts 16 are not electrically connected to each other, inside the terahertz device. The terahertz element 11 is electrically connected to the columnar conductor shield 41 (external electrode 40), via the bonding section 51, the wiring layer 32, and the columnar conductor 31. The electronic parts 16 are each electrically connected to the wiring layer shield 42 (external electrode 40), via the bonding section 52 and the wiring layer 33. In the terahertz device shown in FIG. 59, therefore, the columnar conductor shields 41 each serve as the terminal electrically connected to the terahertz element 11, and the wiring layer shields 42 each serve as the terminal electrically connected to the electronic parts 16. In the example shown in FIG. 60, in contrast, the columnar conductors 31 include a plurality of columnar bodies 31A and 31B. The columnar bodies 31A are each formed so as to penetrate through the first resin layer 21 in the z-direction, from the first resin layer obverse face 211 to the first resin layer reverse face 212. The columnar bodies 31B are each formed on the wiring layer 33, and connected to the wiring layer 32. The terahertz element 11 is electrically connected to the columnar conductor shield 41 (external electrode 40), via the bonding section 51, the wiring layer 32, and the columnar body 31A. The electronic parts 16 are each electrically connected to the columnar conductor shield 41 (external electrode 40), via the bonding section 52, the wiring layer 33, the columnar body 31B, the wiring layer 32, and the columnar body 31A. In the terahertz device shown in FIG. 60, therefore, the columnar conductor shields 41 (external electrodes 40) each serve as the terminal electrically connected to both of the terahertz element 11 and the electronic parts 16. Although the example shown in FIG. 60 is without the frame-shaped conductor 61, the frame-shaped conductor 61 may be additionally provided.

Although the frame-shaped conductor 61 in the terahertz device according to the present disclosure has a rectangular ring shape in a plan view, the plan-view shape of the frame-shaped conductor 61 is not specifically limited, provided that the inner face 611 of the frame-shaped conductor 61 can serve as the resonance surface. FIG. 61 to FIG. 66 each illustrate a different shape of the frame-shaped conductor 61 that may be adopted in the terahertz device according to the present disclosure. FIG. 61 to FIG. 66 are plan views showing the terahertz device according to such variations, in which the second resin layer 22 is not shown. The shapes of the frame-shaped conductor 61 shown in the respective drawings are merely exemplary.

Figure 61:
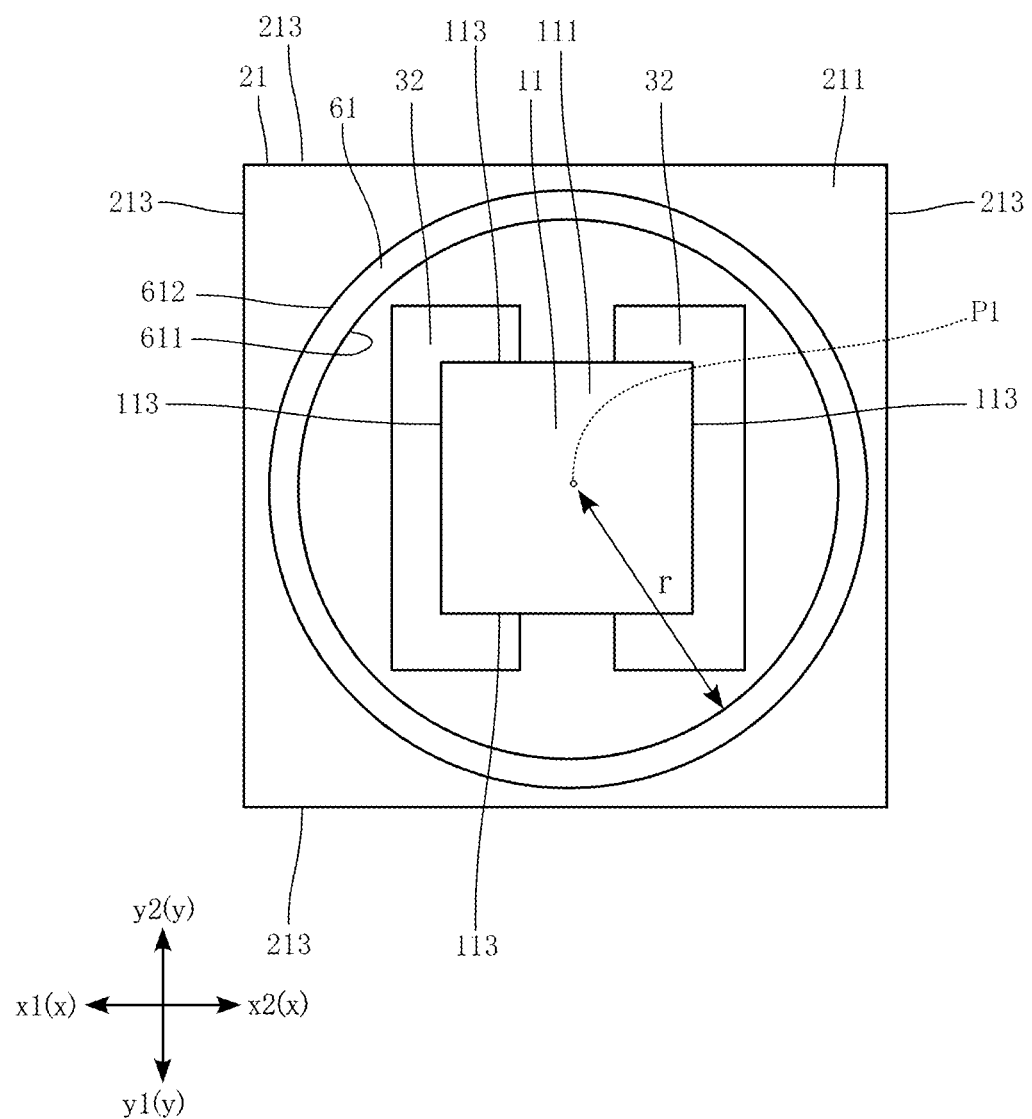
FIG. 61 is a plan view showing a variation of a frame-shaped conductor.

FIG. 61 represents the case where the plan-view shape of the frame-shaped conductor 61 is a circular ring. In this variation, the radius r of the inner face 611 of the frame-shaped conductor 61, in a plan view, is an integer multiple of a quarter of the wavelength λ of the terahertz wave, in other words an integer multiple of λ/4. When the frame-shaped conductor 61 has a circular ring shape in a plan view also, the frame-shaped conductor 61 can act as an electromagnetic shield, and therefore ambient noise resistance can be improved, and crosstalk can be suppressed. It is not mandatory that the plan-view shape of frame-shaped conductor 61 is a generally perfect circle as shown in FIG. 61, but may be, for example, an elliptical ring. Further, in the case where the antenna integrated in the terahertz element 11 has a structure that does not depend on the polarization in a specific direction, forming the frame-shaped conductor 61 in a circular ring shape in a plan view enables the electromagnetic wave from all directions to be efficiently received.

Figure 62:
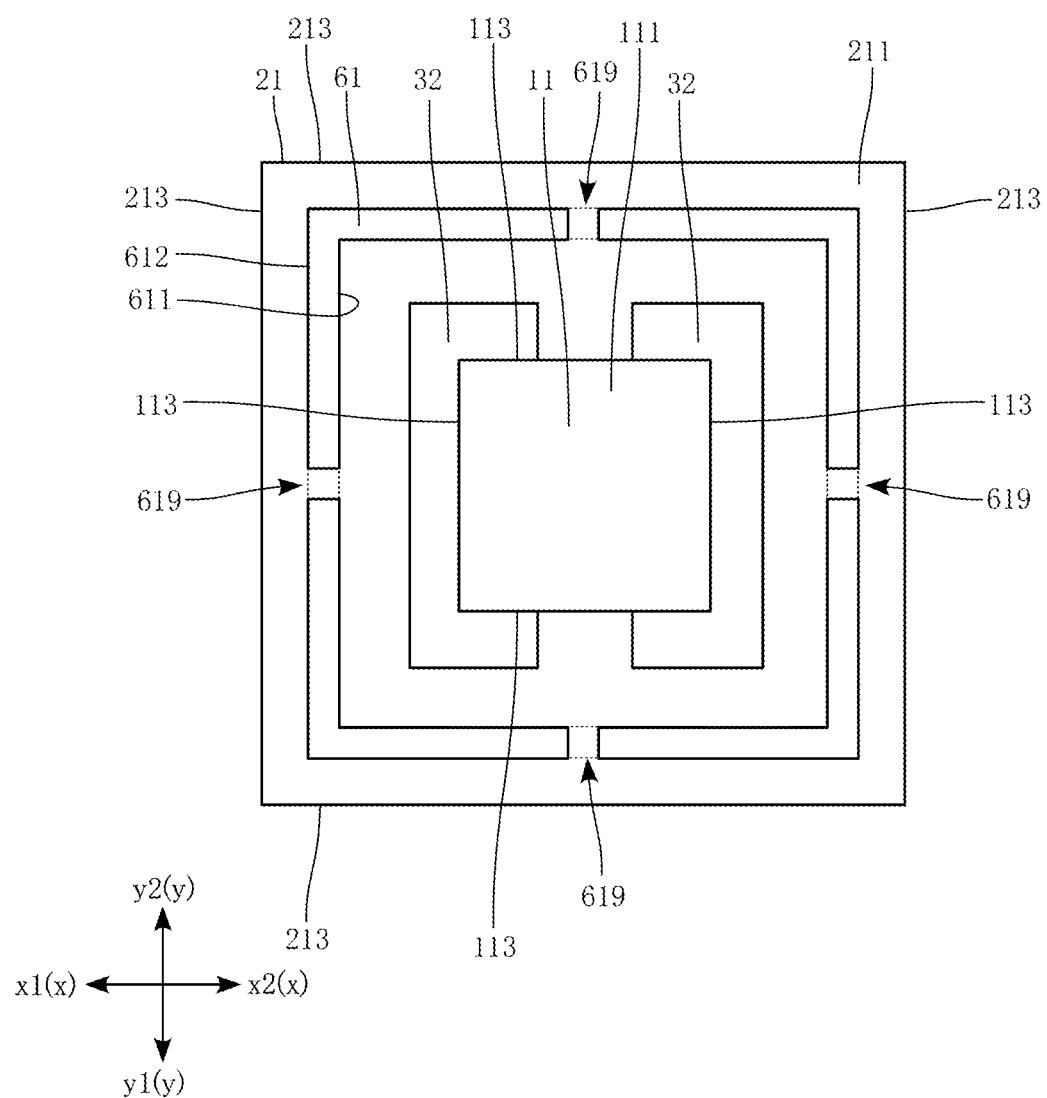
FIG. 62 is a plan view showing another variation of the frame-shaped conductor.
Figure 63:
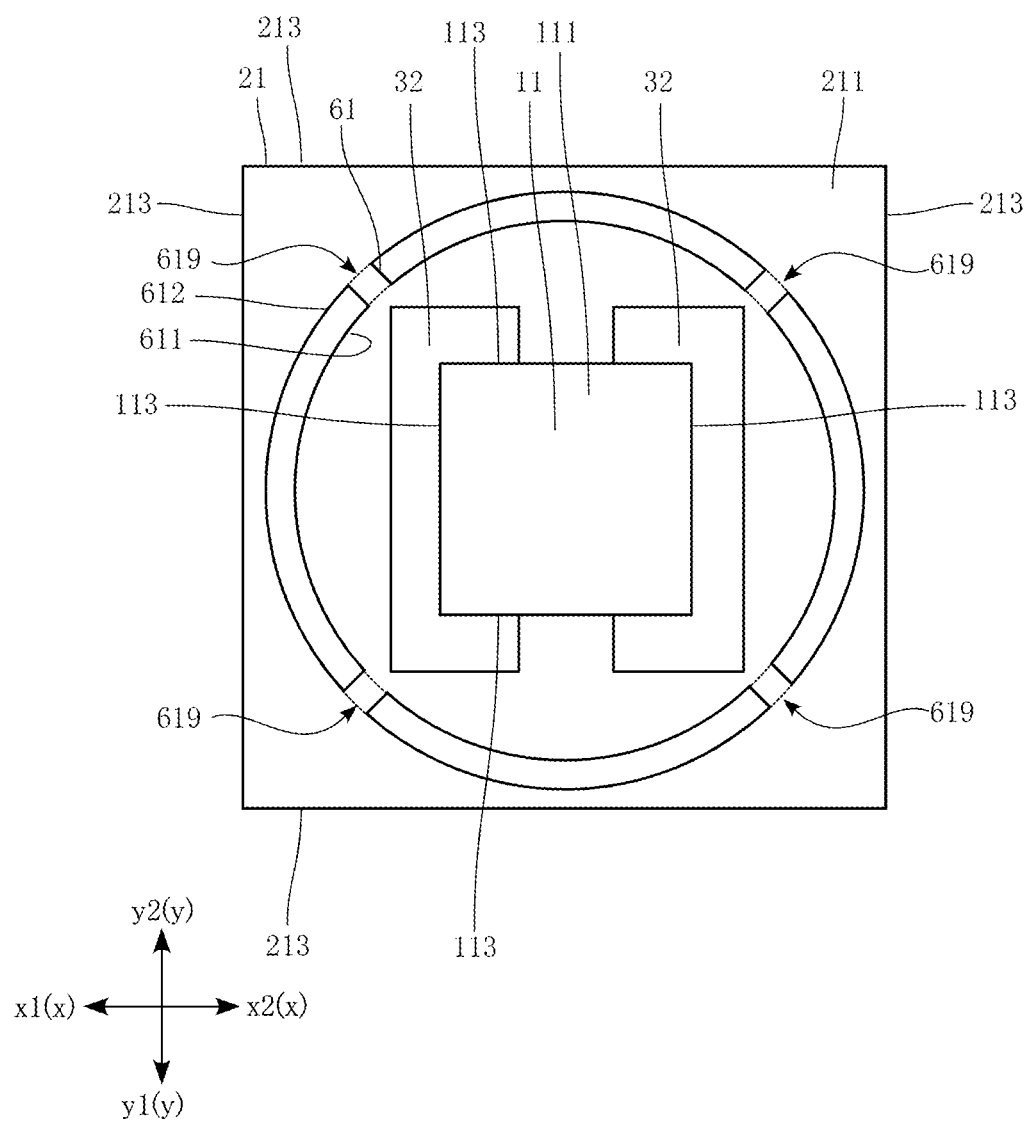
FIG. 63 is a plan view showing another variation of the frame-shaped conductor.

FIG. 62 and FIG. 63 each illustrate the case where the frame-shaped conductor 61 is not continuous as a whole in a plan view, but includes one or more slits 619. In the examples shown in FIG. 62 and FIG. 63, the one or more slits 619 are symmetrically arranged in a plan view, with respect to the oscillation point of the terahertz wave, namely the central position P1 of the terahertz element 11. In FIG. 62, the one or more slits 619 are formed in the frame-shaped conductor 61 of the rectangular ring shape in a plan view. In FIG. 63, the one or more slits 619 are formed in the frame-shaped conductor 61 of the circular ring shape in a plan view. Although four slits 619 are formed in each of FIG. 62 and FIG. 63, the number of slits 619 to be formed is not specifically limited. Such configurations also allow the terahertz wave emitted from the terahertz element 11 to perform resonance reflection at the inner face 611 of the frame-shaped conductor 61, thereby facilitating noise reduction and gain improvement, with respect to the terahertz wave emitted from the terahertz device according to this variation.

Figure 64:
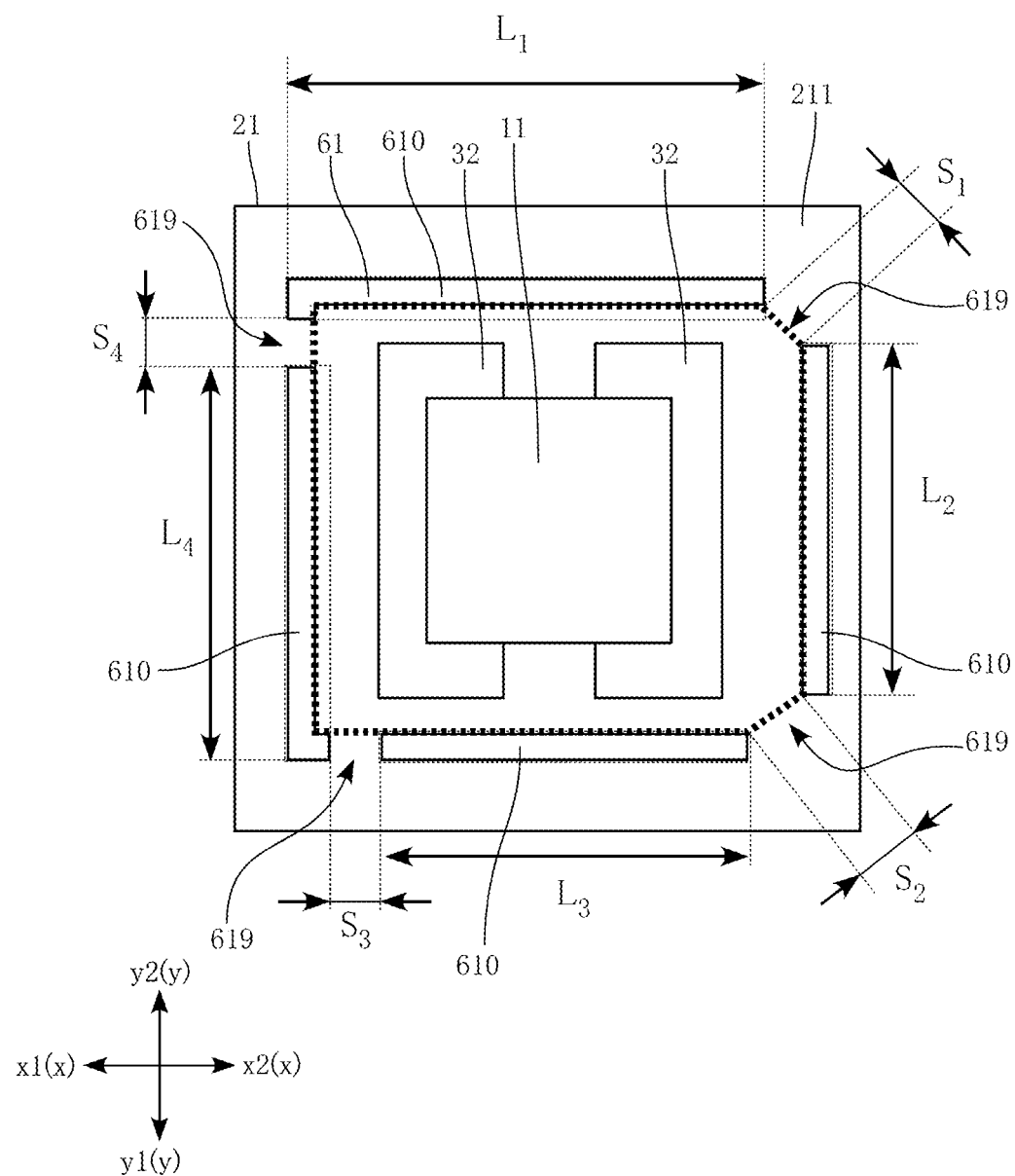
FIG. 64 is a plan view showing another variation of the frame-shaped conductor.
Figure 65:
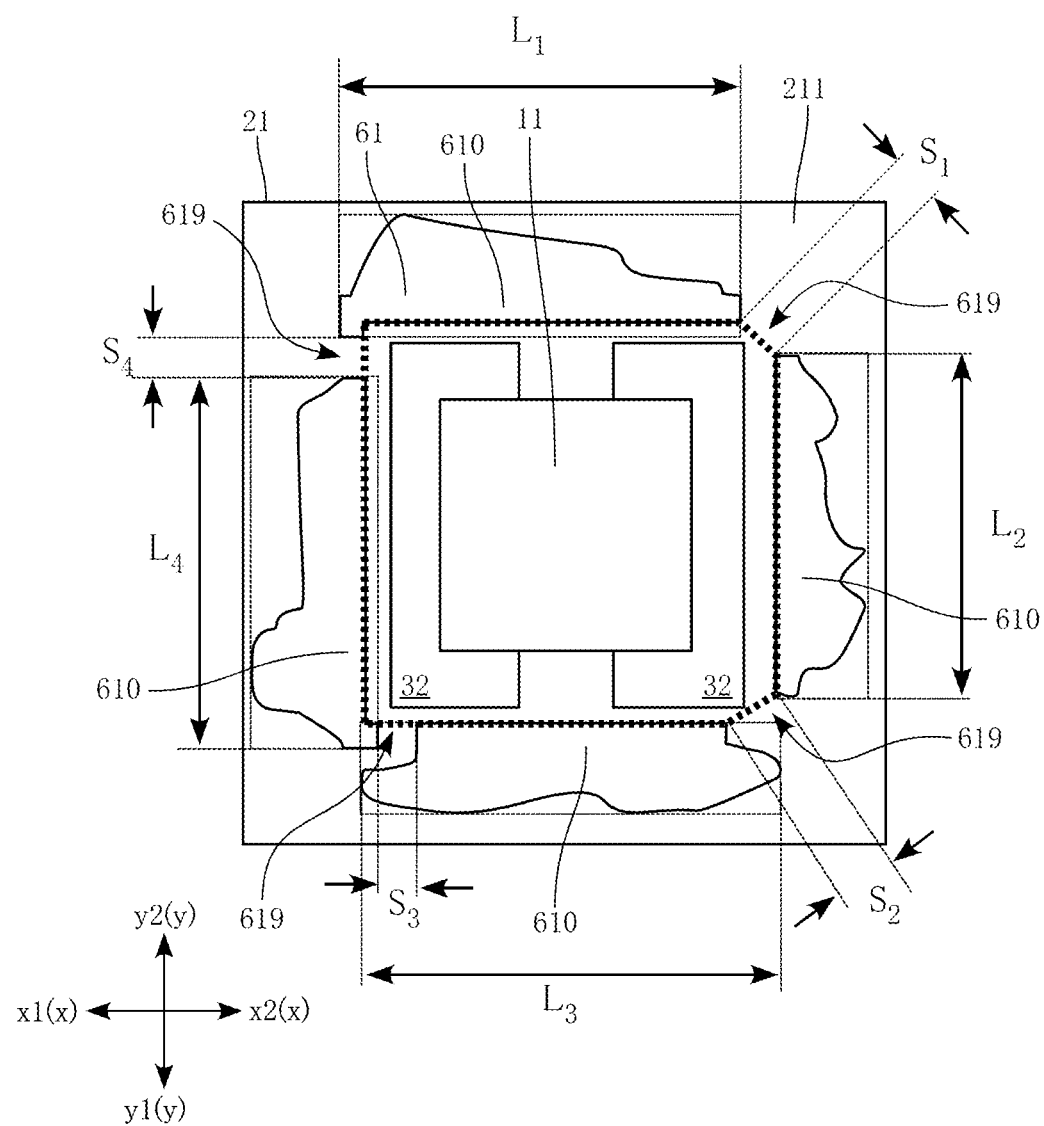
FIG. 65 is a plan view showing another variation of the frame-shaped conductor.

FIG. 64 also illustrates the frame-shaped conductor 61 including one or more slits 619, similarly to FIG. 62 and FIG. 63. However, unlike the examples shown in FIG. 62 and FIG. 63, the one or more slits 619 are not symmetrically arranged with respect to the oscillation point of the terahertz wave. In the variation shown in FIG. 64, the frame-shaped conductor 61 includes a plurality of individual metal pieces 610, divided by the plurality of slits 619. Although the configuration of the plurality of individual metal pieces 610 is not specifically limited, it is preferable to arrange so as to allow the inner face 611 of the frame-shaped conductor 61 to qualitatively reflect the terahertz wave from the terahertz element 11. In other words, the plurality of individual metal pieces 610 may preferably be arranged so as to allow the frame-shaped conductor 61 to act as the resonator that resonates the terahertz wave from the terahertz element 11. To allow the frame-shaped conductor 61 to thus act as the resonator, the plurality of individual metal pieces 610 may be arranged, for example, as described hereunder.

Referring first to FIG. 64, a square of a smallest area surrounding the individual metal piece 610 in a plan view (fine dot lines in FIG. 64) is conceived, with respect to each of the individual metal pieces 610. The length of the conceived square in the longitudinal direction will be defined as a length $L_i$ of the individual metal pieces 610. Here, i represents positive integers (i=1, 2, . . . , n), and n represents the number of individual metal pieces 610. Since four individual metal pieces 610 are provided in FIG. 64, i represents 1, 2, 3, and 4. In addition, a shortest separation distance between two individual metal pieces 610 spaced across one slit 619 will be defined as a separation distance $S_i$. To define the separation distance $S_i$, a closed loop surrounding the terahertz element 11, and connecting the plurality of individual metal pieces 610 by passing therethrough, is conceived. The closed loop thus conceived does not cross the terahertz element 11, and has a shortest length. In the example shown in FIG. 64, such closed loop corresponds to the route indicated by a bold dot line. Now, the distance between the individual metal pieces 610 on the closed loop conceived as above corresponds to the separation distance $S_i$ between two individual metal pieces 610. When the length $L_i$ of the individual metal pieces 610 and the separation distance $S_i$ between two individual metal pieces 610 are defined as above, the plurality of individual metal pieces 610 are configured so as to satisfy $S_0/L_0<1$, where $L_0$ is expressed as $\Sigma L_i = L_1 + L_2 + \ldots + L_i + \ldots + L_n$, and $S_0$ is expressed as $\Sigma S_i = S_1 + S_2 + \ldots + S_i + \ldots + S_n$. In other words, the plurality of individual metal pieces 610 are configured such that the total sum of the lengths $L_i$ of the plurality of individual metal pieces 610 becomes larger than the total sum of the separation distances $S_i$. Such a configuration allows the terahertz wave from the terahertz element 11 to perform resonance reflection at the inner face 611 of the frame-shaped conductor 61, thereby facilitating noise reduction and gain improvement, with respect to the terahertz wave emitted from the terahertz device according to this variation. Even when the frame-shaped conductor 61 is formed, for example, in the plan-view shape shown in FIG. 65, forming the plurality of individual metal pieces 610 so as to satisfy the mentioned conditions equally facilitates noise reduction and gain improvement, with respect to the terahertz wave emitted from the terahertz device according to this variation.

Figure 66:
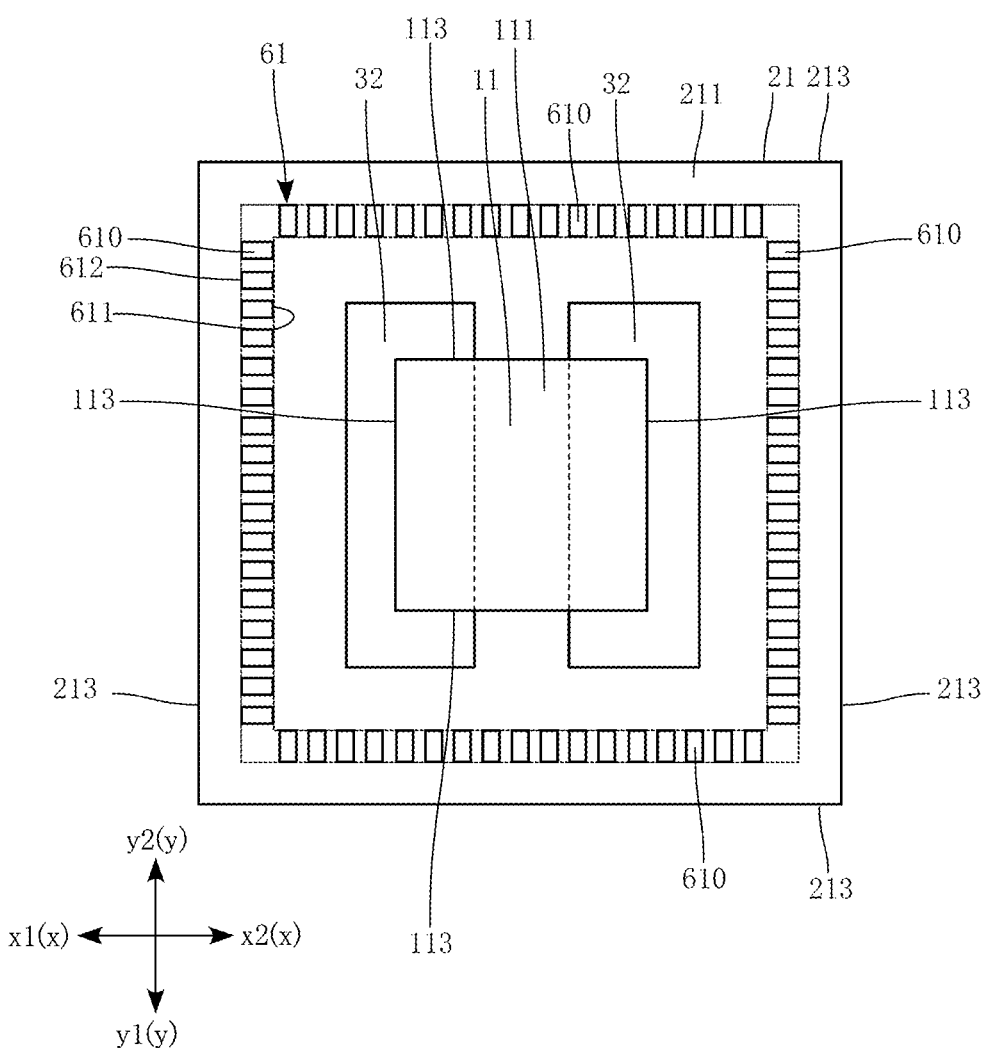
FIG. 66 is a plan view showing another variation of the frame-shaped conductor.

FIG. 66 illustrates the case where the frame-shaped conductor 61 is composed of a plurality of minute individual metal pieces 610, each having generally the same shape, and aligned so as to form a rectangular ring shape. The plurality of minute individual metal pieces 610 may be aligned in a circular ring shape, unlike the example shown in FIG. 66. In the example shown in FIG. 66, the plurality of individual metal pieces 610 are configured such that, for example, the length $L_i$ of the individual metal pieces 610 satisfies $L_i < \lambda/8$ ($\lambda$ represents the wavelength of terahertz wave), and that the separation distance $S_i$ between the individual metal pieces 610 satisfies $S_i \leq 2L_i$. With the frame-shaped conductor 61 shown in FIG. 66 also, the terahertz wave performs resonance reflection at the inner face 611 of the frame-shaped conductor 61, in other words the frame-shaped conductor 61 qualitatively acts as the resonator, and therefore noise reduction and gain improvement can be attained, with respect to the terahertz wave emitted from the terahertz device according to this variation. Although the individual metal pieces 610 shown in FIG. 66 each have a rectangular shape in a plan view, the plan-view shape of the individual metal pieces 610 is not specifically limited, provided that the aforementioned conditions are satisfied.

The terahertz device and the manufacturing method thereof according to the present disclosure are not limited to the foregoing embodiments. The specific configuration of the elements of the terahertz device according to the present disclosure, and the specific works to be performed in the manufacturing process of the terahertz device according to the present disclosure may be modified in various manners.

The terahertz device and the manufacturing method thereof according to the present disclosure encompass the embodiments defined as the following appendices.

[Appendix 1]

A terahertz device comprising:

a first resin layer having a first resin layer obverse face and a first resin layer reverse face that are spaced apart from each other in a first direction;

a first conductor having a first conductor obverse face oriented in a same direction as the first resin layer obverse face, and a first conductor reverse face oriented in a same direction as the first resin layer reverse face, the first conductor penetrating through the first resin layer in the first direction;

a first wiring layer spanning between the first resin layer obverse face and the first conductor obverse face;

a terahertz element having an element obverse face oriented in the same direction as the first resin layer obverse face, and an element reverse face oriented in the same direction as the first resin layer reverse face, the terahertz element being configured to convert between a terahertz wave and electric energy;

a second resin layer having a second resin layer obverse face oriented in the same direction as the first resin layer obverse face, and a second resin layer reverse face oriented in the same direction as the first resin layer obverse face, the second resin layer covering the first wiring layer and the terahertz element; and an external electrode disposed offset with respect to the first resin layer in a direction in which the first resin layer reverse face faces, the external electrode being electrically connected to the first conductor, wherein the terahertz element is conductively bonded to the first wiring layer.

[Appendix 2]

The terahertz device according to appendix 1, wherein the element reverse face is an active surface that emits or receives the terahertz wave.

[Appendix 3]

The terahertz device according to appendix 1 or appendix 2, wherein the second resin layer includes a recess receding from the second resin layer obverse face in the first direction, the recess includes a bottom face and an intermediary face, the bottom face is oriented in the same direction as the second resin layer obverse face, and the intermediary face is connected to the bottom face and the second resin layer obverse face.

[Appendix 4]

The terahertz device according to appendix 3, further including a metal film covering the intermediary face.

[Appendix 5]

The terahertz device according to appendix 3 or appendix 4, wherein the recess overlaps with the terahertz element as viewed in the first direction.

[Appendix 6]

The terahertz device according to any one of appendix 1 to appendix 5, further including a second conductor penetrating through the second resin layer in the first direction, wherein the second conductor is located around the terahertz element as viewed in the first direction.

[Appendix 7]

The terahertz device according to appendix 6, wherein the second conductor surrounds the terahertz element as viewed in the first direction.

[Appendix 8]

The terahertz device according to appendix 6 or appendix 8, wherein the second conductor is spaced apart from the first wiring layer as viewed in the first direction.

[Appendix 9]

The terahertz device according to any one of appendix 6 to appendix 8, wherein the second conductor includes a second conductor obverse face oriented in the same direction as the second resin layer obverse face.

[Appendix 10]

The terahertz device according to appendix 9, wherein the second conductor obverse face is recessed with respect to the second resin layer obverse face.

[Appendix 11]

The terahertz device according to any one of appendix 1 to appendix 10, wherein the external electrode includes a first conductor shield covering the first conductor reverse face.

[Appendix 12]

The terahertz device according to any one of appendix 1 to appendix 10, further including a second wiring layer including a second wiring layer reverse face oriented in the same direction as the first resin layer reverse face, wherein the second wiring layer reverse face is exposed from the first resin layer.

[Appendix 13]

The terahertz device according to appendix 12, further including an electronic component different from the terahertz element, wherein the electronic component is conductively bonded to the second wiring layer and covered with the first resin layer.

[Appendix 14]

The terahertz device according to appendix 12 or appendix 13, wherein the second wiring layer further includes a second wiring layer obverse face oriented in the same direction as the first resin layer obverse face, and the first conductor reverse face is in contact with the second wiring layer obverse face.

[Appendix 15]

The terahertz device according to any one of appendix 12 to appendix 14, wherein the external electrode includes a second wiring layer shield covering the second wiring layer reverse face.

[Appendix 16]

The terahertz device according to appendix 15, further including a protective film covering a portion of the second wiring layer reverse face exposed from the external electrode.

[Appendix 17]

The terahertz device according to any one of appendix 1 to appendix 16, wherein a grinding mark is formed on the first resin layer obverse face.

[Appendix 18]

The terahertz device according to appendix 17, wherein the first conductor obverse face is recessed with respect to the first resin layer obverse face.

[Appendix 19]

The terahertz device according to any one of appendix 1 to appendix 18, further including a conductive bonding layer that bonds the terahertz element and the first wiring layer together, wherein the first wiring layer partially overlaps with the terahertz element as viewed in the first direction, and the conductive bonding layer is disposed between the element reverse face and the first wiring layer.

[Appendix 20]

A manufacturing method of a terahertz device, the method including:

preparing a support substrate having a substrate obverse face and a substrate reverse face spaced apart from each other in a first direction;

forming a first conductor on the substrate obverse face;

forming a first resin layer covering the first conductor;

forming a first conductor obverse face and a first resin layer obverse face each oriented in a same direction as the substrate obverse face in the first direction, by grinding the first resin layer from a side to which the substrate obverse face is oriented toward a side to which the substrate reverse face is oriented, and by exposing a part of the first conductor from the first resin layer;

forming a first wiring layer spanning between the first resin layer obverse face and the first conductor obverse face;

conductively bonding a terahertz element that converts between terahertz wave and electric energy on the first wiring layer;

forming a second resin layer covering the first wiring layer and the terahertz element;

exposing a first resin layer reverse face oriented in an opposite direction to the first resin layer obverse face in the first direction, by removing the support substrate; and forming an external electrode disposed offset with respect to the first resin layer in a direction in which the first resin layer reverse face is oriented, the external electrode being electrically connected to the first conductor.

[Appendix 21]

The method according to appendix 20, further comprising forming a second wiring layer covering a part of the substrate obverse face, after the support substrate preparing process and before the first conductor forming process, wherein the forming of the first conductor includes forming the first conductor on the second wiring layer.

[Appendix 22]

The method according to appendix 21, further including conductively bonding an electronic component different from the terahertz element on the second wiring layer.

[Appendix 23]

The method according to any one of appendix 20 to appendix 22, further comprising forming a second conductor on a part of the first resin layer, after the grinding of the first resin layer and before the forming of the second resin layer.

The invention claimed is:

1. A terahertz device comprising:
   a first resin layer having a first resin layer obverse face and a first resin layer reverse face that are spaced apart from each other in a first direction;
   a first conductor having a first conductor obverse face and a first conductor reverse face, the first conductor extending within the first resin layer in the first direction;
   a first wiring layer extending on the first resin layer obverse face and the first conductor obverse face;
   a terahertz element having an element obverse face and an element reverse face;
   a second resin layer having a second resin layer obverse face and a second resin layer reverse face that faces the first resin layer obverse face, the second resin layer covering at least the terahertz element; and
   an external electrode electrically connected to first conductor reverse face,
   wherein the terahertz element is electrically connected to the first wiring layer,
   wherein the element reverse face is an active surface that emits or receives a terahertz wave, and
   wherein a second conductor surrounds the terahertz element as viewed in the first direction.

2. The terahertz device according to claim 1, wherein the second resin layer includes a recess receding from the second resin layer obverse face in the first direction,
   the recess includes a bottom face and an intermediary face,
   the intermediary face is connected to the bottom face and the second resin layer obverse face.

3. The terahertz device according to claim 2, further comprising a metal film covering the intermediary face.

4. The terahertz device according to claim 2, wherein the recess overlaps with the terahertz element as viewed in the first direction.

5. The terahertz device according to claim 1, wherein the second conductor extends in the second resin layer in the first direction,
   wherein the second conductor is located around the terahertz element as viewed in the first direction.

6. The terahertz device according to claim 5, wherein the second conductor is spaced apart from the first wiring layer as viewed in the first direction.

7. The terahertz device according to claim 5, wherein the second conductor includes a second conductor obverse face close to the second resin layer reverse face.

8. The terahertz device according to claim 7, wherein the second conductor obverse face is recessed with respect to the second resin layer obverse face.

9. The terahertz device according to claim 1, wherein the external electrode includes a first conductor shield covering the first conductor reverse face.

10. The terahertz device according to claim 1, further comprising a second wiring layer including a second wiring layer reverse face,
    wherein the second wiring layer reverse face is exposed from the first resin layer.

11. The terahertz device according to claim 10, further comprising an electronic component different from the terahertz element,
    wherein the electronic component is electrically connected to the second wiring layer and covered with the first resin layer.

12. The terahertz device according to claim 10, wherein the second wiring layer further includes a second wiring layer obverse face, and
    the first conductor reverse face is in contact with the second wiring layer obverse face.

13. The terahertz device according to claim 10, wherein the external electrode includes a second wiring layer shield covering the second wiring layer reverse face.

14. The terahertz device according to claim 13, further comprising a protective film covering a portion of the second wiring layer reverse face exposed from the external electrode.

15. The terahertz device according to claim 1, further comprising a grinding mark formed on the first resin layer obverse face.

16. The terahertz device according to claim 15, wherein the first conductor obverse face is recessed with respect to the first resin layer obverse face.

17. The terahertz device according to claim 1, further comprising a conductive bonding layer that bonds the terahertz element and the first wiring layer together,
    wherein the first wiring layer partially overlaps with the terahertz element as viewed in the first direction, and
    the conductive bonding layer is disposed between the element reverse face and the first wiring layer.

18. The terahertz device according to claim 1, wherein the terahertz element is configured to convert between a terahertz wave and electric energy.

* * * * *